(12) United States Patent
Yamazaki et al.

(10) Patent No.: US 7,605,786 B2
(45) Date of Patent: Oct. 20, 2009

(54) LIQUID CRYSTAL DISPLAY DEVICE

(75) Inventors: Shunpei Yamazaki, Tokyo (JP); Jun Koyama, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 384 days.

(21) Appl. No.: 10/976,457

(22) Filed: Oct. 29, 2004

(65) Prior Publication Data

US 2005/0057474 A1    Mar. 17, 2005

Related U.S. Application Data

(63) Continuation of application No. 09/534,812, filed on Mar. 24, 2000, now Pat. No. 7,145,536.

(30) Foreign Application Priority Data

Mar. 26, 1999    (JP)    ................. 11-084663

(51) Int. Cl.
*G09G 3/36* (2006.01)
*H01L 21/00* (2006.01)

(52) U.S. Cl. .................... 345/87; 438/157; 345/204

(58) Field of Classification Search ................ 345/87, 345/102, 88, 204; 349/46, 47; 438/157, 438/176, 195, 197, 283; 257/59, 72, 347, 257/331, 365
See application file for complete search history.

(56) References Cited

U.S. PATENT DOCUMENTS

| 3,675,232 A | 7/1972 | Strout |
| 3,792,919 A | 2/1974 | Holmes et al. |
| 4,042,854 A | 8/1977 | Luo et al. |
| 4,090,219 A | 5/1978 | Ernstoff et al. |
| 4,750,813 A | 6/1988 | Ohwada et al. |
| 4,864,390 A | 9/1989 | McKechnie et al. ......... 348/751 |
| 4,907,862 A | 3/1990 | Suntola |
| 5,122,784 A | 6/1992 | Canova |
| 5,122,792 A | 6/1992 | Stewart |
| 5,247,190 A | 9/1993 | Friend et al. .................. 257/40 |
| 5,272,471 A | 12/1993 | Asada et al. |

(Continued)

FOREIGN PATENT DOCUMENTS

CN    1122934    5/1996

(Continued)

OTHER PUBLICATIONS

Inui, S. et al, "Thresholdless Antiferroelectricity in Liquid Crystals and its Application to Displays," J. Mater. Chem., vol. 6, No. 4, pp. 671-673, (1996).

(Continued)

*Primary Examiner*—Kevin M Nguyen
(74) *Attorney, Agent, or Firm*—Cook Alex Ltd.

(57) ABSTRACT

A small-sized active matrix type liquid crystal display device that may achieve large-sized display, high precision, high resolution and multi-gray scales is provided. Gray scale display is performed by combining time ratio gray scale and voltage gray scale in a liquid crystal display device which performs display in OCB mode. In doing so, one frame is divided into subframes corresponding to the number of bit for the time ratio gray scale. Initialize voltage is applied onto the liquid crystal upon display of a subframe.

20 Claims, 30 Drawing Sheets

U.S. PATENT DOCUMENTS

| | | | |
|---|---|---|---|
| 5,323,042 A * | 6/1994 | Matsumoto | 257/350 |
| 5,327,229 A | 7/1994 | Konno et al. | |
| 5,337,171 A | 8/1994 | Mase et al. | 349/74 |
| 5,349,366 A | 9/1994 | Yamazaki et al. | |
| 5,363,118 A | 11/1994 | Okumura | 345/95 |
| 5,396,084 A | 3/1995 | Matsumoto | |
| 5,399,502 A | 3/1995 | Friend et al. | 437/1 |
| 5,412,493 A | 5/1995 | Kunii et al. | |
| 5,414,442 A | 5/1995 | Yamazaki et al. | |
| 5,428,366 A | 6/1995 | Eichenlaub | |
| 5,455,489 A | 10/1995 | Bhargava | |
| 5,528,262 A | 6/1996 | McDowall et al. | |
| 5,582,882 A | 12/1996 | Kang et al. | |
| 5,583,530 A | 12/1996 | Mano et al. | 345/89 |
| 5,594,569 A | 1/1997 | Konuma et al. | 349/122 |
| 5,606,437 A | 2/1997 | Mosier | |
| 5,610,741 A | 3/1997 | Kimura | |
| 5,612,799 A | 3/1997 | Yamazaki et al. | |
| 5,642,129 A | 6/1997 | Zavracky et al. | |
| 5,643,826 A | 7/1997 | Ohtani et al. | 437/88 |
| 5,648,277 A | 7/1997 | Zhang et al. | 437/21 |
| 5,673,061 A | 9/1997 | Okada et al. | |
| 5,677,704 A | 10/1997 | Kusano et al. | 345/89 |
| 5,712,651 A | 1/1998 | Tomiyasu | |
| 5,724,058 A | 3/1998 | Choi et al. | |
| 5,761,485 A | 6/1998 | Munyan | |
| 5,784,040 A | 7/1998 | Kobayashi et al. | |
| 5,784,073 A | 7/1998 | Yamazaki et al. | |
| 5,815,223 A | 9/1998 | Watanabe et al. | |
| 5,835,139 A | 11/1998 | Yun et al. | |
| 5,851,861 A | 12/1998 | Suzawa et al. | |
| 5,874,933 A | 2/1999 | Hirai et al. | |
| 5,892,496 A | 4/1999 | Wakeland | |
| 5,893,798 A | 4/1999 | Stambolic et al. | |
| 5,917,471 A | 6/1999 | Choi | |
| 5,917,571 A | 6/1999 | Shimada | |
| 5,923,962 A | 7/1999 | Ohtani et al. | 438/150 |
| 5,950,077 A | 9/1999 | Ohue et al. | |
| 5,953,002 A | 9/1999 | Hirai et al. | |
| 5,956,105 A | 9/1999 | Yamazaki et al. | |
| 5,959,603 A | 9/1999 | Ito et al. | 345/100 |
| 5,990,629 A | 11/1999 | Yamada et al. | |
| 6,005,646 A | 12/1999 | Nakamura et al. | |
| 6,020,869 A | 2/2000 | Sasaki et al. | 345/89 |
| 6,028,588 A | 2/2000 | Yoon | |
| 6,049,092 A | 4/2000 | Konuma et al. | |
| 6,049,367 A | 4/2000 | Sharp et al. | |
| 6,067,066 A | 5/2000 | Kubota et al. | |
| 6,069,609 A | 5/2000 | Ishida et al. | 345/596 |
| 6,069,620 A | 5/2000 | Nakamura et al. | |
| 6,072,454 A | 6/2000 | Nakai et al. | 345/97 |
| 6,078,304 A | 6/2000 | Miyazawa | |
| 6,085,112 A | 7/2000 | Kleinschmidt et al. | |
| 6,094,243 A | 7/2000 | Yasunishi | |
| 6,108,058 A | 8/2000 | Uchida | |
| 6,124,913 A | 9/2000 | Mazaki et al. | |
| 6,127,991 A | 10/2000 | Uehara et al. | |
| 6,137,554 A | 10/2000 | Nakamura | |
| 6,160,533 A | 12/2000 | Tamai et al. | |
| 6,163,055 A | 12/2000 | Hirakata et al. | |
| 6,165,824 A | 12/2000 | Takano et al. | |
| 6,167,208 A | 12/2000 | Sato | |
| 6,184,874 B1 | 2/2001 | Smith et al. | |
| 6,188,379 B1 | 2/2001 | Kaneko | |
| 6,215,466 B1 | 4/2001 | Yamazaki et al. | |
| 6,222,515 B1 | 4/2001 | Yamaguchi et al. | 345/89 |
| 6,229,583 B1 | 5/2001 | Yasunishi | |
| 6,232,941 B1 | 5/2001 | Ode et al. | |
| 6,239,781 B1 | 5/2001 | Fujisawa | |
| 6,245,256 B1 | 6/2001 | Wu et al. | |
| 6,245,257 B1 | 6/2001 | Sakai et al. | |
| 6,292,168 B1 | 9/2001 | Venable et al. | |
| 6,297,813 B1 | 10/2001 | Okada et al. | |
| 6,300,927 B1 | 10/2001 | Kubota et al. | |
| 6,306,694 B1 | 10/2001 | Yamazaki et al. | |
| 6,310,669 B1 | 10/2001 | Kobayashi et al. | |
| 6,313,818 B1 | 11/2001 | Kondo et al. | |
| 6,320,565 B1 | 11/2001 | Albu et al. | |
| 6,320,568 B1 | 11/2001 | Zavracky | |
| 6,323,871 B1 | 11/2001 | Fujiyoshi et al. | |
| 6,326,941 B1 | 12/2001 | Yamazaki et al. | |
| 6,331,844 B1 | 12/2001 | Okumura et al. | |
| 6,335,716 B1 | 1/2002 | Yamazaki et al. | |
| 6,335,717 B2 | 1/2002 | Hasegawa et al. | |
| 6,353,435 B2 | 3/2002 | Kudo et al. | |
| 6,369,785 B1 | 4/2002 | Imai | |
| 6,380,917 B2 | 4/2002 | Matsueda et al. | |
| 6,384,818 B1 | 5/2002 | Yamazaki et al. | |
| 6,437,367 B1 | 8/2002 | Yamazaki et al. | |
| 6,448,951 B1 * | 9/2002 | Sakaguchi et al. | 345/102 |
| 6,452,583 B1 | 9/2002 | Takeuchi et al. | |
| 6,459,416 B1 | 10/2002 | Sasaki et al. | |
| 6,462,728 B1 | 10/2002 | Janssen et al. | |
| 6,468,839 B2 * | 10/2002 | Inoue et al. | 438/157 |
| 6,476,792 B2 | 11/2002 | Hattori et al. | |
| 6,504,215 B1 * | 1/2003 | Yamanaka et al. | 257/59 |
| 6,542,211 B1 * | 4/2003 | Okada et al. | 349/130 |
| 6,576,926 B1 | 6/2003 | Yamazaki et al. | |
| 6,590,581 B1 | 7/2003 | Koyama et al. | 345/600 |
| 6,753,854 B1 | 6/2004 | Koyama et al. | 345/204 |
| 6,765,562 B2 | 7/2004 | Yamazaki et al. | |
| 6,867,431 B2 | 3/2005 | Konuma et al. | |
| 6,952,194 B1 | 10/2005 | Yamazaki et al. | |
| 7,057,587 B2 | 6/2006 | Numao | |
| 7,145,536 B1 | 12/2006 | Yamazaki et al. | |
| 7,161,573 B1 | 1/2007 | Takatori et al. | |
| 7,193,594 B1 | 3/2007 | Yamazaki et al. | |
| 7,202,849 B2 | 4/2007 | Hattori et al. | |
| 7,233,342 B1 | 6/2007 | Yamazaki et al. | |
| 7,268,777 B2 | 9/2007 | Yamazaki et al. | |
| 2002/0047852 A1 | 4/2002 | Inukai et al. | |
| 2003/0058210 A1 | 3/2003 | Yamazaki et al. | |
| 2004/0256621 A1 | 12/2004 | Konuma et al. | |
| 2005/0007331 A1 | 1/2005 | Yamazaki et al. | |
| 2005/0024309 A1 | 2/2005 | Yamazaki et al. | |
| 2005/0052392 A1 * | 3/2005 | Yamazaki et al. | 345/92 |
| 2005/0083287 A1 * | 4/2005 | Yamazaki et al. | 345/92 |
| 2005/0088433 A1 | 4/2005 | Yamazaki et al. | |
| 2005/0093852 A1 | 5/2005 | Yamazaki et al. | |
| 2005/0142705 A1 | 6/2005 | Konuma et al. | |
| 2005/0153489 A1 | 7/2005 | Konuma et al. | |
| 2005/0225545 A1 | 10/2005 | Takatori et al. | |
| 2006/0267908 A1 | 11/2006 | Yamazaki et al. | |
| 2007/0176888 A1 | 8/2007 | Hattori et al. | |

FOREIGN PATENT DOCUMENTS

| | | |
|---|---|---|
| EP | 0 433 054 | 6/1991 |
| EP | 0 484 159 | 5/1992 |
| EP | 0 589 478 A2 | 3/1994 |
| EP | 0 645 802 A2 | 3/1995 |
| EP | 0 655 726 | 5/1995 |
| EP | 0662773 | 7/1995 |
| EP | 0 689 085 A2 | 12/1995 |
| EP | 0709823 | 5/1996 |
| EP | 0762370 | 3/1997 |
| EP | 0827129 | 3/1998 |
| EP | 0 853 254 | 7/1998 |
| EP | 0 854 465 A1 | 7/1998 |
| EP | 0 875 880 A2 | 11/1998 |
| EP | 0 875 881 | 11/1998 |
| EP | 1037192 | 9/2000 |
| EP | 1 113 412 A2 | 7/2001 |
| EP | 1 229 510 A2 | 8/2002 |

| | | |
|---|---|---|
| EP | 1 564 799 A2 | 8/2005 |
| EP | 1 564 800 A2 | 8/2005 |
| JP | 3-38755 | 6/1991 |
| JP | 5-289103 | 11/1993 |
| JP | 6-265940 | 9/1994 |
| JP | 6-347757 | 12/1994 |
| JP | 07-052331 | 2/1995 |
| JP | 7-56545 | 3/1995 |
| JP | 7-130652 | 5/1995 |
| JP | 7-135318 | 5/1995 |
| JP | 07-52331 | 6/1995 |
| JP | 7-169974 | 7/1995 |
| JP | 8-6071 | 1/1996 |
| JP | 8-078329 | 3/1996 |
| JP | 08-211361 | 8/1996 |
| JP | 8-234697 | 9/1996 |
| JP | 9-138421 | 5/1997 |
| JP | 9-185037 | 7/1997 |
| JP | 9-211457 | 8/1997 |
| JP | 10-062748 | 3/1998 |
| JP | 10-092576 | 4/1998 |
| JP | 10-104663 | 4/1998 |
| JP | 10-186311 | 7/1998 |
| JP | 10-206822 | 8/1998 |
| JP | 10-214060 | 8/1998 |
| JP | 10-229200 | 8/1998 |
| JP | 10-232649 | 9/1998 |
| JP | 10-268836 | 10/1998 |
| JP | 10-312173 | 11/1998 |
| JP | 11-14988 | 1/1999 |
| JP | 11-54761 | 2/1999 |
| JP | 11-084419 | 3/1999 |
| JP | 11-126050 | 5/1999 |
| JP | 11-258573 | 9/1999 |
| JP | 2000-47188 | 2/2000 |
| JP | 2000-187243 | 7/2000 |
| JP | 2000-330527 | 11/2000 |
| JP | 2000-347636 | 12/2000 |
| JP | 2002-214611 | 7/2002 |
| JP | 2003-084733 | 3/2003 |
| JP | 3739297 | 1/2006 |
| WO | WO 90/13148 | 11/1990 |
| WO | WO-98/08213 | 2/1998 |

OTHER PUBLICATIONS

Yoshida, T. et al, "A Full-Color Thresholdless Antiferroelectric LCD Exhibiting Wide Viewing Angle with Fast Response Time," SID 97 Digest, pp. 841-844, (1997).

Furue, H. et al, "Characteristics and Driving Scheme of Polymer-Stabilized Monostable FLCD Exhibiting Fast Response Time and High Contrast Ratio with Gray-Stable Capability," SID 98 Digest, pp. 782-785, (1998).

Schenk, H. et al, "Polymers for Light Emitting Diodes," EURODISPLAY '99: Proceedings of the 19th International Display Research Conference, Berlin, Germany, Sep. 6-9, pp. 33-37 (1999).

European Search Report re application No. EP 00 10 5500.3, dated Dec. 5, 2000.

U.S. Appl. No. 09/507,825 (pending) to Yamazaki et al, filed Feb. 22, 2000, including specification, claims, drawings and PTO filing receipt.

U.S. Appl. No. 09/522,428 (pending) to Yamazaki et al, filed Mar. 9, 2000, including specification, claims, drawings and PTO filing receipt.

U.S. Appl. No. 09/536,782 (pending) filed Mar. 28, 2000, including specification, claims, drawings and PTO filing receipt.

Yoshihara.T, "Time Division Full Color LCD by Ferroelectric Liquid Crystal", Ekisho, Jul. 25, 1999, vol. 3, No. 3, pp. 190-194.

Terada.M et al., "Half-V Switching Mode FLCD,", Proceedings of 46th Applied Physics Association Lectures, Mar. 1, 1999, vol. 28P-V-8, p. 1316.

Miyashita, T. et al, "Properties of the OCB Mode for Active-Matrix LCDs with Wide Viewing Angle," SID 95 Digest, pp. 797-800 (1995).

\* cited by examiner

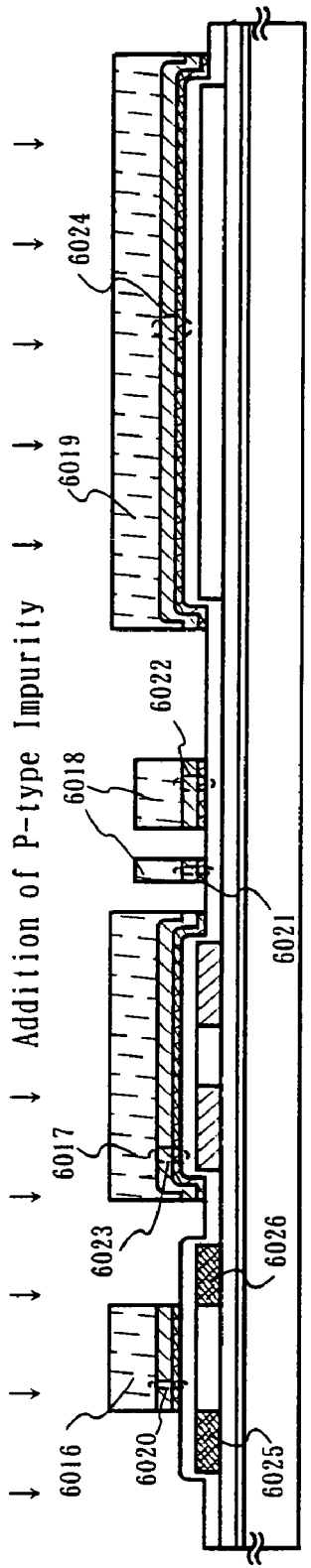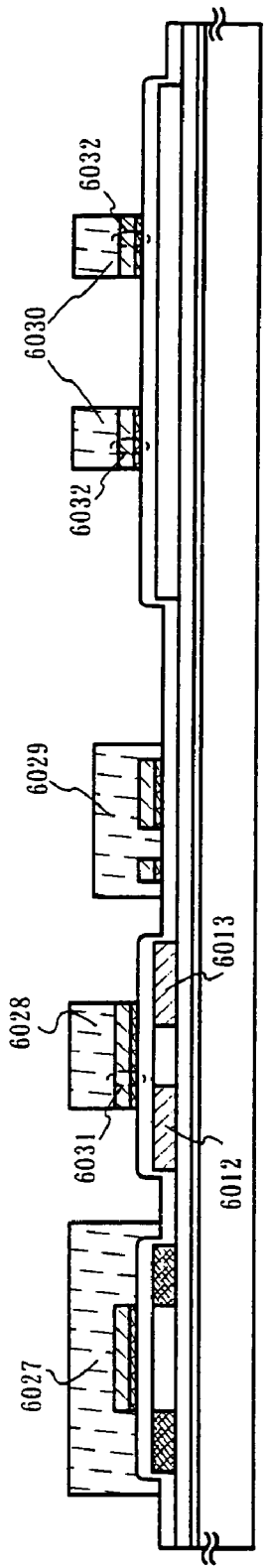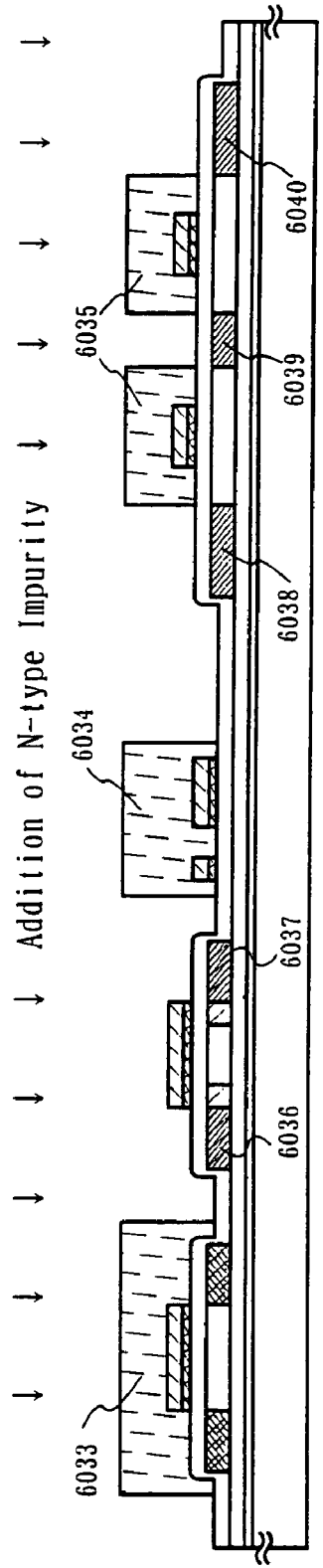

LIQUID CRYSTAL DISPLAY DEVICE

This application is a continuation of U.S. application Ser. No. 09/534,812, filed on Mar. 24, 2000 now U.S. Pat. No. 7,145,536.

BACKGROUND OF THE INVENTION

1. Field of the Invention

The present invention relates to a liquid crystal display device, more specifically, a display device in which gray scale display is made by both the voltage gray scale method and the time ratio gray scale.

2. Description of the Related Art

A technique that has recently accomplished rapid development is to manufacture a semiconductor device in which semiconductor thin films are formed on an inexpensive glass substrate, for example, a thin film transistor (TFT). This rapid development is caused by a growing demand for active matrix type display devices.

In an active matrix display device, a pixel TFT is placed in each of pixel regions as many as several hundred thousands to several millions arranged in matrix, and electric charge that flows into and out of a pixel electrode connected to each pixel TFT is controlled by the switching function of the pixel TFT.

As images are displayed with higher definition and higher resolution, demand for multi-gray scale display, desirably, in full color, has been established in recent years.

Accompanying the movement regarding display devices towards higher definition and higher resolution, the active matrix display device that has drawn attention most is a digital driven active matrix display device that can be driven at a high speed.

The digital driven active matrix display device needs a D/A converter circuit (DAC) for converting digital video data inputted from the external into analogue data (voltage gray scale). There are various kinds of D/A converter circuits.

The multi-gray scale display capability of the digital driver active matrix display device is dependent on the capacity of this D/A converter circuit, namely, how many bits of digital video data the D/A converter circuit can convert into analogue data. For instance, in general, a display device having a D/A converter circuit that processes 2 bit digital video data is capable of $2^2=4$ gray scale display. If the circuit processes 8 bit data, the device is capable of $2^8=256$ gray scale display, if n bit, $2^n$ gray scale display.

However, enhancement of the capacity of the D/A converter circuit costs complicated circuit structure and enlarged layout area for the D/A converter circuit. According to a lately reported display device, a D/A converter circuit is formed on the same substrate where an active matrix circuit is formed, using a poly-silicon TFT. In this case, the structure of the D/A converter circuit is complicated to lower the yield of the D/A converter circuit, resulting in yield decrease of the display device. In addition, increased layout area of the D/A converter circuit makes it difficult to downsize the display device.

Further, a problem arose in the response speed of liquid crystal molecules in a conventionally well-known TN mode (twist nematic mode) which uses nematic liquid crystal, as the time for writing an image data onto a pixel became shorter, due to large sized display, high precision and high resolution of an active matrix liquid crystal display device.

As described above, materialization of an active matrix liquid crystal display device which achieves large sized display, high precision, high resolution and multi gray scale has been desired.

SUMMARY OF THE INVENTION

The present invention has been made in view of the problems above and, the present invention provides a liquid crystal display device that achieves large sized display, high precision, high resolution and multi gray scale.

First, reference is made to FIG. 1. FIG. 1 is a structural diagram schematically showing a liquid crystal display device of the present invention. Reference numeral 101 denotes a liquid crystal display panel comprising digital drivers. Liquid crystal display panel 101 comprises an active matrix substrate 101-1 and an opposing substrate 101-2. An active matrix substrate 101-1 comprises a source driver 101-1-1, a gate driver 101-1-2, and 101-1-3, and an active matrix circuit 101-1-4 in which a plurality of pixel TFTs are disposed in a matrix. The source driver 101-1-1 and the gate drivers 101-1-2 and 101-1-3 drive the active matrix circuit 101-1-4. An opposing substrate 101-2 comprises an opposing electrode 401-2-1. Further, a terminal COM denotes a terminal which supplies signal to the opposing electrode.

Reference numeral 102 denotes a digital video data time ratio gray scale processing circuit. The digital video data time ratio gray scale processing circuit 102 converts, among m bit digital video data inputted from the external, n bit digital video data into n bit digital video data for voltage gray scale. Gray scale information of (m–n) bit data of the m bit digital video data is expressed by time ratio gray scale.

The n bit digital video data converted by the digital video data time ratio gray scale processing circuit 102 is inputted to the display panel 101. The n bit digital video data inputted to the display panel 101 is then inputted to the source driver 101-1-1 and converted into analogue gray scale data by the D/A converter circuit within the source driver and sent to each source signal line, then sent to pixel TFTs.

Reference numeral 103 denotes an opposing electrode driving circuit, which sends an opposing electrode control signal for controlling the electric potential of an opposing electrode to an opposing electrode 101-2-1 of the liquid crystal panel 101.

Note that through the specification, a liquid crystal display device and a liquid crystal panel are discriminated from each other. One that has at least an active matrix circuit is referred to as a liquid crystal panel.

Here, a description is made on a structural diagram schematically showing a liquid crystal panel in a liquid crystal display device of the present invention by referring to FIGS. 2 and 3. Those that comprise the liquid crystal panel 101, namely an active matrix substrate 101-1, an opposing substrate and liquid crystal 101-3 are shown in FIGS. 2 and 3. The liquid crystal panel used in the present invention has a so-called "π cell structure", and uses a display mode called OCB (optically compensated bend) mode. In the π cell structure, liquid crystal molecules are aligned such that pre-tilt angles of the molecules are symmetrical with respect to the center plane between the active matrix substrate and the opposing substrate. The orientation in the π cell structure is splay orientation when the voltage is not applied to the substrates, and shifts into bend orientation shown in FIG. 2 when the voltage is applied. Further application of voltage brings liquid crystal molecules in bend orientation to an orientation perpendicular to the substrates, which allows light to transmit therethrough.

As shown in FIG. 2, a liquid crystal display panel of the present invention comprises a liquid crystal panel in which liquid crystal is in bend orientation, a biaxial phase difference plate 111 and a pair of polarizing plates whose transmission axes are perpendicular to each other. In the OCB mode display, visual angle dependency of retardation is three-dimensionally compensated using biaxial phase difference plates.

Liquid crystal molecules are in splay orientation shown in FIG. 3 when the voltage is not applied to the liquid crystal, as mentioned above.

Using the OCB mode, a high-speed response about ten times faster than that of the conventional TN mode may be realized.

Another example of the liquid crystal display device of the present invention is shown in FIG. 30. Reference numeral 301 denotes a liquid crystal display device comprising analogue drivers. The liquid crystal display device 301 comprises an active matrix substrate 301-1 and an opposing substrate 301-2. The active matrix substrate 301-1 is comprised of a source driver 301-1-1, gate drivers 301-1-2, 301-1-3, an active matrix circuit 301-1-4 with a plurality of pixel TFTs arranged in matrix. The source driver 301-1-1 and the gate drivers 301-1-2, 301-1-3 drive the active matrix circuit 301-1-4. The opposing substrate 301-2 has an opposing electrode 301-2-1. A terminal COM is a terminal for supplying the opposing electrode with a signal.

Reference numeral 302 denotes an A/D converter circuit that converts analogue video data sent from the external into m bit digital video data. Reference numeral 303 denotes a digital video data time ratio gray scale processing circuit. The digital video data time ratio gray scale processing circuit 303 converts, of inputted m bit digital video data, n bit digital video data into n bit digital video data for voltage gray scale method. Gray scale information of (m−n) bit data of the inputted m bit digital video data is expressed in time ratio gray scale. The n bit digital video data converted by the digital video data time ratio gray scale processing circuit 303 is inputted to a D/A converter circuit 304 and then converted into analogue video data. The analogue video data converted by the D/A converter circuit 304 is inputted to the liquid crystal display device 301. The analogue video data inputted to the liquid crystal display device 301 is then inputted to the source driver and sampled by a sampling circuit within the source driver so as to be sent to each source signal line and to pixel. TFTs.

Denoted by 305 is an opposing electrode driving circuit, which sends an opposing electrode control signal for controlling the electric potential of the opposing electrode to the opposing electrode 301-2-1 of the liquid crystal display device 301.

Details of the operation of the liquid crystal display device of the present invention will be described in Embodiment modes below.

A description is given on the structure of the present invention below.

According to the present invention, there is provided a liquid crystal display device comprising:

An active matrix substrate comprising an active matrix circuit that comprises a plurality of pixel TFTs arranged in matrix, and a source driver and a gate driver for driving the active matrix circuit; and an opposing substrate having an opposing electrode, characterized in that display is made in the OCB mode, and in that, of m bit digital video data inputted from the external, n bit data and (m−n) bit data are used as voltage gray scale information and time ratio gray scale information, respectively, (m and n are both positive integers equal to or larger than 2 and satisfy m>n), to thereby conduct the voltage gray scale and the time gray scale, simultaneously.

According to the present invention, there is provided a liquid crystal display device comprising:

an active matrix substrate comprising an active matrix circuit that comprises a plurality of pixel TFTs arranged in matrix and a source driver and a gate driver for driving the active matrix circuit; and an opposing substrate having an opposing electrode, characterized in that display is made in the OCB mode, and in that, of m bit digital video data inputted from the external, n bit data and (m−n) bit data are used as voltage gray scale information and time ratio gray scale information, respectively, (m and n are both positive integers equal to or larger than 2 and satisfy m>n), to thereby conduct first the voltage gray scale and then the time ratio gray scale, or conduct one immediately before conducting the other.

According to the present invention, there is provided a liquid crystal display device comprising:

an active matrix substrate comprising an active matrix circuit that comprises a plurality of pixel TFTs arranged in matrix and a source driver and a gate driver for driving the active matrix circuit;

an opposing substrate having an opposing electrode; and a circuit for converting m bit digital video data inputted from the external into n bit digital video data, and for supplying the source driver with the n bit digital video data (m and n are both positive integers equal to or larger than 2, and satisfy m>n), characterized in that display is made by conducting simultaneously the voltage gray scale and the time ratio gray scale, and by forming one frame of image from $2^{m-n}$ sub-frames, and in that voltage is applied to change the orientation of liquid crystal molecules into bend orientation upon starting to display the $2^{m-n}$ sub-frames.

According to the present invention, there is provided a liquid crystal display device comprising:

an active matrix substrate comprising an active matrix circuit that comprises a plurality of pixel TFTs arranged in matrix and a source driver and a gate drives for driving the active matrix circuit;

an opposing substrate comprising an opposing electrode; and a circuit for converting m bit digital video data inputted from the external into n bit digital video data, and for supplying the source driver with the n bit digital video data (m and n are both positive integers equal to or larger than 2, and satisfy m>n), characterized in that the voltage gray scale is first conducted to conduct and next the time ratio gray scale or one is conducted immediately before the other, and in that, voltage is applied to change the orientation of liquid crystal molecules into bend orientation upon starting to display the $2^{m-n}$ sub-frames.

According to the present invention, there is provided a liquid crystal display device comprising:

an active matrix substrate comprising an active matrix circuit that comprises a plurality of pixel TFTs arranged in matrix, and a source driver and a gate driver for driving the active matrix circuit;

an opposing substrate having an opposing electrode; and a circuit for converting m bit digital video data inputted from the external into n bit digital video data, and for supplying the source driver with the n bit digital video data (m and n are both positive integers equal to or larger than 2, and satisfy m>n), characterized in that display is made by conducting simultaneously the voltage gray scale and the time ratio gray scale, and by forming one frame of image from $2^{m-n}$ sub-frames, and in that voltage is applied to change the orientation of liquid crystal molecules into bend orientation upon starting to display a frame that is comprised of the $2^{m-n}$ sub-frames.

According to the present invention, there is provided a liquid crystal display device comprising:

an active matrix substrate comprising an active matrix circuit that comprises a plurality of pixel TFTs arranged in matrix, and a source driver and a gate driver for driving the active matrix circuit;

an opposing substrate which comprises an opposing electrode; and a circuit for converting m bit digital video data inputted from the external into n bit digital video data, and for supplying the source driver with the n bit digital video data (m and n are both positive integers equal to or larger than 2, and satisfy m>n), characterized in that the voltage gray scale is first conducted and next the time ratio gray scale, or one is conducted immediately before the other, and in that voltage is applied to change the orientation of liquid crystal molecules into bend orientation upon starting to display a frame that is comprised of $2^{m-n}$ sub-frames.

The above-mentioned m and n may be 10 and 2, respectively.

The above-mentioned m and n may be 12 and 4, respectively.

BRIEF DESCRIPTION OF THE DRAWINGS

FIGS. 18A to 18C are diagrams showing an example of manufacturing processes for a liquid crystal display device of the present invention.

DETAILED DESCRIPTION OF THE PREFERRED EMBODIMENTS

A liquid crystal display device of the present invention will now be described in detail using preferred embodiment modes. However, the liquid crystal display device of the present invention is not limited to the embodiment modes below.

Embodiment Mode 1

Figure 1:
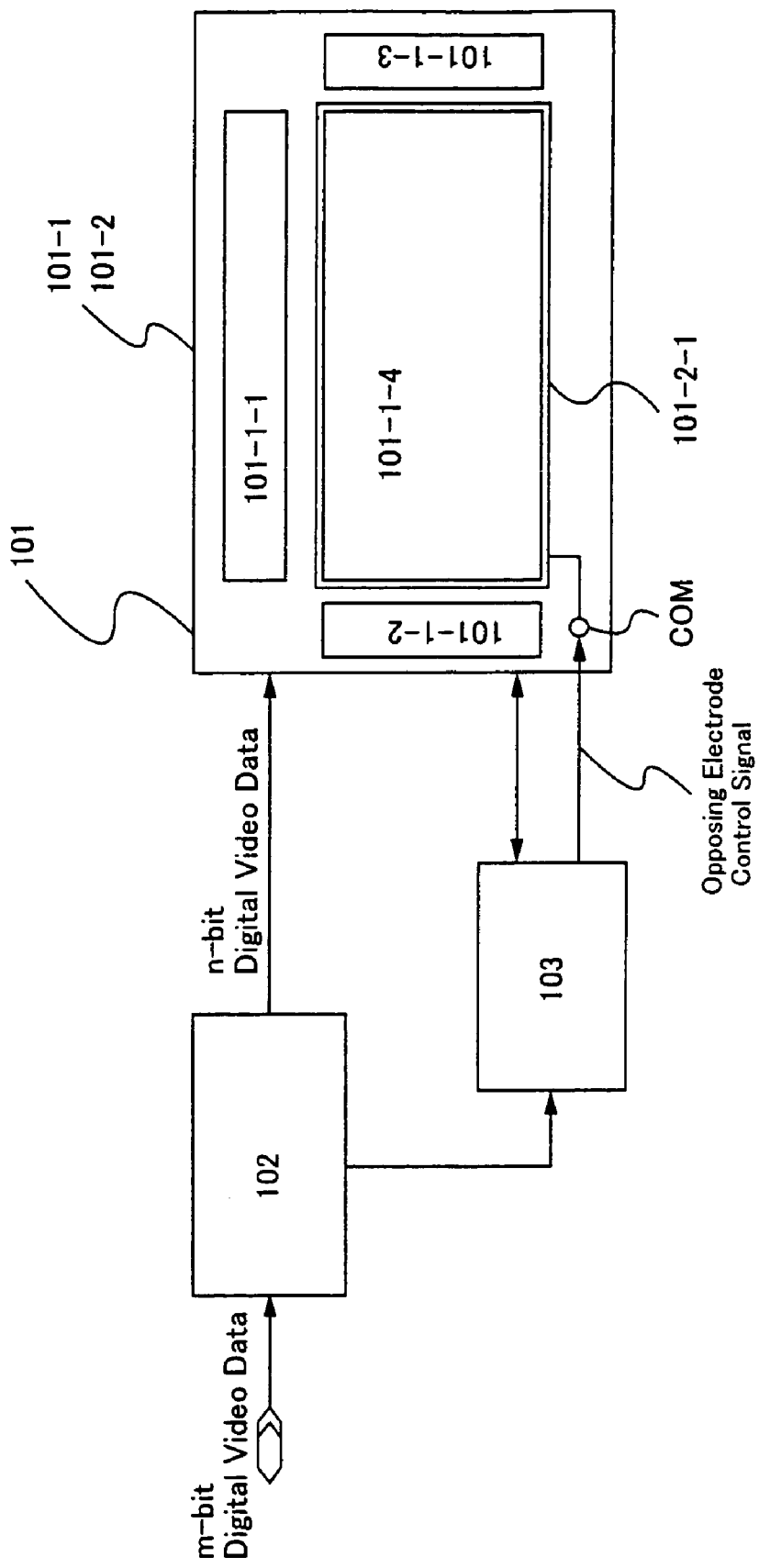
FIG. 1 is an outlined structural diagram of a liquid crystal display device of the present invention.
Figure 2:
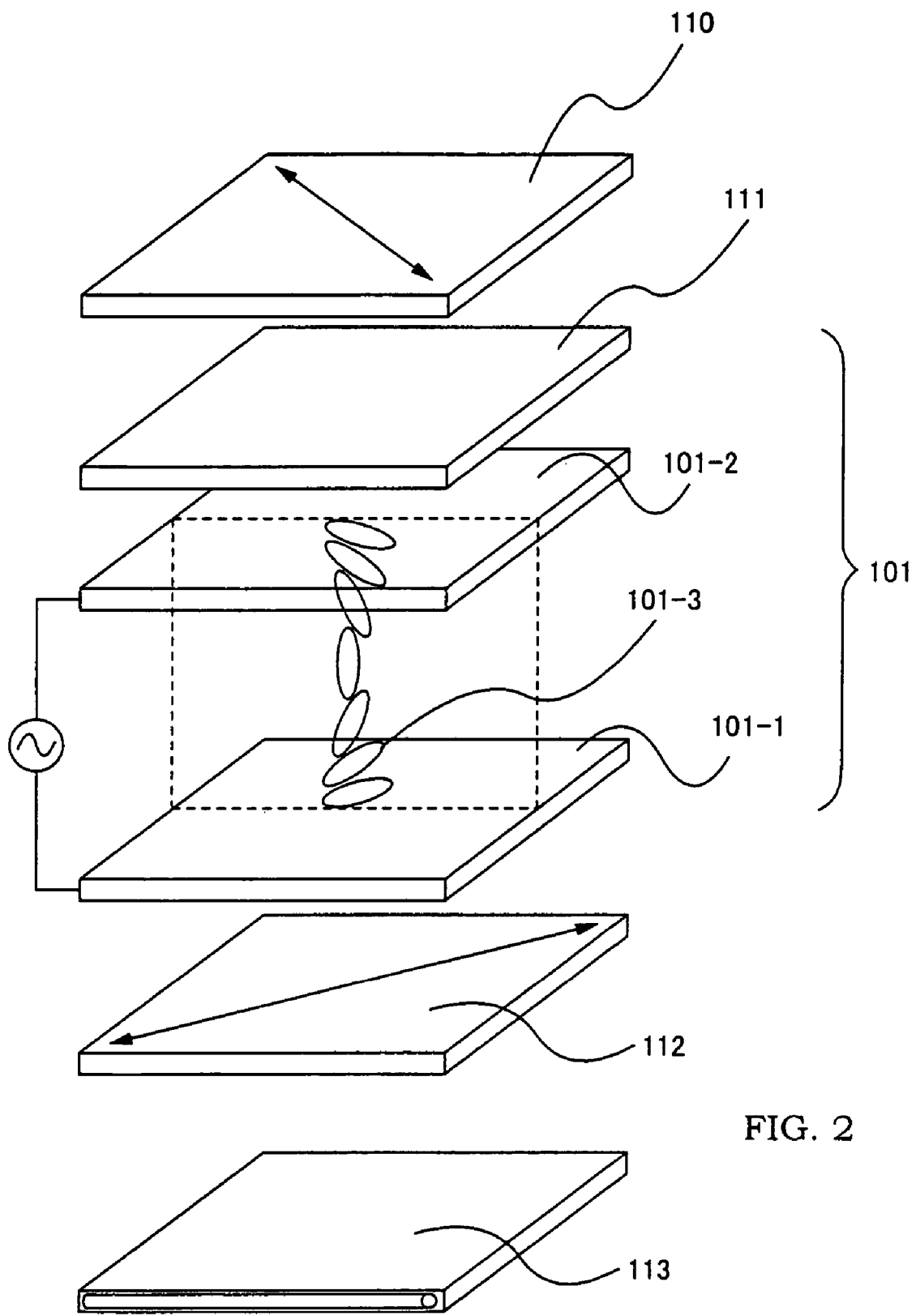
FIG. 2 is an outlined structural diagram of a liquid crystal panel of the present invention.
Figure 3:
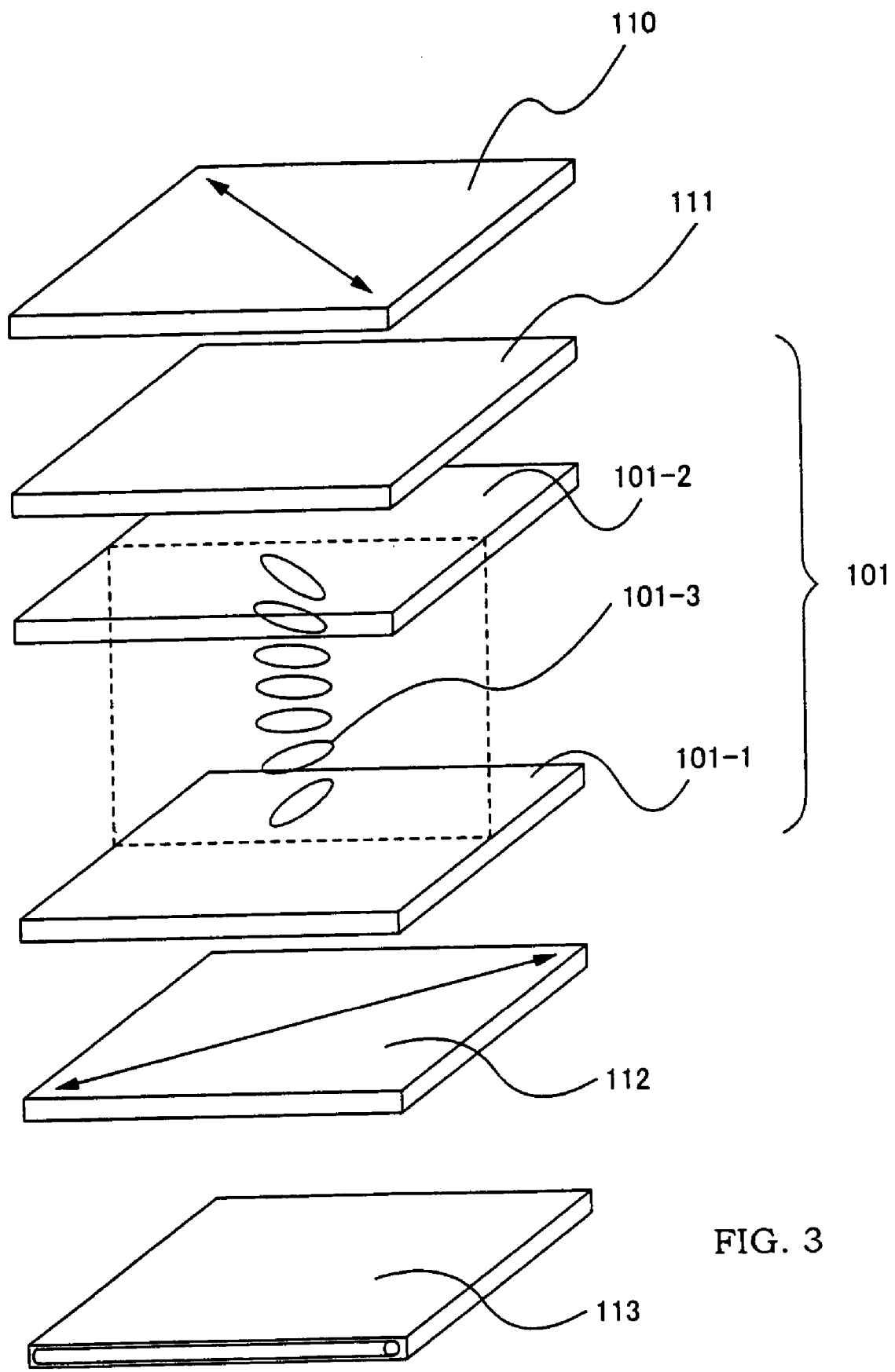
FIG. 3 is an outlined structural diagram of a liquid crystal panel of the present invention.
Figure 4:
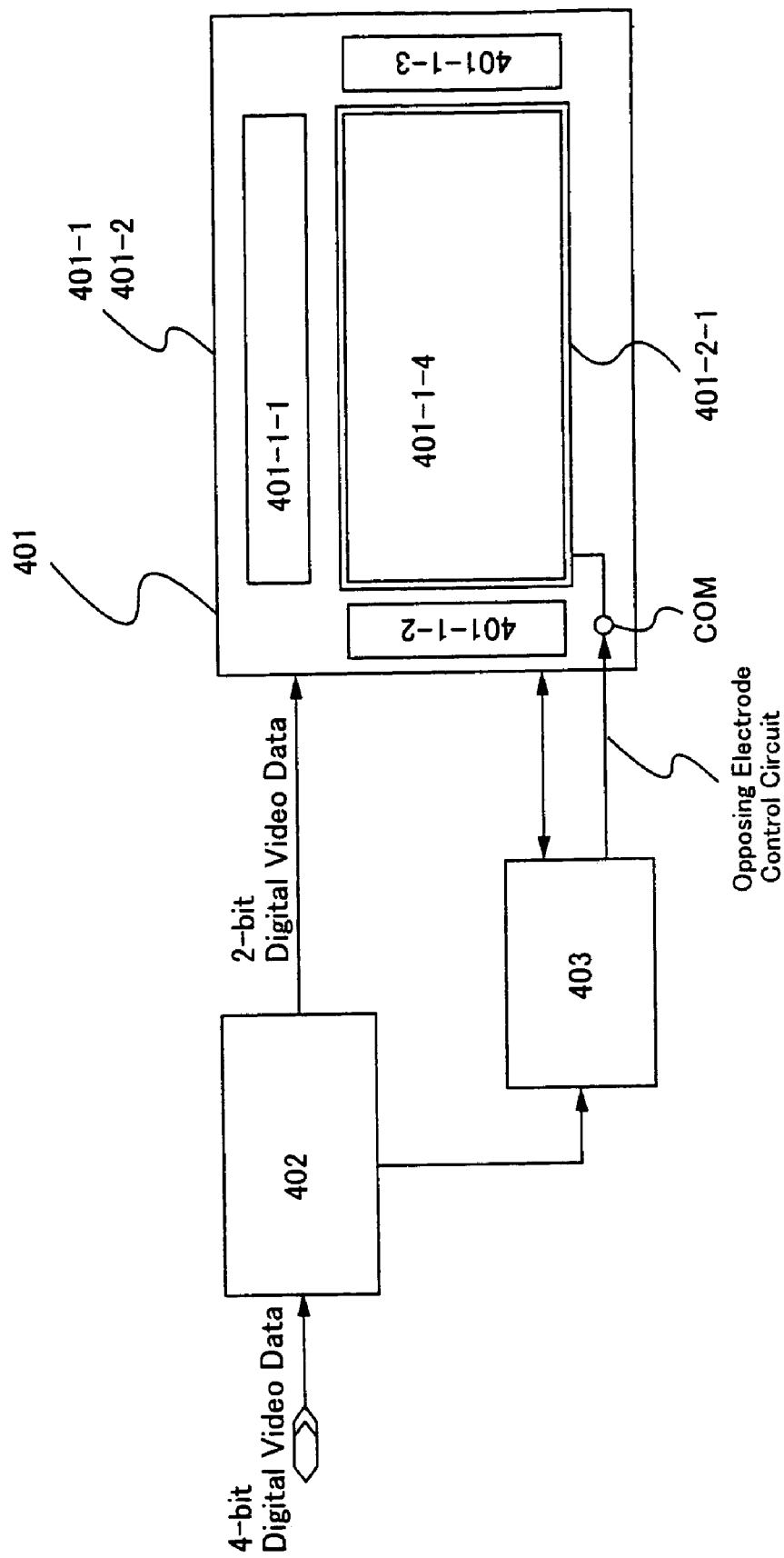
FIG. 4 is an outlined structural diagram of a liquid crystal display device of the present invention.

FIG. 4 schematically shows a structural diagram of a liquid crystal display device of this embodiment mode. In this embodiment mode, a liquid crystal display device to which 4 bit digital video data is sent from the external is taken as an example with the intention of simplifying the explanation.

Shown in FIG. 4 is a schematic structural diagram of a liquid crystal display device according to the present invention. Reference numeral 401 denotes a liquid crystal panel having digital drivers. The liquid crystal panel 401 comprises an active matrix substrate 401-1 and an opposing substrate 401-2. The active matrix substrate 401-1 is comprised of a source driver 401-1-1, gate drivers 401-1-2 and 401-1-3, and an active matrix circuit 401-1-4 with a plurality of pixel TFTs arranged in matrix. The source driver 401-1-1 and the gate drivers 401-1-2 and 401-1-3 drive the active matrix circuit 401-1-4. The opposing substrate 401-2 has an opposing electrode 401-2-1. A terminal COM is a terminal for supplying the opposing electrode with a signal.

The liquid crystal panel of this embodiment mode adopts the OCB mode mentioned above as its display mode.

Reference numeral 402 denotes a digital video data time ratio gray scale processing circuit. The digital video data time ratio gray scale processing circuit 402 converts, of 4 bit digital video data inputted from the external, 2 bit digital video data into 2 bit digital video data for voltage gray scale. Gray scale information of the other 2 bit digital video data out of the 4 bit digital video data is expressed in time ratio gray scale.

The 2 bit digital video data underwent the conversion by the digital video data time ratio gray scale processing circuit 402 is inputted to the liquid crystal panel 401. The 2 bit digital video data inputted to the liquid crystal panel 401 is then inputted to the source driver and converted into analogue gray scale data by a D/A converter circuit (not shown) within the source driver so as to be sent to each source signal line.

Reference numeral 403 denotes an opposing electrode driving circuit, which sends an opposing electrode control signal for controlling the electric potential of the opposing electrode to the opposing electrode 401-2-1 of the liquid crystal panel 401.

Figure 5:
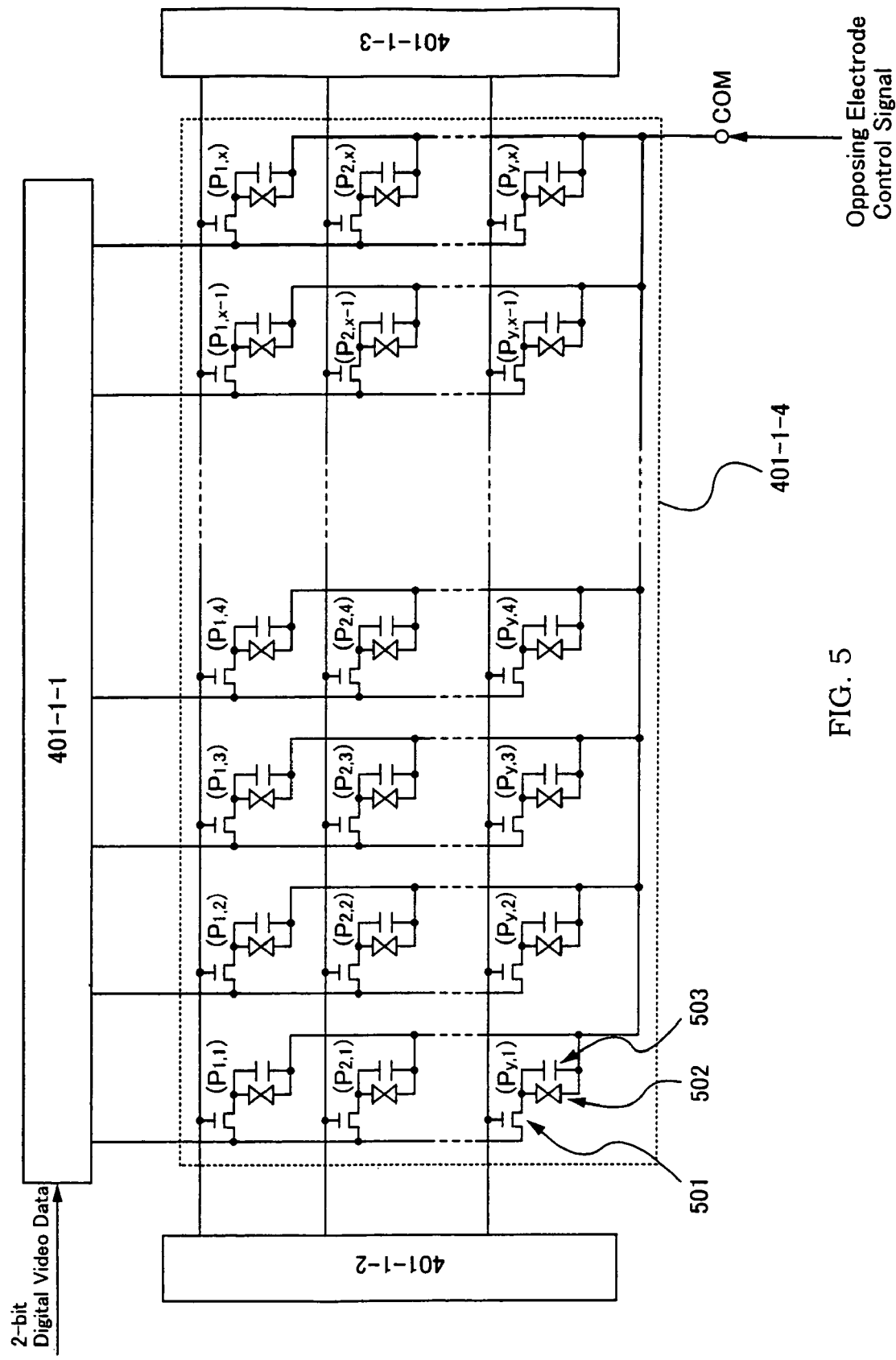
FIG. 5 is a circuit structure diagram of an active matrix circuit, a source driver and gate drivers according to an embodiment mode of a liquid crystal display device of the present invention.

Here, a description is given with reference to FIG. 5 of the circuit structure for the liquid crystal panel 401 of the liquid crystal display device according to this embodiment mode, in particular, the active matrix circuit 401-1-4.

The active matrix circuit 401-1-4 has (x×y) pieces of pixels in this embodiment mode. For convenience's sake in explanation, each pixel is designated by a symbol such as P1,1, P2,1, . . . and Py,x. Also, each pixel has a pixel TFT 501 and a storage capacitor 503. Liquid crystal is held between the active matrix substrate and the opposing substrate. Liquid crystal 502 schematically shows the liquid crystal for each of the pixel.

The digital driver liquid crystal panel of this embodiment mode performs so-called line sequential driving in which pixels on one line (e.g., P1,1, P1,2, . . . , P1,x) are driven simultaneously. In other words, analogue gray scale voltage is written into one line of pixels at once. A time required to write analogue gray scale voltage in all the pixels (P1,1 to Py,x) is named here one frame term (Tf). One frame term (Tf) is divided into four terms, which are referred to as sub-frame terms (Tsf) in this embodiment mode. Further, a time required to write analogue gray scale voltage in one line of pixels (e.g., P1,1, P1,2, . . . , P1,x) is called one sub-frame line term (Tsfl).

The opposing electrode 401-2-1 receives an opposing electrode control signal sent from the opposing electrode control circuit. Specifically, the opposing electrode control signal is sent to the terminal COM to which the opposing electrode is electrically connected.

Figure 6:
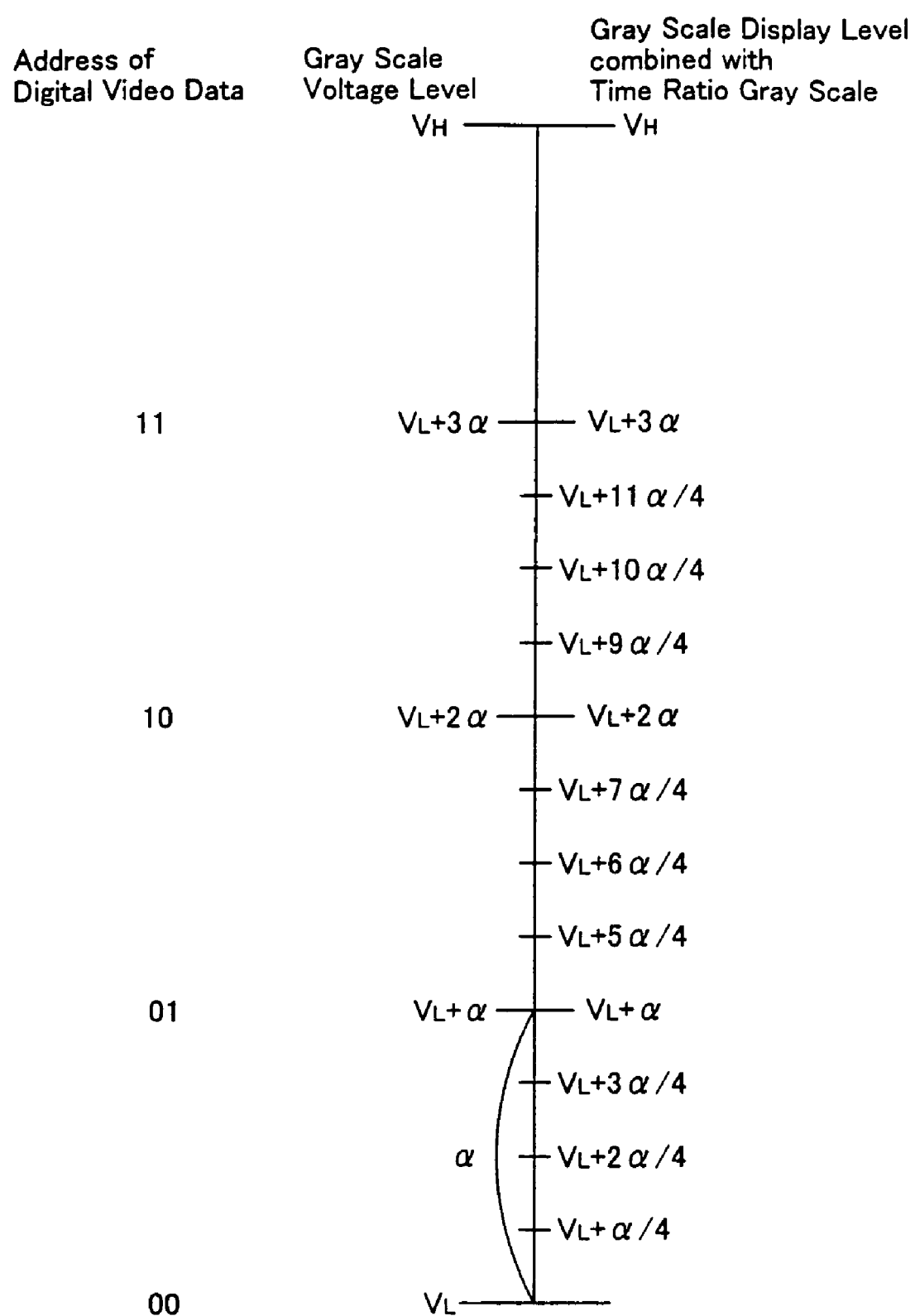
FIG. 6 is a diagram showing gray scale display levels according to an embodiment mode of a liquid crystal display device of the present invention.

Gray scale display in the liquid crystal display device of this embodiment mode will next be described. The digital video data sent from the external to the liquid crystal display device of this embodiment mode is 4 bit and contains information of 16 gray scales. Here, reference is made to FIG. 6. FIG. 6 shows display gray scale levels of the liquid crystal display device of this embodiment mode. The voltage level VL is the lowest voltage level of voltages inputted to the D/A converter circuit. The voltage level VH is the highest voltage level of voltages inputted to the D/A converter circuit.

In this embodiment mode, the level between the voltage level VH and the voltage level VL is divided equally into four to obtain voltage level of 2 bit, namely, of 4 gray scale, and each step of the voltage level is designated $\alpha$ Here, a is: ($\alpha$=(VH−VL)/4). Therefore, the voltage gray scale level outputted from the D/A converter circuit of this embodiment mode is VL when the address of the digital video data is (00). VL+$\alpha$ when the address of the digital video data is (01), VL+2$\alpha$ when the address of the digital video data is (10), and VL+3$\alpha$ when the address of the digital video data is (11).

The D/A converter circuit of this embodiment mode can output four patterns of gray scale voltage levels, namely VL, (VL+$\alpha$), (VL+2$\alpha$) and (VL+3$\alpha$), as described above. Then combining them with the time ratio gray scale display, the present invention may increase the number of display gray scale levels for the liquid crystal display device.

In this embodiment mode, information contained in 2 bit digital video data of the 4 bit digital video data is used for the time ratio gray scale display to obtain more finely divided, or increased display gray scale levels where one voltage gray scale level $\alpha$ is further divided equally into four levels. That is, the liquid crystal display device of this embodiment may acquire display gray scale levels corresponding to voltage gray scale levels of VL, VL+$\alpha$/4, VL+2$\alpha$/4, VL+3$\alpha$/4, VL+$\alpha$, VL+5$\alpha$/4, VL+6$\alpha$/4, VL+7$\alpha$/4, VL+2$\alpha$, VL+9$\alpha$/4, VL+10$\alpha$/4, VL+11$\alpha$/4 and VL+3$\alpha$.

The 4 bit digital video data address inputted from the external; time ratio gray scale processed digital video data address and corresponding voltage gray scale level; and display gray scale level combined with the time gray scale are related in the following Table 1.

TABLE 1

| Digital Video Data Address | | Time Ratio Gray Scale processed Address of Digital Video Data (Gray Scale Voltage Level) | | | | Gray Scale Display Level combined with Time Ratio Gray Scale |
|---|---|---|---|---|---|---|
| | | 1st Tsfl | 2nd Tsfl | 3rd Tsfl | 4th Tsfl | |
| 00 | 00 | 00 (VL) | 00 (VL) | 00 (VL) | 00 (VL) | VL |
| | 01 | 00 (VL) | 00 (VL) | 00 (VL) | 01 (VL + $\alpha$) | VL + $\alpha$/4 |
| | 10 | 00 (VL) | 00 (VL) | 01 (VL + $\alpha$) | 01 (VL + $\alpha$) | VL + 2$\alpha$/4 |
| | 11 | 00 (VL) | 01 (VL + $\alpha$) | 01 (VL + $\alpha$) | 01 (VL + $\alpha$) | VL + 3$\alpha$/4 |
| 01 | 00 | 01 (VL + $\alpha$) | 01 (VL + $\alpha$) | 01 (VL + $\alpha$) | 01 (VL + $\alpha$) | VL + $\alpha$ |
| | 01 | 01 (VL + $\alpha$) | 01 (VL + $\alpha$) | 01 (VL + $\alpha$) | 10 (VL + 2$\alpha$) | VL + 5$\alpha$/4 |
| | 10 | 01 (VL + $\alpha$) | 01 (VL + $\alpha$) | 10 (VL + 2$\alpha$) | 10 (VL + 2$\alpha$) | VL + 6$\alpha$/4 |
| | 11 | 01 (VL + $\alpha$) | 10 (VL + 2$\alpha$) | 10 (VL + 2$\alpha$) | 10 (VL + 2$\alpha$) | VL + 7$\alpha$/4 |
| 10 | 00 | 10 (VL + 2$\alpha$) | 10 (VL + 2$\alpha$) | 10 (VL + 2$\alpha$) | 10 (VL + 2$\alpha$) | VL + 2$\alpha$ |

TABLE 1-continued

| Digital Video Data | Time Ratio Gray Scale processed Address of Digital Video Data (Gray Scale Voltage Level) | | | | Gray Scale Display Level combined with Time Ratio Gray |
|---|---|---|---|---|---|
| Address | 1st Tsfl | 2nd Tsfl | 3rd Tsfl | 4th Tsfl | Scale |
| 01 | 10 (VL + 2α) | 10 (VL + 2α) | 10 (VL + 2α) | 11 (VL + 3α) | VL + 9α/4 |
| 10 | 10 (VL + 2α) | 10 (VL + 2α) | 11 (VL + 3α) | 11 (VL + 3α) | VL + 10α/4 |
| 11 | 10 (VL + 2α) | 11 (VL + 3α) | 11 (VL + 3α) | 11 (VL + 3α) | VL + 11α/4 |
| 11  00 | 11 (VL + 3α) | 11 (VL + 3α) | 11 (VL + 3α) | 11 (VL + 3α) | VL + 3α |
| 01 | 11 (VL + 3α) | 11 (VL + 3α) | 11 (VL + 3α) | 11 (VL + 3α) | VL + 3α |
| 10 | 11 (VL + 3α) | 11 (VL + 3α) | 11 (VL + 3α) | 11 (VL + 3α) | VL + 3α |
| 11 | 11 (VL + 3α) | 11 (VL + 3α) | 11 (VL + 3α) | 11 (VL + 3α) | VL + 3α |

As shown in Table 1, the same gray scale voltage level of (VL+3α) is outputted when the address of the 4 bit digital video data is (1100) to (1111).

Incidentally, the gray scale voltage levels shown in Table 1 may be the voltages actually applied to the liquid crystal. In other words, a gray scale voltage level shown in Table 1 may be of a voltage level determined by taking into consideration $V_{COM}$ applied to the opposing electrode which will be described later.

The liquid crystal display device of this embodiment carries out display by dividing one frame term Tf into four sub-frame terms (1st Tsf, 2nd Tsf, 3rd Tsf and 4th Tsf). Since the line sequential driving is conducted in the liquid crystal display device of this embodiment mode, gray scale voltage is written in each pixel during one sub-frame line term (Tsfl). Therefore, during sub-frame line terms (1st Tsfl, 2nd Tsfl, 3rd Tsfl and 4th Tsfl) corresponding to the sub-frame terms (1st Tsf, 2nd Tsf, 3rd Tsf and 4th Tsf), the address of time-gray scale processed 2 bit digital video data is inputted to the D/A converter circuit, which then outputs gray scale voltages. With the gray scale voltage written during the four sub-frame line terms (1st Tsfl, 2nd Tsfl, 3rd Tsfl and 4th Tsfl), four sub-frames are displayed at a high speed. As a result, one frame of display gray scale corresponds to a value obtained by totaling the gray scale voltage levels in the sub-frame line terms and then time-averaging the total. The voltage gray scale and the time ratio gray scale are thus simultaneously conducted.

In the liquid crystal display device of this embodiment mode, an initialize term (Ti) is provided prior to the start of the sub-frame line term in each sub-frame term. During this initialize term (Ti), a certain voltage Vi (pixel electrode initialize voltage) is applied to all the pixels and a certain voltage $V_{COMi}$ (opposing electrode initialize voltage) is applied to the opposing electrode, whereby the liquid crystal in splay orientation shifts into bend orientation.

Thus the display of $2^4-3=13$ gray scale levels can be obtained in the liquid crystal display device of this embodiment mode even in case of using the D/A converter circuit handling 2 bit digital video data.

The addresses (or gray scale voltage levels) of the digital video data written during the sub-frame line terms (1st Tsfl, 2nd Tsfl, 3rd Tsfl, and 4th Tsfl) may be set using a combination other than the combinations shown in Table 1. For instance, in Table 1, a gray scale voltage of (VL+α) is written during the third sub-frame line term (3rd Tsfl) and the fourth sub-frame line term (4th Tsfl), when the digital video data address is (0010). However, the present invention can be carried out without being limited to this combination. This means that the digital video data whose address is (0010) merely requires (VL+α) gray scale voltage to be written during any two sub-frame line terms out of four sub-frame line terms, i.e., the first sub-frame line term to the fourth sub-frame line term. There is no limitation in choosing and setting those two sub-frame line terms during which (VL+α) gray scale voltage is to be written.

Figure 7:
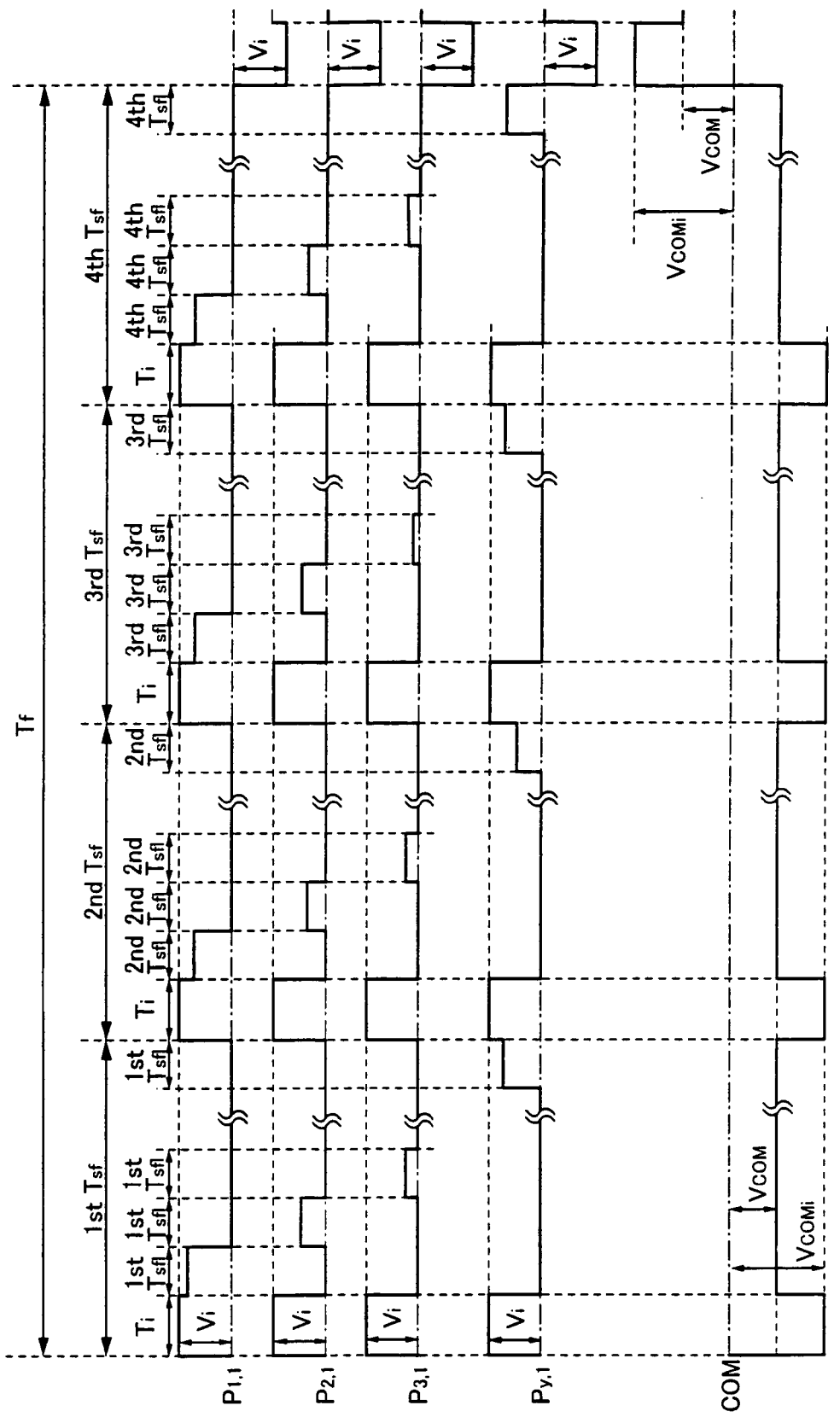
FIG. 7 is a diagram showing a driving timing chart according to an embodiment mode of a liquid crystal display device of the present invention.
Figure 8:
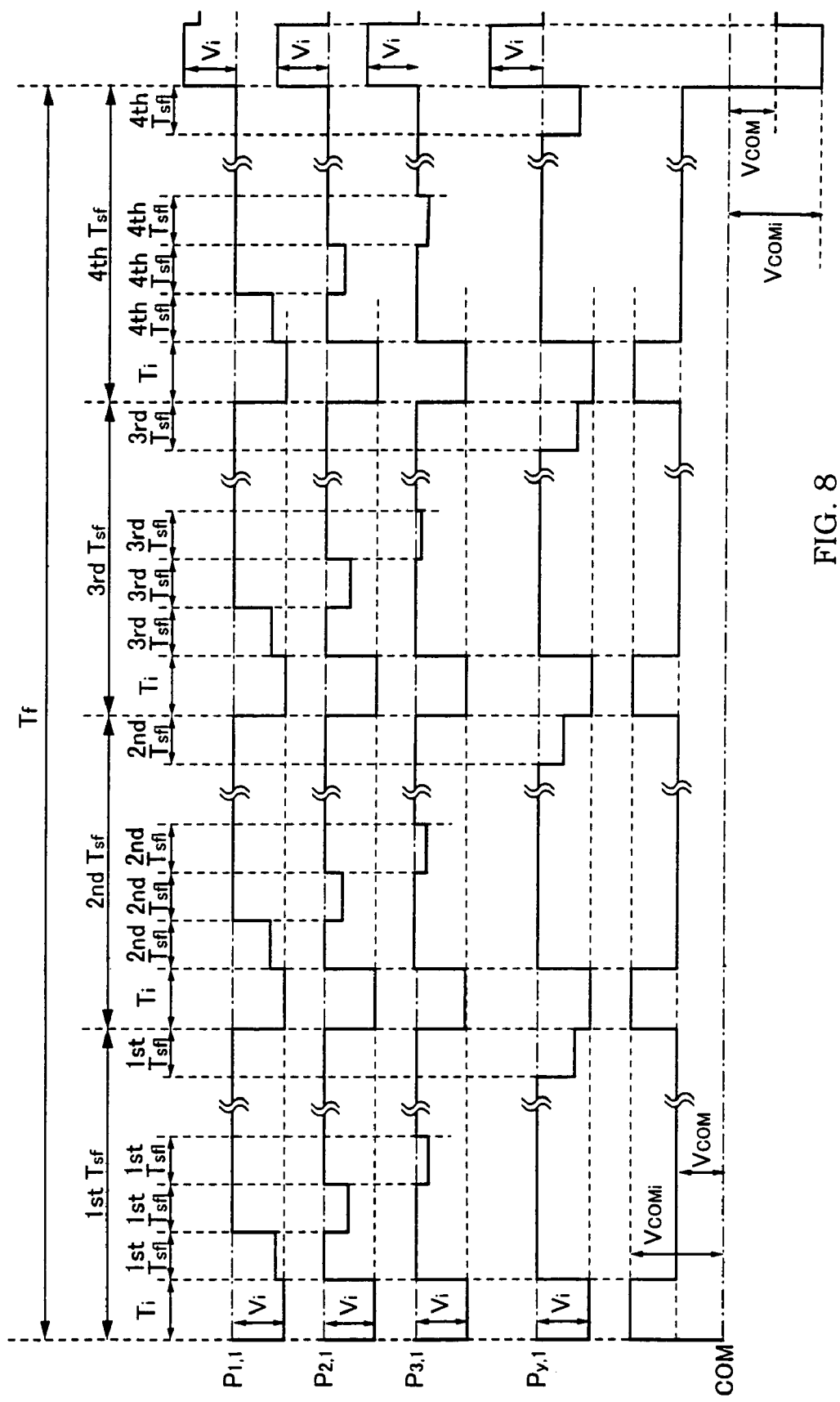
FIG. 8 is a diagram showing a driving timing chart according to an embodiment mode of a liquid crystal display device of the present invention.

Now, reference is made to FIGS. 7 and 8. FIGS. 7 and 8 together show a drive timing chart for the liquid crystal display device of this embodiment mode. The pixel P1,1, the pixel P2,1, the pixel P3,1 and the pixel Py,1 are taken as an example and shown in FIGS. 7 and 8. The drive timing chart is divided and shown in two diagrams, i.e., FIGS. 7 and 8. because of limited spaces.

As described above, one frame term (Tf) consists of the first sub-frame term (1st Tsf), the second sub-frame term (2nd Tsf), the third sub-frame term (3rd Tsf), and the fourth sub-frame term (4th Tsf). The initialize term (Ti) is placed before every sub-frame term, and a pixel electrode initialize voltage ($V_i$) is applied to all the pixels during this initialize term (Ti). An opposing electrode initialize voltage ($V_{COMi}$) is also applied to the opposing electrode (COM) during the initialize term (Ti).

Therefore, in this embodiment mode, a voltage of ($V_i+V_{COMi}$) is applied to the liquid crystal sandwiched between the pixel electrode and the opposing electrode during the initialize term (Ti). This voltage application brings the liquid crystal molecules in splay orientation into bend orientation, so that the device reaches the state where a high-speed response is possible also with later application of analogue gray scale voltage having image information.

Digital video data is converted by the D/A converter circuit into analogue gray scale voltage and is written in the pixel P1,1 during the first sub-frame line term (1 st Tsfl) subsequent to passing of the initialize term (Ti). After the initialize term (Ti), $V_{COM}$ is applied to the opposing electrode. Incidentally, $V_{COM}$ can be adjusted in accordance with the degree of flicker on the display screen. $V_{COM}$ may be 0 V.

It is desirable to set optimal values for $V_i$, $V_{COMi}$, and $V_{COM}$ in consistent with liquid crystal to be used and the quality of display.

After digital video data is converted by the D/A converter circuit into analogue gray scale voltage and written in the pixels P1,1 to P1,x, during the next sub-frame line term, the D/A converter circuit converts digital video data into analogue gray scale voltage and the voltage is written in the pixels P2,1 to P2,x.

In this way, the analogue gray scale voltage having image information is written in order in all the pixels, completing the first sub-frame term.

Subsequent to the first sub-frame term, the second sub-frame term is started. In the second sub-frame term (2nd Tsf) also, the opposing electrode (COM) is supplied with the opposing electrode initialize voltage ($V_{COMi}$) during the initialize term (Ti). And after the initialize term (Ti) is passed, digital video data is converted by the D/A converter circuit into analogue gray scale voltage and written in the pixels P1,1 to P1,x during the second sub-frame line term (2nd Tsfl). After digital video data is converted by the D/A converter circuit into analogue gray scale voltage and written in the pixels P1,1 to P1,x, during the next sub-frame line term, the D/A converter circuit converts digital video data into analogue gray scale voltage and the voltage is written in the pixels P2,1 to P2,x. Application of $V_{COM}$ to the opposing electrode follows the passing of the initialize term (Ti).

In this way, the analogue gray scale voltage having image information is written in order in all the pixels, completing the second sub-frame term.

Similar operation is carried out during the third sub-frame term (3rd Tsf) and the fourth sub-frame term (4th Tsf).

The first sub-frame term (1st Tsf) to the fourth sub-frame term (4th Tsf) are thus completed.

Subsequent to the completion of the first frame term, the second frame term is started (FIG. 8). This embodiment mode includes carrying out the frame inversion in which direction of the electric field applied to the liquid crystal is alternately inverted as one frame term ends and the next frame term begins. Therefore in the second frame term, the pixel electrode initialize voltage (Vi) and the gray scale voltages which are to be supplied to the pixel electrode has the opposite polarity to the one in the first frame term, by taking the opposing electrode as the reference electric potential.

Figure 9:
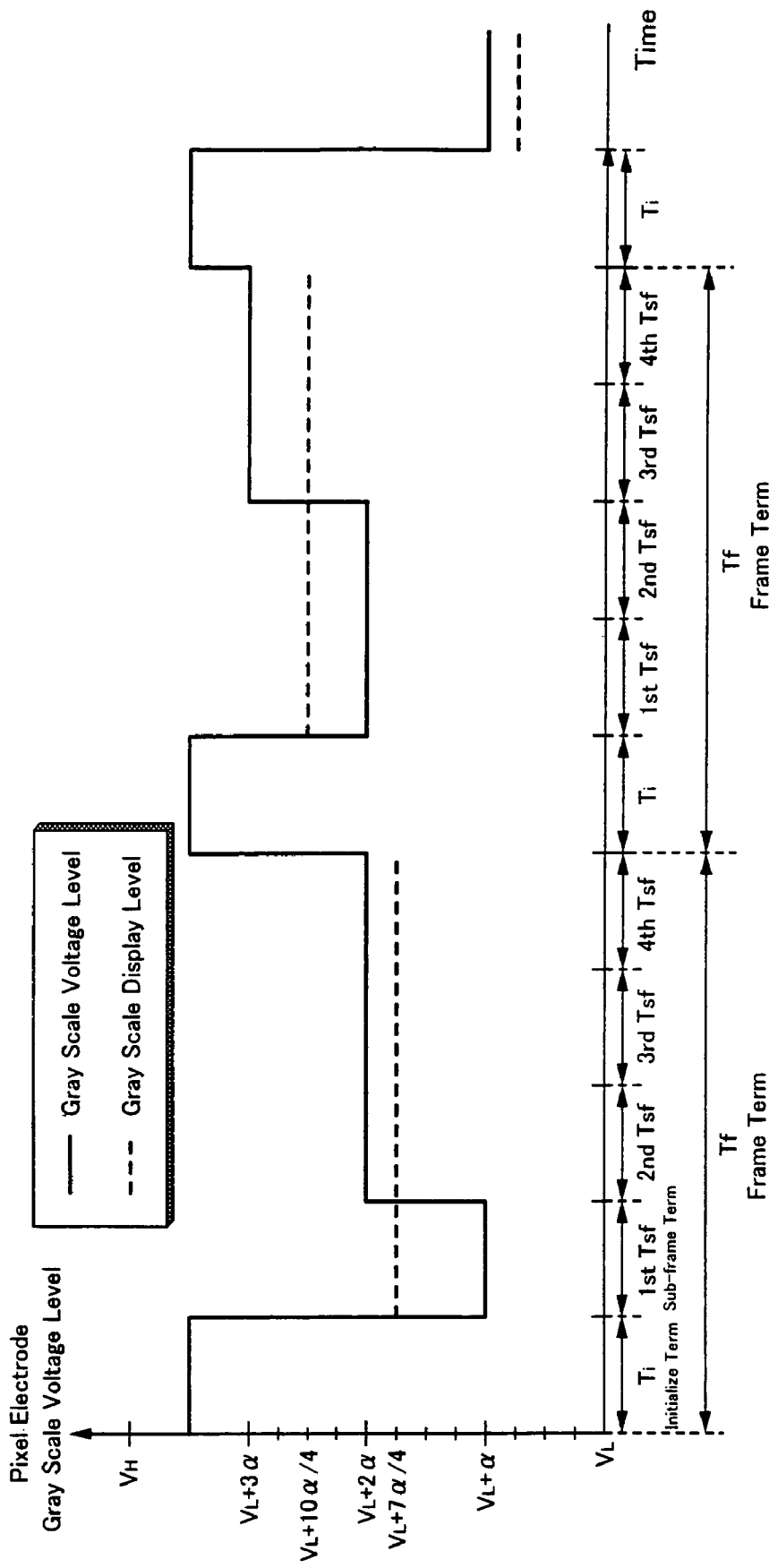
FIG. 9 is a diagram showing a driving timing chart according to an embodiment mode of a liquid crystal display device of the present invention.

Here, reference is made to FIG. 9. FIG. 9 exemplarily shows the relationship between the gray scale voltage level written in the pixel electrode of a certain pixel (pixel P1,1, for example) for every sub-frame term and gray scale display level during the frame term.

Firstly reference is made to the first frame term. The initialize voltage ($V_i$) is first applied to the pixel electrode during the initialize term (Ti), so that the liquid crystal in splay orientation shifts into bend orientation. After the initialize term (Ti) is ended, a gray scale voltage of (VL+α) is written during the first sub-frame line term (1st Tsfl) and gray scale display corresponding to the gray scale voltage of (VL+α) is conducted during the first sub-frame term (1st Tsf). Then, a gray scale voltage of (VL+2α) is written during the second sub-frame line term (2nd Tsfl) and gray scale display corresponding to the gray scale voltage of (VL+2α) is conducted during the second sub-frame term (2nd Tsf). Subsequently, a gray scale voltage of (VL+2α) is written during the third sub-frame line term (3rd Tsfl) and gray scale display corresponding to the gray scale voltage of (VL+2α) is conducted during the third sub-frame term (3rd Tsf). Thereafter, a gray scale voltage of (VL+2α) is written during the fourth sub-frame line term (4th Tsfl) and gray scale display corresponding to the gray scale voltage of (VL+2α) is conducted during the fourth sub-frame term (4th Tsf). The gray scale display level in the first frame, therefore, corresponds to the gray scale voltage level of (VL+7α/4).

Turning next to the second frame term, the initialize voltage ($V_i$) is first applied to the pixel electrode during the initialize term (Ti), so that the liquid crystal in splay orientation shifts into bend orientation. After the initialize term (Ti) is ended, a gray scale voltage of (VL+2α) is written during the first sub-frame line term (1st Tsfl) and gray scale display corresponding to the gray scale voltage of (VL+2α) is conducted during the first sub-frame term (1st Tsf). Then, a gray scale voltage of (VL+2α) is written during the second sub-frame line term (2nd Tsfl) and gray scale display corresponding to the gray scale voltage of (VL+2α) is conducted during the second sub-frame term (2nd Tsf). Subsequently, a gray scale voltage of (VL+3α) is written during the third sub-frame line term (3rd Tsfl) and gray scale display corresponding to the gray scale voltage of (VL+3α) is conducted during the third sub-frame term (3rd Tsf). Thereafter, a gray scale voltage of (VL+3α) is written during the fourth sub-frame line term (4th Tsfl) and gray scale display corresponding to the gray scale voltage of (VL+3α) is conducted during the fourth sub-frame term (4th Tsf). The gray scale display level in the second frame, therefore, corresponds to the gray scale voltage level of (VL+10α/4).

In this embodiment mode, in order to obtain the voltage level of four gray scales, the level between the voltage level VH and the voltage level VL is divided equally into four each having the value α. However, the present invention is still effective if the level between the voltage level VH and the voltage level VL is not divided equally but irregularly.

The gray scale voltage levels are realized by, in this embodiment mode, inputting the voltage level VH and the voltage level VL into the D/A converter circuit of the liquid crystal panel. This may be accomplished by inputting a voltage level of 3 or more, instead.

Though the gray scale voltage level written during the sub-frame line terms is set as shown in Table 1 in this embodiment mode, as mentioned above, it is not limited to the values in Table 1.

In this embodiment, of the 4 bit digital video data inputted from the external, 2 bit digital video data is converted into 2 bit digital video data for voltage gray scale and gray scale information of another 2 bit digital video data of the 4 bit digital video data is expressed in time ratio gray scale. Now, consider a general example where n bit digital video data of m bit digital video data from the external is converted into digital video data for gray scale voltage by a time ratio gray scale processing circuit while gray scale information of (m−n) bit data thereof is expressed in time ratio gray scale. The symbol m and n are both integers equal to or larger than 2 and satisfy m>n.

In this case, the relationship between frame term (Tf) and sub-frame term (Tsf) is expressed as follows:

$$Tf = 2^{m-n} \cdot Tsf$$

Therefore, ($2^m - (2^{m-n} - 1)$) patterns of gray scale display is obtained.

This embodiment mode takes as an example the case where m=4 and n=2. Needless to say, the present invention is not limited to that example. The symbols m and n may take 12 and 4, respectively, or 8 and 2. It is also possible to set m to 8 and n to 6, or to 10 and to 2. Values other than those may be used as well.

The voltage gray scale and the time gray scale may be conducted in the order stated, or one after another continuously.

Embodiment Mode 2

This embodiment mode gives a description of a case where frame inversion driving is carried out for every sub-frame in the liquid crystal display device of the present invention which has the structure shown in Embodiment Mode 1.

Figure 10:
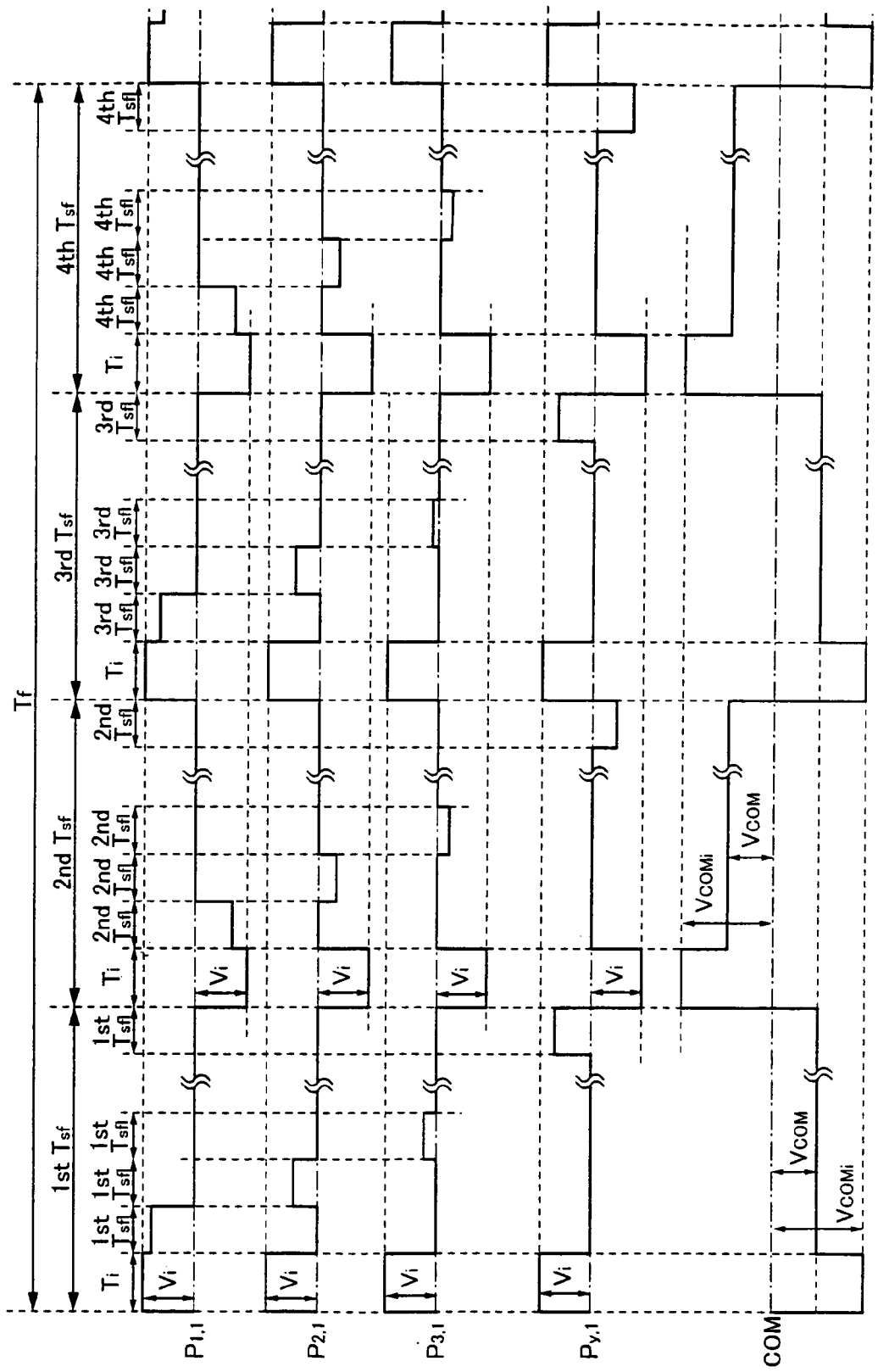
FIG. 10 is a diagram showing a driving timing chart according to an embodiment mode of a liquid crystal display device of the present invention.

Reference is made to FIG. 10. FIG. 10 shows a drive timing chart for the liquid crystal display device of this embodiment mode. The pixel P1,1, the pixel P2,1, the pixel P3,1 and the pixel Py,1 are taken as an example and shown in FIG. 10.

In this embodiment mode also, as described above, one frame term (Tf) consists of the first sub-frame term (1st Tsf), the second sub-frame term (2nd Tsf), the third sub-frame term (3rd Tsf), and the fourth sub-frame term (4th Tsf). The initialize term (Ti) is placed before every sub-frame term, and the pixel electrode initialize voltage ($V_i$) is applied to all the pixels during this initialize term (Ti). An opposing electrode initialize voltage ($V_{COMi}$) is also applied to the opposing electrode (COM) during the initialize term (Ti).

Therefore, in this embodiment also, a voltage of ($V_i+V_{COMi}$) is applied to the liquid crystal sandwiched between the pixel electrode and the opposing electrode during the initialize term (Ti). This voltage application brings the liquid crystal molecules in splay orientation into bend orientation, so that the device reaches the state where a high-speed response is possible even in case of later applying analogue gray scale voltage having image information.

In the first sub-frame term, after passing an initialize term (Ti), digital video data is converted by the D/A converter circuit into analogue gray scale voltage and the analogue gray scale voltage is written in the pixel P1,1 during the first sub-frame line term (1st Tsfl). In the pixels P1,1 to P1,x, analogue gray scale voltage corresponding to each pixel is written simultaneously. Note here that after the initialize term (Ti), $V_{COM}$ is applied to the opposing electrode. Incidentally, $V_{COM}$ can be adjusted in accordance with the degree of flicker on the display screen. This embodiment mode may take 0 V for $V_{COM}$.

After digital video data is converted by the D/A converter circuit into analogue gray scale voltage and written in the pixels P1,1 to P1,x, during the next sub-frame line term, the D/A converter circuit converts digital video data into analogue gray scale voltage and the voltage is written in the pixels P2,1 to P2,x.

In this way, the analogue gray scale voltage having image information is written in order in all the pixels, completing the first sub-frame term.

Subsequent to the first sub-frame term, the second sub-frame term is started. In the second sub-frame term (2nd Tsf) also, the opposing electrode (COM) is supplied with the opposing electrode initialize voltage ($V_{COMi}$) during the initialize term (Ti). Note that the electric field to be applied to the liquid crystal is inverted in polarity for every subframe, in this embodiment mode. It is the same in the second sub-frame term as in the first sub-frame term that, after the initialize term (Ti) is passed, digital video data is converted by the D/A converter circuit into analogue gray scale voltage and written in the pixels P1,1 to P1,x during the first sub-frame line term (1st Tsfl). After digital video data is converted by the D/A converter circuit into analogue gray scale voltage and written in the pixels P1,1 to P1,x, during the next sub-frame line term, the D/A converter circuit converts digital video data into analogue gray scale voltage and the voltage is written in the pixels P2,1 to P2,x. Application of $V_{COM}$ to the opposing electrode follows the passing of the initialize term (Ti).

In this way, the analogue gray scale voltage having image information is written in order in all the pixels, completing the second sub-frame term.

Similar operation is carried out during the third sub-frame term (3rd Tsf) and the fourth sub-frame term (4th Tsf).

The first sub-frame term (1st Tsf) to the fourth sub-frame term (4th Tsf) are thus completed.

Subsequent to the completion of the first frame term, the second frame term is started (not shown).

As seen in the above, display in this embodiment mode employs sub-frame inversion system in which direction of the electric field applied to the liquid crystal is inverted every time a sub-frame is ended to start the next one, to thereby obtain less flickering display.

Embodiment 3

This embodiment mode employs the structure explained in Embodiment Mode 1 for the liquid crystal display device of the present invention. A description given here is about a case where only the first sub-frame term has the initialize term so that the initialize voltage ($V_i$ and $V_{COM}$) are applied and the frame inversion driving is conducted.

Figure 11:
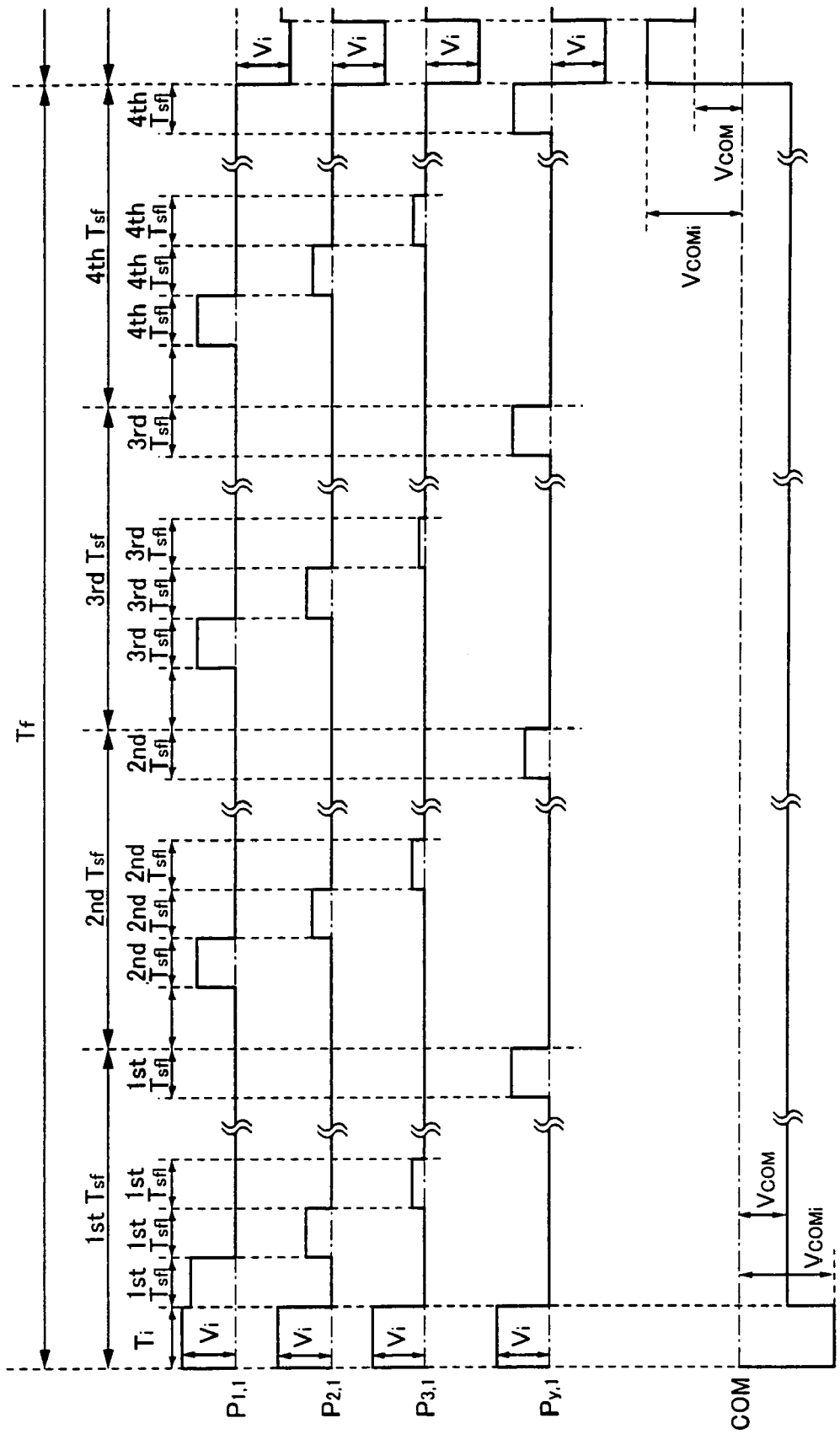
FIG. 11 is a diagram showing a driving timing chart according to an embodiment mode of a liquid crystal display device of the present invention.

Reference is made to FIG. 11. FIG. 11 shows a drive timing chart for the liquid crystal display device of this embodiment mode. The pixel P1,1, the pixel P2,1, the pixel P3,1 and the pixel Py,1 are taken as an example and shown in FIG. 11.

In this embodiment mode also, as described above, one frame term (Tf) consists of the first sub-frame term (1st Tsf), the second sub-frame term (2nd Tsf), the third sub-frame term (3rd Tsf), and the fourth sub-frame term (4th Tsf). The difference of this embodiment mode from Embodiment Mode 1 resides in that the initialize term (Ti) is placed before the start of the first sub-frame term only, to apply the pixel electrode initialize voltage ($V_i$) to all the pixels during this initialize term (Ti).

That the opposing electrode initialize voltage ($V_{COMi}$) is applied to the opposing electrode (COM) during the initialize term (Ti) is the same as Embodiment Mode 1.

Therefore, in this embodiment mode also, a voltage of ($V_i+V_{COMi}$) is applied to the liquid crystal sandwiched between the pixel electrode and the opposing electrode during the initialize term (Ti). This voltage application brings the liquid crystal molecules from splay orientation into bend orientation, so that the device reaches the state where a high-speed response is possible in case of later applying analogue gray scale voltage having image information.

In the first sub-frame term, digital video data is converted by the D/A converter circuit into analogue gray scale voltage and the analogue gray scale voltage is written in the pixel 1,1 during the first sub-frame line term (1st Tsfl) subsequent to passing of the initialize term (Ti). In the pixels P1,1 to P1,x, analogue gray scale voltage corresponding to each pixel is written simultaneously. After the initialize term (Ti), $V_{COM}$ is applied to the opposing electrode. Incidentally, $V_{COM}$ can be adjusted in accordance with the degree of flicker on the display screen. This embodiment mode may take 0 V for $V_{COM}$.

After digital video data is converted by the D/A converter circuit into analogue gray scale voltage and written in the pixels P1,1 to P1,x, during the next sub-frame line term, the D/A converter circuit converts digital video data into analogue gray scale voltage and the voltage is written in the pixels P2,1 to P2,x.

In this way, the analogue gray scale voltage having image information is written in order in all the pixels, completing the first sub-frame term.

Subsequent to the first sub-frame term, the second sub-frame term is started. The initialize term (Ti) is not provided in the second sub-frame term (2nd Tsf). Accordingly, the initialize voltage ($V_i$ and $V_{COM}$) are not applied to the pixels upon the start of the second sub-frame term. Digital video data is converted by the D/A converter circuit into analogue gray scale voltage and written in the pixels P1,1 to P1,x during the first sub-frame line term (1st Tsfl). After digital video data is converted by the D/A converter circuit into an analogue gray scale voltage and written in the pixels P1,1 to P1,x, during the next sub-frame line term, the D/A converter circuit converts digital video data into analogue gray scale voltage and the voltage is written in the pixels P2,1 to P2,x.

In this way, the analogue gray scale voltage having image information is written in order in all the pixels, completing the second sub-frame term.

Operation similar to the one in the second sub-frame term (2nd Tsf) is carried out during the third sub-frame term (3rd Tsf) and the fourth sub-frame term (4th Tsf).

The first sub-frame term to the fourth sub-frame term are thus completed.

Subsequent to the completion of the first frame term, the second frame term is started (not shown).

Embodiment Mode 4

Figure 12:
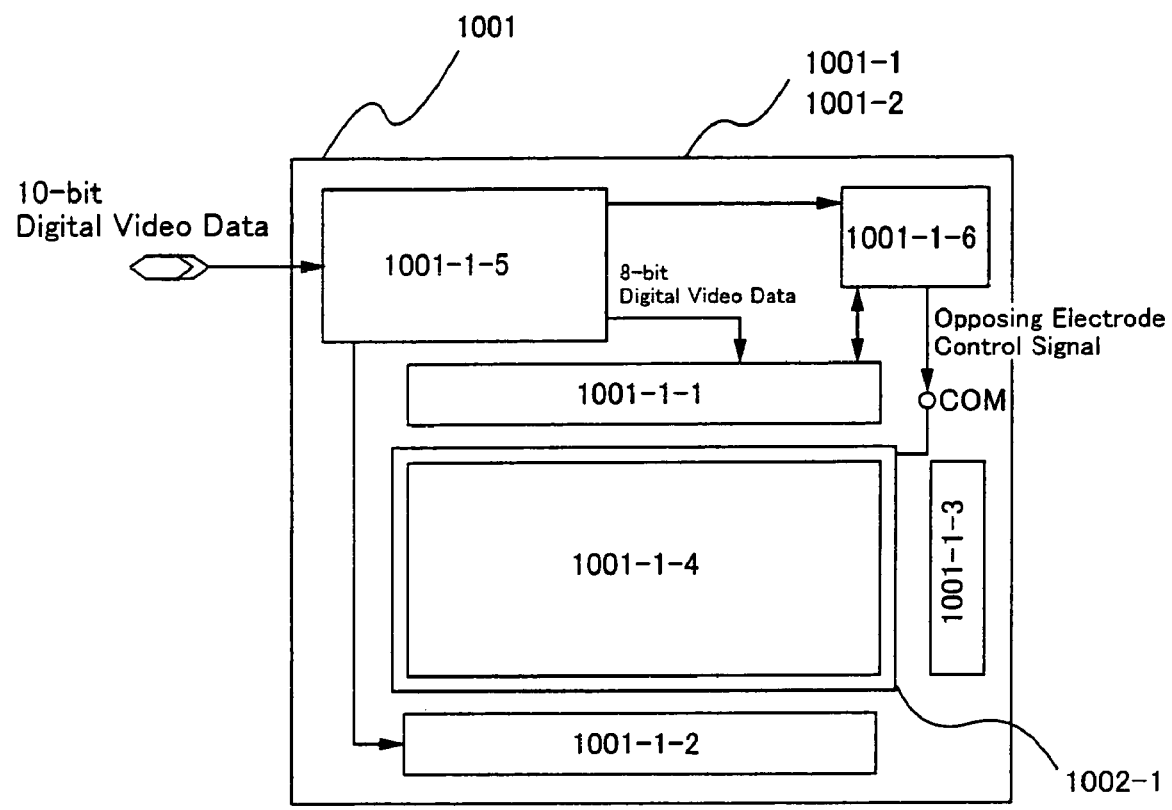
FIG. 12 is an outlined structural diagram of a liquid crystal display device of the present invention.

A description given in this embodiment deals with a liquid crystal display device to which 10 bit digital video data is inputted. Reference is made to FIG. 12 that schematically shows the structure of the liquid crystal display device of this embodiment mode. Reference numeral 1001 denotes a liquid crystal display device having an active matrix substrate 1001-1 and an opposing substrate 1001-2. The active matrix substrate 1001-1 comprises source drivers 1001-1-1 and 1001-1-2, a gate driver 1001-1-3, an active matrix circuit 1001-1-4 with a plurality of pixel TFTs arranged in matrix, a digital video data time ratio gray scale processing circuit 1001-1-5, and an opposing electrode driving circuit 1001-1-6. The opposing substrate 1001-2 has an opposing electrode 1001-2-1. A terminal COM is a terminal for supplying the opposing electrode with a signal.

In this embodiment, as shown in FIG. 12, the digital video data time ratio gray scale processing circuit is integrally formed with the opposing electrode driving circuit on the active matrix substrate, forming as a whole the liquid crystal display device.

The digital video data time gray scale processing circuit 1001-1-5 converts, of 10 bit digital video data inputted from the external, 8 bit digital video data into 8 bit digital video data for voltage gray scale. Gray scale information of 2 bit digital video data of the 10 bit digital video data is expressed in time gray scale.

The 8 bit digital video data converted by the digital video data time ratio gray scale processing circuit 1001-1-5 is inputted to the source drivers 1001-1-1, 1001-1-2, converted into analogue gray scale voltage by D/A converter circuits (not shown) within the source drivers, and sent to each source signal line.

Figure 13:
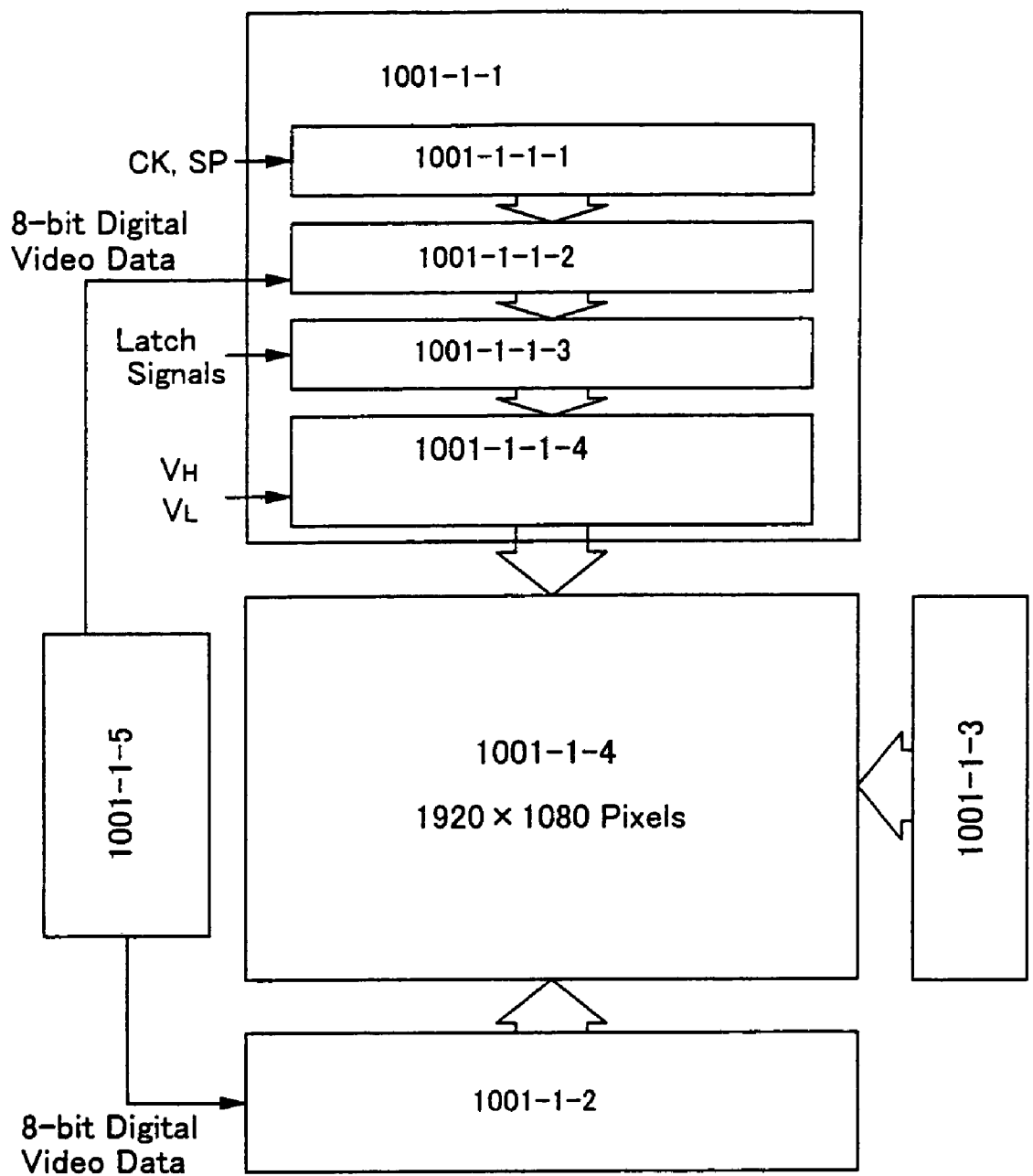
FIG. 13 is a circuit structure diagram of an active matrix circuit, a source driver and gate drivers according to an embodiment mode of a liquid crystal display device of the present invention.

Now take a look at FIG. 13. FIG. 13 shows more detailed circuit structure of the liquid crystal display device of this embodiment mode. The source driver 1001-1-1 comprises a shift register circuit 1001-1-1-1, a latch circuit 1 (1001-1-1-2), a latch circuit 2 (1001-1-1-3), and a D/A converter circuit (1001-1-1-4). Other than those, the source driver includes a buffer circuit and a level shifter circuit (neither is shown). For the convenience in explanation, the D/A converter circuit 1001-1-1-4 assumedly includes a level shifter circuit.

The source driver 1001-1-2 has the same structure as that of the source driver 1001-1-1. The source driver 1001-1-1 sends an image signal (gray scale voltage) to odd-numbered source signal lines and the source driver 1001-1-2 sends an image signal to even-numbered source signal lines.

In the active matrix liquid crystal display device of this embodiment mode, to suit the convenience of the circuit layout, two source drivers 1001-1-1, 1001-1-2 are arranged sandwiching vertically the active matrix circuit. However, only one source driver may be used if that is possible in view of the circuit layout.

The gate driver 1001-1-3 includes a shift register circuit, a buffer circuit, a level shifter circuit, etc., (all of which is not shown).

The active matrix circuit 1001-1-4 contains 1920 (in width)×1080 (in length) pixels. Each pixel has the structure similar to the one described in the above Embodiment 1.

The liquid crystal display device of this embodiment has the D/A converter circuit 1001-1-1-4 that processes 8 bit digital video data. Information contained in 2 bit data of 10 bit digital video data inputted from the external is used for time gray scale. The time gray scale here is the same as in the above Embodiment 1.

Therefore, the liquid crystal display device of this embodiment can obtain $2^8-3=253$ patterns of gray scale display.

The liquid crystal display device of this embodiment may be driven by any of the driving methods shown in the above Embodiment Modes 1 to 3.

Embodiment Mode 5

This embodiment mode describes an example of manufacturing method of a liquid crystal display device of the present invention. Explained here is a method in which TFTs for an active matrix circuit and TFTs for a driver circuit arranged in the periphery of the active matrix circuit are formed at the same time.

Figure 14A:
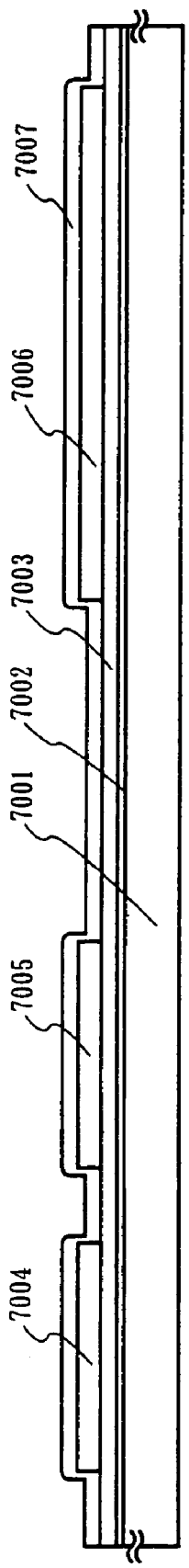
FIGS. 14A to 14C are diagrams showing an example of manufacturing processes for a liquid crystal display device of the present invention.

[Step of Forming Island Semiconductor Layer and Gate Insulating Film: FIG. 14A]

In FIG. 14A, non-alkaline glass substrate or a quartz substrate is preferably used for a substrate 7001. A silicon substrate or a metal substrate that have an insulating film formed on the surface, may also be used.

On one surface of the substrate 7001 on which the TFT is to be formed, a base film made of a silicon oxide film, a silicon nitride film, or a silicon nitride oxide film is formed by plasma CVD or sputtering to have a thickness of 100 to 400 nm. For instance, a base film 7002 may be formed with a two-layer structure in which a silicon nitride film 7002 having a thickness of 25 to 100 nm, here in 50 nm, and a silicon oxide film 7003 having a thickness of 50 to 300 nm, here in 150 nm, are formed. The base film 7002 is provided for preventing impurity contamination from the substrate, and is not always necessary if a quartz substrate is employed.

Next, an amorphous silicon film with a thickness of 20 to 100 nm is formed on the base film 7002 by a known film formation method. Though depending on its hydrogen content, the amorphous silicon film is preferably heated at 400 to 550° C. for several hours for dehydrogenation, reducing the hydrogen content to 5 atomic % or less to prepare for the crystallization step. The amorphous silicon film may be formed by other formation methods such as sputtering or evaporation. In this case, it is desirable that impurity elements such as oxygen and nitrogen etc. contained in the film be sufficiently reduced. The base film and the amorphous silicon film can be formed by the same film formation method here, so that the films may be formed continuously. In that case, it is possible to prevent contamination on the surface since it is not exposed to the air, and that reduces fluctuation in characteristics of the TFTs to be manufactured.

A known laser crystallization technique or thermal crystallization technique may be used for a step of forming a crystalline silicon film from the amorphous silicon film. The crystalline silicon film may be formed by thermal oxidation using a catalytic element for promoting the crystallization of silicon. Other options include the use of a microcrystal silicon film and direct deposition of a crystalline silicon film. Further, the crystalline silicon film may be formed by employing a known technique of SOI (Silicon On Insulators) with which a single-crystal silicon is adhered to a substrate.

An unnecessary portion of the thus formed crystalline silicon film is etched and removed to form island semiconductor layers 7004 to 7006. A region in the crystalline silicon film where an N channel TFT is to be formed may be doped in advance with boron (B) in a concentration of about $1\times10^{15}$ to $5\times10^{17}$ cm$^{-3}$ in order to control the threshold voltage.

Then a gate insulating film 7007 comprising mainly silicon oxide or silicon nitride is formed to cover the island semiconductor layers 7004 to 7006. The thickness of the gate insulating film 7007 may be 10 to 200 nm, preferably 50 to 150 nm. For example, the gate insulating film may be fabricated by forming a silicon nitride oxide film by plasma CVD with raw materials of $N_2O$ and $SiH_4$ in a thickness of 75 nm, and then thermally oxidizing the film in an oxygen atmosphere or a mixed atmosphere of oxygen and hydrogen chloride at 800 to 1000° C. into a thickness of 115 nm (FIG. 14A).

Figure 14B:
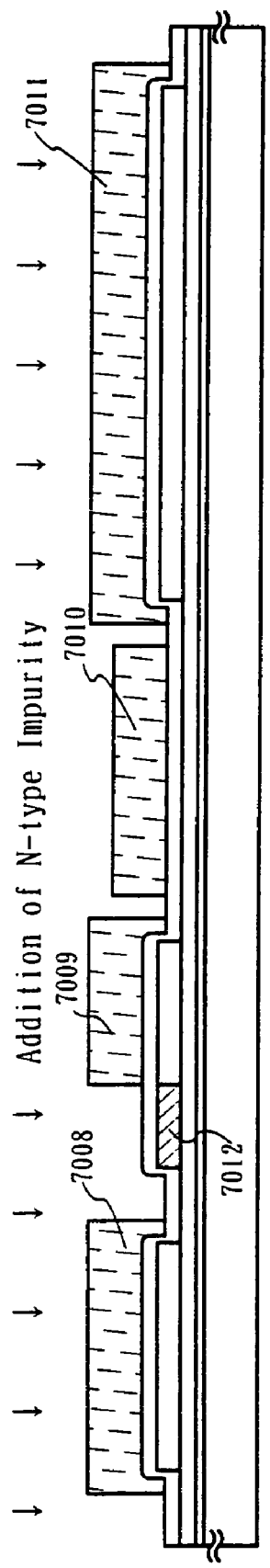

[Formation of N$^-$ Region: FIG. 14B]

Resist masks 7008 to 7011 are formed over the entire surfaces of the island semiconductor layers 7004 and 7006 and region where wiring is to be formed, and over a portion of the island semiconductor layer 7005 (including a region to be a channel formation region) and a lightly doped region 7012 is formed by doping impurity element imparting n-type. This lightly doped region 7012 is an impurity region for forming later an LDD region (called an Lov region in this specification, where 'ov' stands for 'overlap') that overlaps with a gate electrode through the gate insulating film in the N channel TFT of a CMOS circuit. The concentration of the impurity element for imparting n type in the lightly doped region formed here is referred to as (n$^-$). Accordingly, the lightly doped region 7012 may be called n$^-$ region in this specification.

Phosphorus is doped by ion doping with the use of plasma-excited phosphine (PH$_3$) without performing mass-separation on it. Needless to say, the ion implantation involving mass-separation may be employed instead. In this step, a semiconductor layer beneath the gate insulating film 7007 is doped with phosphorus through the film 7007. The concentration of phosphorus to be used in the doping preferably ranges from $5\times10^{17}$ atoms/cm$^3$ to $5\times10^{18}$ atoms/cm$^3$, and the concentration here in this embodiment mode is set to $1\times10^{18}$ atoms/cm$^3$.

Thereafter, the resist masks 7008 to 7011 are removed and heat treatment is conducted in a nitrogen atmosphere at 400 to 900° C., preferably, 550 to 800° C. for 1 to 12 hours, activating phosphorus added in this step.

Figure 14C:
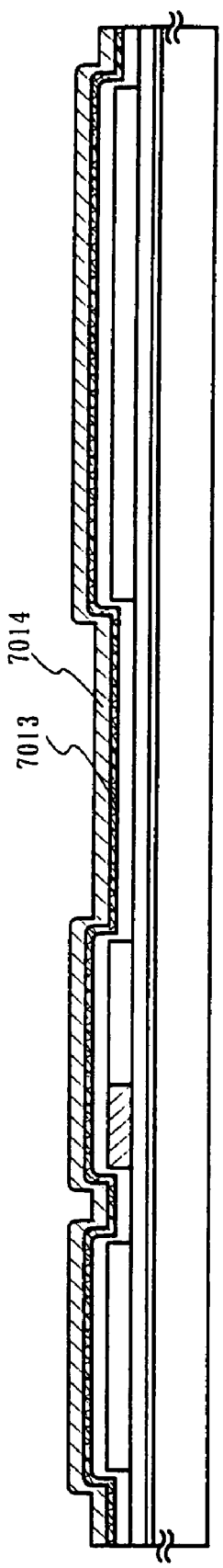

[Formation of Conductive Films for Gate Electrode and for Wiring: FIG. 14C]

A first conductive film 7013 with a thickness of 10 to 100 nm is formed from an element selected from tantalum (Ta), titanium (Ti), molybdenum (Mo) and tungsten (W) or from a conductive material comprising one of those elements as its main ingredient. Tantalum nitride (TaN) or tungsten nitride (WN), for example, is desirably used for the first conductive film 7013. A second conductive film 7014 with a thickness of 100 to 400 nm is further formed on the first conductive film 7013 from an element selected from Ta. Ti, Mo and W or from a conductive material comprising one of those elements as its main ingredient For instance, a Ta film may be formed in a thickness of 200 nm. Though not shown, it is effective to form a silicon film with a thickness of about 2 to 20 nm under the first conductive film 7013 for the purpose of preventing oxidation of the conductive films 7013 or 7014 (especially the conductive film 7014).

Figure 15A:
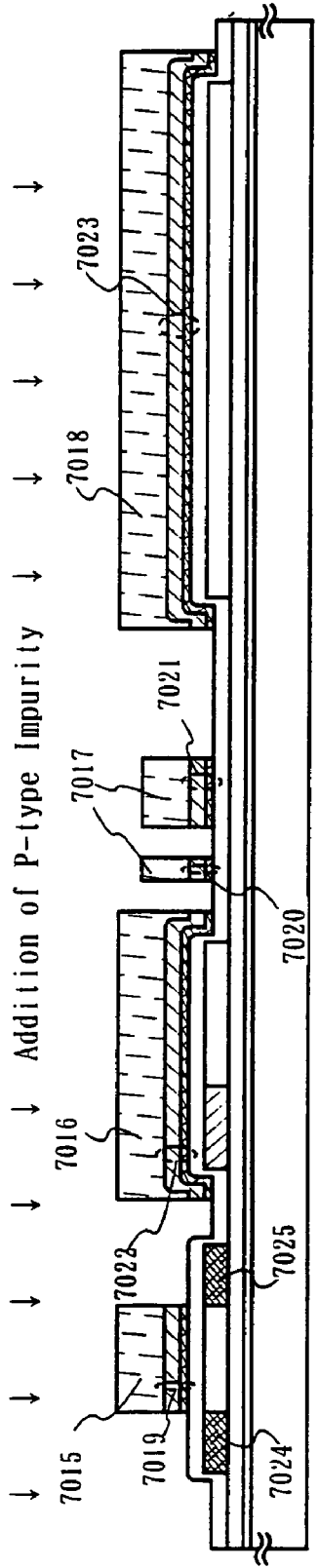
FIGS. 15A to 15C are diagrams showing an example of manufacturing processes for a liquid crystal display device of the present invention.

[Formation of P-ch Gate Electrode and Wiring Electrode, and Formation of P$^+$ Region: FIG. 15A]

Resist masks 7015 to 7018 are formed and the first conductive film and the second conductive film (which are hereinafter treated as a laminated film) are etched to form a gate electrode 7019 and gate wirings 7020 and 7021 of a P channel TFT. Here, conductive films 7022 and 7023 are left to cover the entire surface of the regions to be N channel TFTs.

Proceeding to the next step, the resist masks 7015 to 7018 are remained as they are to serve as masks, and a part of the semiconductor layer 7004 where the P channel TFT is to be formed is doped with an impurity element for imparting p type. Boron may be used here as the impurity element and is doped by ion doping (of course ion implantation may also be employed) using diborane (B$_2$H$_6$). Boron is doped here to a concentration from $5\times10^{20}$ to $3\times10^{21}$ atoms/cm$^3$. The concentration of the impurity element for imparting p type contained in the impurity regions formed here is expressed as (p$^{++}$). Accordingly, impurity regions 7024 and 7025 may be referred to as p$^{++}$regions in this specification.

Here, doping process of impurity element imparting p-type may be performed instead after exposing a portion of island semiconductor layer 7004 by removing gate insulating film 7007 by etching, using resist masks 7015-7018. In this case, a low acceleration voltage is sufficient for the doping, causing less damage on the island semiconductor film and improving the throughput

Figure 15B:
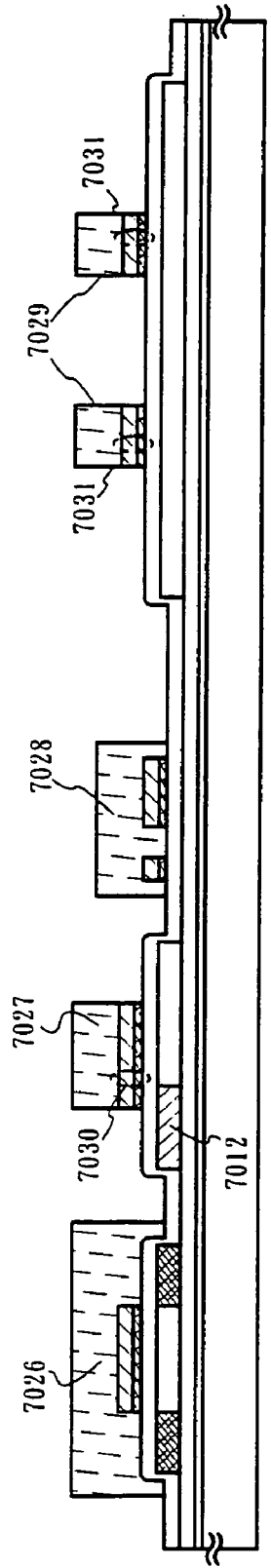

[Formation of N-ch Gate Electrode: FIG. 15B]

Then the resist masks 7015 to 7018 are removed and new resist masks 7026 to 7029 are formed to form gate electrodes 7030 and 7031 of the N channel TFTs. At this point, the gate electrode 7030 is formed so as to overlap with the n$^-$ region 7012 through the gate insulating film.

Figure 15C:
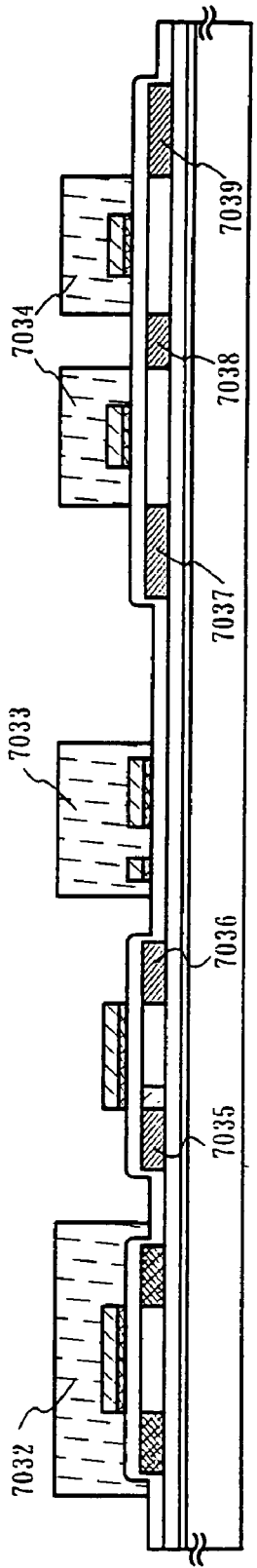

[Formation of N$^+$ Region: FIG. 15C]

The resist masks 7026 to 7029 are then removed and new resist masks 7032 to 7034 are formed. Subsequently, a step of forming an impurity region functioning as a source region or a drain region in the N channel TFT is carried out. The resist mask 7034 is formed so as to cover the gate electrode 7031 of the N channel TFT. This is for forming in later step an LDD region that do not overlap with the gate electrode in the N channel TFT of the active matrix circuit.

An impurity element imparting n type is added thereto to form impurity regions 7035 to 7039. Here, ion doping (of course ion implantation also will do) using phosphine (PH$_3$) is again employed, and the phosphorus concentration in these regions are set to $1\times10^{20}$ to $1\times10^{21}$ atoms/cm$^3$. The concentration of the impurity element for imparting n type contained in the impurity regions 7037 to 7039 formed here is designated as (n$^+$). Accordingly, the impurity regions 7037 to 7039 may be referred to as n$^+$ regions in this specification. The impurity regions 7035 and 7036 have n$^-$ regions which have already been formed, so that, strictly speaking, they contain a slightly higher concentration of phosphorus than the impurity regions 7037 to 7039 do.

Here, doping process of impurity element imparting n-type may be performed instead after exposing a portion of island semiconductor layer 7005 and 7006 by removing gate insulating film 7007 by etching using resist masks 7032 to 7034 and gate electrode 7030 as masks. In this case, a low acceleration voltage is sufficient for the doping, causing less damage on the island-like semiconductor films and improving the throughput.

Figure 16A:
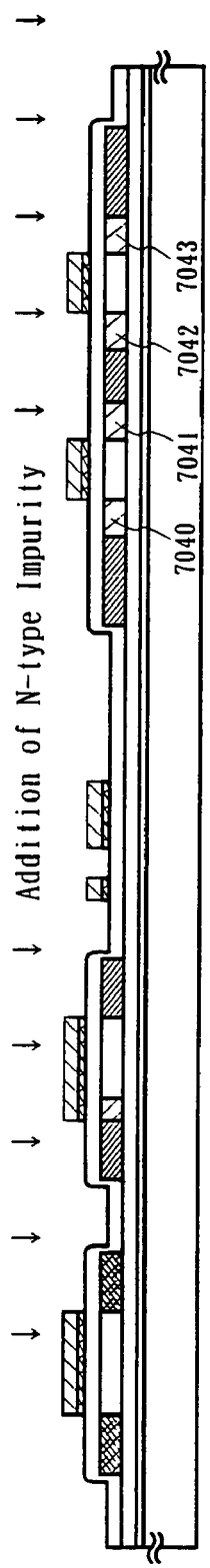
FIGS. 16A to 16C are diagrams showing an example of manufacturing processes for a liquid crystal display device of the present invention.

[Formation of N$^{--}$ Region: FIG. 16A]

Next, the resist masks 7032 to 7034 are removed and an impurity element imparting n type is doped in the island semiconductor layer 7006 where the N channel TFT of the active matrix circuit is to be formed. Thus formed impurity regions 7040 to 7043 are doped with phosphorus in the same concentration as in the above n$^-$ regions or a less concentration (specifically, $5 \times 10^{16}$ to $1 \times 10^{18}$ atoms/cm$^3$). The concentration of the impurity element imparting n type contained in the impurity regions 7040 to 7043 formed here is expressed as (n$^{--}$). Accordingly, the impurity regions 7040 to 7043 may be referred to as n$^{--}$ regions in this specification. Incidentally, every impurity region except for an impurity region 7067 that is hidden under the gate electrode is doped with phosphorus in a concentration of n$^{--}$ in this step. However, the phosphorus concentration is so low that the influence thereof may be ignored.

Figure 16B:
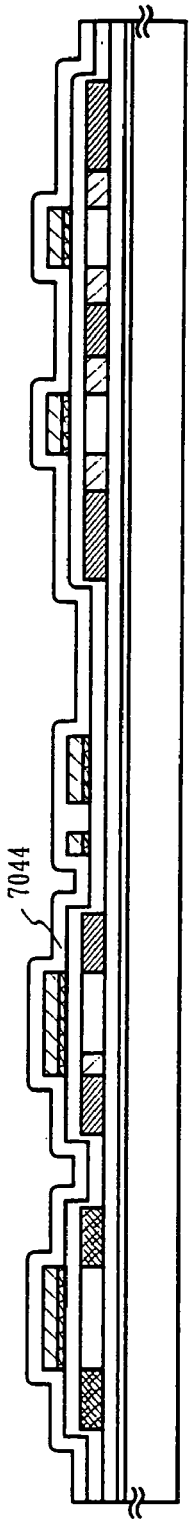

[Step of Thermal Activation: FIG. 16B]

Formed next is a protective insulating film 7044, which will later become a part of a first interlayer insulating film. The protective insulating film 7044 may comprise a silicon nitride film, a silicon oxide film, a silicon nitride oxide film or a laminated film combining those films. The film thickness thereof ranges from 100 nm to 400 nm.

Thereafter, a heat treatment step is carried out to activate the impurity element added in the respective concentration for imparting n type or p type. This step may employ the furnace annealing, the laser annealing or the rapid thermal annealing (RTA). Here in this embodiment mode, the activation step is carried out by the furnace annealing. The heat treatment is conducted in a nitrogen atmosphere at 300 to 650° C., preferably 400 to 550° C., in here 450° C., for 2 hours.

Further heat treatment is performed in an atmosphere containing 3 to 100% of hydrogen at 300 to 450° C. for 1 to 12 hours, hydrogenating the island semiconductor layer. This step is to terminate dangling bonds in the semiconductor layer with thermally excited hydrogen. Other hydrogenating means includes plasma hydrogenation (that uses hydrogen excited by plasma).

Figure 16C:
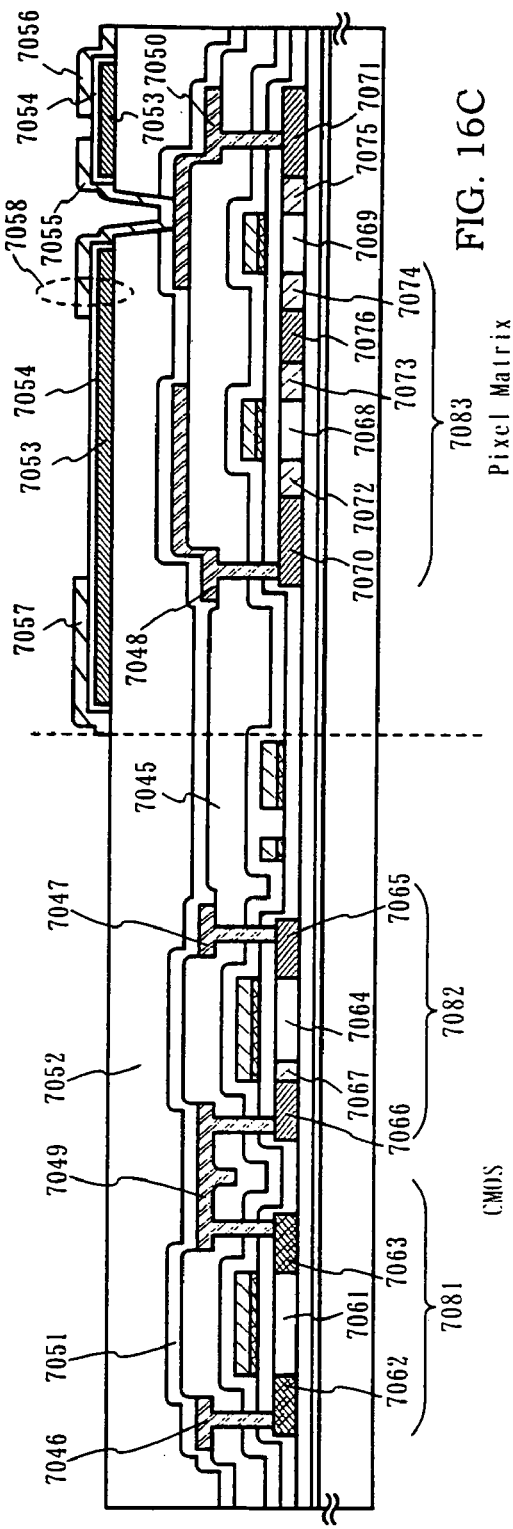

[Formation of Interlayer Insulating Film, Source/drain Electrode, Light-shielding Film, Pixel Electrode and Holding Capacitance: FIG. 16C]

Upon completion of the activation step, an interlayer insulating film 7045 with a thickness of 0.5 to 1.5 µm is formed on the protective insulating film 7044. A laminated film consisting of the protective insulating film 7044 and the interlayer insulating film 7045 serves as a first interlayer insulating film.

After that, contact holes reaching to the source regions or the drain regions of the respective TFTs are formed to form source electrodes 7046 to 7048 and drain electrodes 7049 and 7050. Though not shown, these electrodes in this embodiment mode comprise a laminated film having a three-layer structure in which a Ti film with a thickness of 100 nm, a Ti-containing aluminum film with a thickness of 300 nm and another Ti film with a thickness of 150 nm are sequentially formed by sputtering.

Then a passivation film 7051 is formed using a silicon nitride film, a silicon oxide film or a silicon nitride oxide film in a thickness of 50 to 500 nm (typically, 200 to 300 nm). Subsequent hydrogenation treatment performed in this state brings a favorable result in regard to the improvement of the TFT characteristics. For instance, it is sufficient if heat treatment is conducted in an atmosphere containing 3 to 100% hydrogen at 300 to 450° C. for 1 to 12 hours. The same result can be obtained when the plasma hydrogenation method is used. An opening may be formed here in the passivation film 7051 at a position where a contact hole is later formed for connecting pixel electrode and the drain electrode.

Thereafter, a second interlayer insulating film 7052 made from an organic resin is formed to have a thickness of about 1 µm. As the organic resin, polyimide, acrylic, polyamide, polyimideamide, BCB (benzocyclobutene), etc. may be used. The advantages in the use of the organic resin film include simple film formation, reduced parasitic capacitance owing to low relative permittivity, excellent flatness, etc. Other organic resin films than the ones listed above or an organic-based SiO compound may also be used. Here, polyimide of the type being thermally polymerized after applied to the substrate is used and fired at 300° C. to form the film 7052.

Subsequently, a light-shielding film 7053 is formed on the second interlayer insulating film 7052 in area where active matrix circuit is formed. The light-shielding film 7053 comprises an element selected from aluminum (Al), titanium (Ti) and tantalum (Ta) or of a film containing one of those elements as its main ingredient into a thickness of 100 to 300 nm. On the surface of the light-shielding film 7053, an oxide film 7054 with a thickness of 30 to 150 nm (preferably 50 to 75 nm) is formed by anodic oxidation or plasma oxidation. Here, an aluminum film or a film mainly containing aluminum is used as the light-shielding film 7053, and an aluminum oxide film (alumina film) is used as the oxide film 7054.

The insulating film is provided only on the surface of the light-shielding film here in this embodiment mode. The insulating film may be formed by a vapor deposition method such as plasma CVD, thermal CVD, or by sputtering. In that case also, the film thickness thereof is appropriately 30 to 150 nm (preferably 50 to 75 nm). A silicon oxide film, a silicon nitride film, a silicon nitride oxide film, a DLC (Diamond-like carbon) film or an organic resin film may be used for the insulating film. A lamination film with those films layered in combination may also be used.

Then a contact hole reaching the drain electrode 7050 is formed in the second interlayer insulating film 7052 to form a pixel electrode 7055. Note that pixel electrodes 7056 and 7057 are adjacent but individual pixels, respectively. For the pixel electrodes 7055 to 7057, a transparent conductive film may be used in the case of fabricating a transmission type display device and a metal film may be used in the case of a reflection type display device. Here, in order to manufacture a transmission type display device, an indium tin oxide film (ITO) with a thickness of 100 nm is formed by sputtering.

At this point, a storage capacitor is formed in a region 7058 where the pixel electrode 7055 overlaps with the light-shielding film 7053 through the oxide film 7054.

In this way, an active matrix substrate having the CMOS circuit serving as a driver circuit and the active matrix circuit formed on the same substrate is completed. A P channel TFT 7081 and an N channel TFT 7082 are formed in the CMOS circuit serving as a driver circuit, and a pixel TFT 7083 is formed from an N channel TFT in the active matrix circuit.

The P channel TFT 7081 of the CMOS circuit has a channel formation region 7061, and a source region 7062 and a drain region 7063 formed respectively in the p$^+$ regions. The N channel TFT 7082 has a channel formation region 7064, a source region 7065, a drain region 7066 and an LDD region (hereinafter referred to as Lov region, where 'ov' stands for 'overlap') 7067 that overlaps with the gate electrode through the gate insulating film. The source region 7065 and the drain region 7066 are formed respectively in (n⁻+n⁺) regions and the Lov region 7067 is formed in the n⁻ region.

The pixel TFT 7083 has channel formation regions 7068 and 7069, a source region 7070, a drain region 7071, LDD regions 7072 to 7075 which do not overlap with the gate electrode through the gate insulating film (hereinafter referred to as Loff regions, where 'off' stands for 'offset'), and an n⁺ region 7076 in contact with the Loff regions 7073 and 7074. The source region 7070 and the drain region 7071 are formed respectively in the n⁺ regions and the Loff regions 7072 to 7075 are formed in the n⁻ regions.

According to the manufacturing process of the present embodiment mode, the structure of the TFTs for forming the active matrix circuit and for forming the driver circuit can be optimized in accordance with the circuit specification each circuit requires, thereby improving operational performance and reliability of the semiconductor device. In concrete, by varying the arrangement of LDD regions of n-channel TFT by appropriately using Lov region or Loff region according to the circuit specification, a TFT structure in which high operation or countermeasure to hot carrier is sought and a TFT structure in which low OFF current operation is sought are realized on the same substrate.

For instance, the N channel TFT 7082 is suitable for a logic circuit where importance is attached to the high speed operation, such as a shift register circuit, a frequency divider circuit, a signal dividing circuit, a level shifter circuit and a buffer circuit. On the other hand, the N channel TFT 7083 is suitable for a circuit where importance is attached to the low OFF current operation, such as an active matrix circuit and a sampling circuit (sample hold circuit).

The length (width) of the Lov region is 0.5 to 3.0 μm, typically 1.0 to 1.5 μm, with respect to the channel length of 3 to 7 μm. The length (width) of the Loff regions 7072 to 7075 arranged in the pixel TFT 7083 is 0.5 to 3.5 μm, typically 2.0 to 2.5 μm.

Through the above steps, an active matrix substrate is completed.

Next, a description will be given on a process of manufacturing a liquid crystal display device using the active matrix substrate fabricated through the above steps.

An alignment film (not shown) is formed on the active matrix substrate in the state shown in FIG. 16C. In this embodiment mode, polyimide is used for the alignment film. An opposite substrate is then prepared. The opposite substrate comprises a glass substrate, an opposing electrode made of a transparent conductive film and an alignment film (neither of which is shown).

A polyimide film is again used for the alignment film of the opposite substrate in this embodiment mode. After forming the alignment film, rubbing treatment is performed. The polyimide used for the alignment film in this embodiment mode is one that has a relatively large pretilt angle.

The active matrix substrate and the opposite substrate which have undergone the above steps are then adhered to each other by a known cell assembly process through a sealing material or a spacer (neither is shown). After that, liquid crystal is injected between the substrates and an end-sealing material (not shown) is used to completely seal the substrates. In this embodiment mode, nematic liquid crystal is used for the injected liquid crystal.

A liquid crystal display device is thus completed.

Incidentally, the amorphous silicon film may be crystallized by laser light (typically excimer laser light) instead of the crystallization method for amorphous silicon film described in this embodiment mode.

Additionally, the polycrystalline silicon film may be replaced by an SOI structure (SOI substrate) such as Smart-Cut™, a SIMOX, and ELTRAN™ to perform other processes.

Embodiment Mode 6

This embodiment mode gives a description on another manufacturing method of a liquid crystal display device of the present invention. The description here in this embodiment mode deals with a method of simultaneously manufacturing TFTs forming an active matrix circuit and those forming a driver circuit arranged in the periphery of the active matrix circuit.

Figure 17A:
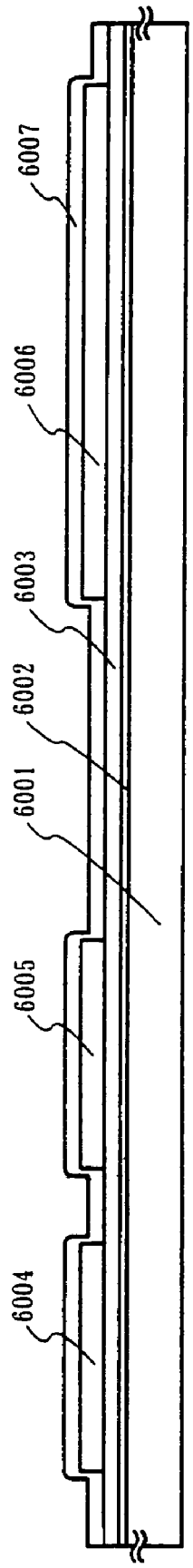
FIGS. 17A to 17C are diagrams showing an example of manufacturing processes for a liquid crystal display device of the present invention.

[Steps of Formation of Island-like Semiconductor Layer and Gate Insulating Film: FIG. 17A]

In FIG. 17A, a non-alkaline glass substrate or a quartz substrate is desirably used for a substrate 6001. A usable substrate other than those may be a silicon substrate or a metal substrate on the surface of which an insulating film is formed.

On the surface of the substrate 6001 on which the TFT is to be formed, a base film 6002 made of a silicon oxide film, a silicon nitride film, or a silicon nitride oxide film is formed by plasma CVD or sputtering to have a thickness of 100 to 400 nm. For instance, a base film 6002 is preferably formed in a two-layer structure in which a silicon nitride film 6002 having a thickness of 25 to 100 nm, in here 50 nm, and a silicon oxide film 6003 having a thickness of 50 to 300 nm, in here 150 nm, are layered. The base film 6002 is provided for preventing impurity contamination from the substrate, and is not always necessary if a quartz substrate is employed.

Next, an amorphous silicon film with a thickness of 20 to 100 nm is formed on the base film 6002 by a known film formation method. Though depending on its hydrogen content, the amorphous silicon film is preferably heated at 400 to 550° C. for several hours for dehydrogenation, reducing the hydrogen content to 5 atomic % or less to prepare for the crystallization step. The amorphous silicon film may be formed by other formation methods such as sputtering or evaporation if impurity elements such as oxygen and nitrogen etc. contained in the film are sufficiently reduced. The base film and the amorphous silicon film can be formed by the same film formation method here continuously. In that case, the device is not exposed to the air after forming the base film, which makes it possible to prevent contamination of the surface reducing fluctuation in characteristics of the TFTs to be manufactured.

A known laser crystallization technique or thermal crystallization technique may be used for a step of forming a crystalline silicon film from the amorphous silicon film. The crystalline silicon film may be formed by thermal oxidation using a catalytic element for promoting the crystallization of silicon. Other options include the use of a microcrystal silicon film and direct deposition of a crystalline silicon film. Further, the crystalline silicon film may be formed by employing a known technique of SOI (Silicon On Insulators) with which a single-crystal silicon is adhered to a substrate.

An unnecessary portion of thus formed crystalline silicon film is etched and removed to form island semiconductor layers 6004 to 6006. Boron may be doped in advance in a region in the crystalline silicon film where an N channel TFT is to be formed in a concentration of about $1 \times 10^{15}$ to $5 \times 10^{17}$ cm⁻³ in order to control the threshold voltage.

Then a gate insulating film 6007 containing mainly silicon oxide or silicon nitride is formed to cover the island semiconductor layers 6004 to 6006. The thickness of the gate insulating film 6007 is 10 to 200 nm, preferably 50 to 150 nm. For example, the gate insulating film may be fabricated by forming a silicon nitride oxide film by plasma CVD with raw materials of $N_2O$ and $SiH_4$ in a thickness of 75 nm, and then thermally oxidizing the film in an oxygen atmosphere or a mixed atmosphere of oxygen and chlorine at 800 to 1000° C. into a thickness of 115 nm (FIG. 17A).

Figure 17B:
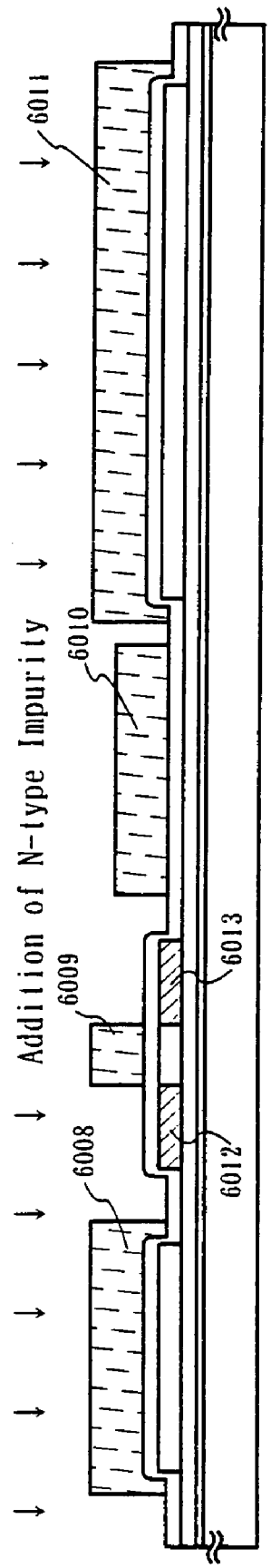

[Formation of $N^-$ Region: FIG. 17B]

Resist masks 6008 to 6011 are formed on the entire surfaces of the island-like semiconductor layers 6004 and 6006 and region where a wiring is to be formed, and on a portion of the island semiconductor layer 6005 (including a region to be a channel formation region) and lightly doped regions 6012 and 6013 were formed by doping impurity element imparting n-type. These lightly doped regions 6012 and 6013 are impurity regions for later forming LDD regions that overlap with a gate electrode through the gate insulating film (called Lov regions in this specification, where 'ov' stands for 'overlap') in the N channel TFT of a CMOS circuit. The concentration of the impurity element for imparting n type contained in the lightly doped regions formed here is referred to as ($n^-$). Accordingly, the lightly doped regions 6012 and 6013 may be called $n^-$ regions.

Phosphorus is doped by ion doping with the use of plasma-excited phosphine ($PH_3$) without performing mass-separation on it. Of course, ion implantation involving mass-separation may be employed instead. In this step, a semiconductor layer beneath the gate insulating film 6007 is doped with phosphorus through the film 6007. The concentration of phosphorus may preferably be set in a range from $5\times10^{17}$ atoms/cm$^3$ to $5\times10^{18}$ atoms/cm$^3$, and the concentration here is set to $1\times10^{18}$ atoms/cm$^3$.

Thereafter, the resist masks 6008 to 6011 are removed and heat treatment is conducted in a nitrogen atmosphere at 400 to 900° C., preferably 550 to 800° C., for 1 to 12 hours, activating phosphorus added in this step.

Figure 17C:
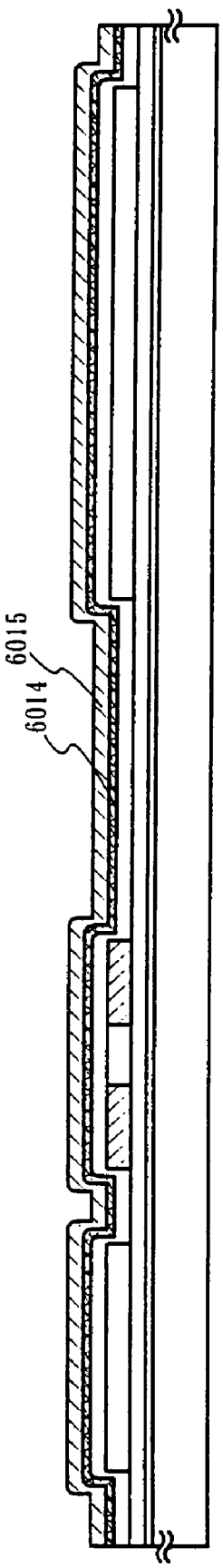

[Formation of Conductive Films for Gate Electrode and for Wiring: FIG. 17C]

A first conductive film 6014 with a thickness of 10 to 100 nm is formed from an element selected from tantalum (Ta), titanium (Ti), molybdenum (Mo) and tungsten (W) or from a conductive material containing one of those elements as its main ingredient. Tantalum nitride (TaN) or tungsten tungsten (WN), for example, is desirably used for the first conductive film 6014. A second conductive film 6015 with a thickness of 100 to 400 nm is further formed on the first conductive film 6014 from an element selected from Ta, Ti, Mo and W or from a conductive material containing one of those elements as its main ingredient. For instance, A Ta film is formed in a thickness of 200 nm. Though not shown, it is effective to form a silicon film with a thickness of about 2 to 20 nm under the first conductive film 6014 for the purpose of preventing oxidation of the conductive films 6014, 6015 (especially the conductive film 6015).

[Formation of P-ch Gate Electrode and Wiring Electrode, and Formation of $P^+$ Region: FIG. 18A]

Resist masks 6016 to 6019 are formed and the first conductive film and the second conductive film (which are hereinafter treated as a laminated film) are etched to form a gate electrode 6020 and gate wirings 6021 and 6022 of a P channel TFT. Conductive films 6023, 6024 are left to cover the entire surface of the regions to be N channel TFTs.

Proceeding to the next step, the resist masks 6016 to 6019 are remained as they are to serve as masks, and a part of the semiconductor layer 6004 where the P channel TFT is to be formed is doped with an impurity element for imparting p type. Boron is selected here as the impurity element and is doped by ion doping (of course ion implantation also will do) using dibolane ($B_2H_6$). The concentration of boron used in the doping here is $5\times10^{20}$ to $3\times10^{21}$ atoms/cm$^3$. The concentration of the impurity element for imparting p type contained in the impurity regions formed here is expressed as ($p^{++}$). Accordingly, impurity regions 6025 and 6026 may be referred to as $p^{++}$ regions in this specification.

Here, doping process of impurity element imparting p-type may be performed instead after exposing a portion of island semiconductor layer 6004 by removing gate insulating film 6007 by etching using resist masks 6016 to 6019. In this case, a low acceleration voltage is sufficient for the doping, causing less damage on the island semiconductor film and improving the throughput.

[Formation of N-ch Gate Electrode: FIG. 18B]

Then the resist masks 6016 to 6019 are removed and new resist masks 6027 to 6030 are formed to form gate electrodes 6031 and 6032 of the N channel TFTs. At this point, the gate electrode 6031 is formed so as to overlap with the $n^-$ regions 6012. 6013 through the gate insulating film.

[Formation of $N^+$ Region: FIG. 18C]

The resist masks 6027 to 6030 are then removed and new resist masks 6033 to 6035 are formed. Subsequently, a step of forming an impurity region functioning as a source region or a drain region in the N channel TFT will be carried out. The resist mask 6035 is formed so as to cover the gate electrode 6032 of the N channel TFT. This is for forming in later step an LDD region which do not to overlap with the gate electrode in the N channel TFT of the active matrix circuit.

An impurity element for imparting n type is added thereto to form impurity regions 6036 to 6040. Here, ion doping (of course ion implantation also will do) using phosphine ($PH_3$) is again employed, and the phosphorus concentration in these regions is set to $1\times10^{20}$ to $1\times10^{21}$ atoms/cm$^3$. The concentration of the impurity element contained in the impurity regions 6038 to 6040 formed here is expressed as ($n^+$). Accordingly, the impurity regions 6038 to 6040 may be referred to as $n^+$ regions in this specification. The impurity regions 6036, 6037 have $n^-$ regions which have already been formed, so that, strictly speaking, they contain a slightly higher concentration of phosphorus than the impurity regions 6038 to 6040 do.

Here, doping process of impurity element imparting n-type may be performed instead after exposing a portion of island semiconductor layer 6005 and 6006 by removing gate insulating film 6007 by etching using resist masks 6033 to 6035. In this case, a low acceleration voltage is sufficient for the doping, causing less damage on the island semiconductor film and improving the throughput.

Figure 19A:
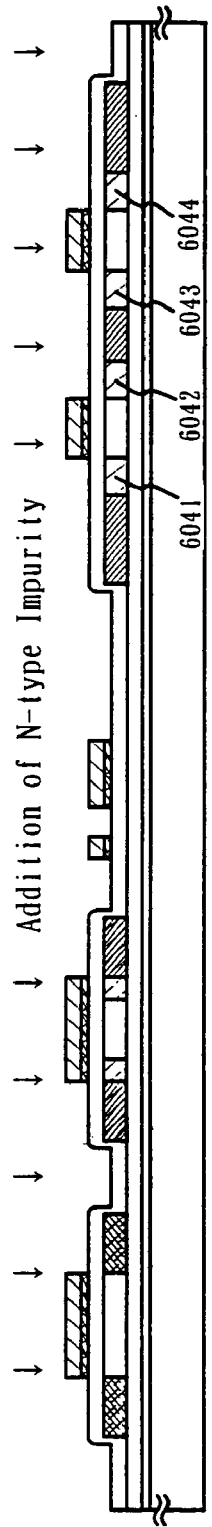
FIGS. 19A to 19C are diagrams showing an example of manufacturing processes for a liquid crystal display device of the present invention.

[Formation of $N^{--}$ region: FIG. 19A]

Next, a step is carried out in which the resist masks 6033 to 6035 are removed and the island semiconductor layer 6006 where the N channel TFT of the active matrix circuit is to be formed is doped with an impurity element for imparting n type. The thus formed impurity regions 6041 to 6044 are doped with phosphorus in the same concentration as in the above $n^-$ regions or a less concentration (specifically, $5\times10^{16}$ to $1\times10^{18}$ atoms/cm$^3$). The concentration of the impurity element for imparting n type contained in the impurity regions 6041 to 6044 formed here is expressed as ($n^{--}$). Accordingly, the impurity regions 6041 to 6044 may be referred to as $n^{--}$ regions in this specification. Incidentally, every impurity region except for an impurity region 6068 that is hidden under the gate electrode is doped with phosphorus in a concentration of n⁻⁻ in this step. However, the phosphorus concentration is so low that the influence thereof may be ignored.

Figure 19B:
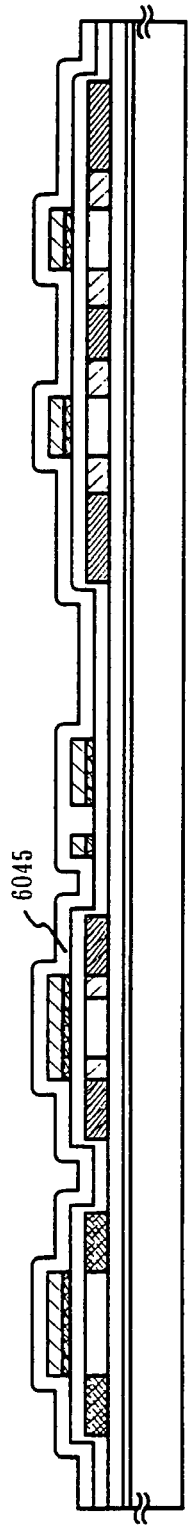

[Step of Thermal Activation: FIG. 19B]

Formed next is a protective insulating film 6045, which will later become a part of a first interlayer insulating film. The protective insulating film 6045 may be made of a silicon nitride film, a silicon oxide film, a silicon nitride oxide film or a lamination film with those films layered in combination. The film thickness thereof ranges from 100 nm to 400 nm.

Thereafter, a heat treatment step is carried out to activate the impurity elements added in the respective concentration for imparting n type or p type. This step may employ the furnace annealing, the laser annealing or the rapid thermal annealing (RTA). Here, the activation step is carried out by the furnace annealing. The heat treatment is conducted in a nitrogen atmosphere at 300 to 650° C., preferably 400 to 550° C., in here 450° C., for 2 hours.

Further heat treatment is performed in an atmosphere containing 3 to 100% of hydrogen at 300 to 450° C. for 1 to 12 hours, hydrogenating the island semiconductor layer. This step is to terminate dangling bonds in the semiconductor layer with thermally excited hydrogen. Other hydrogenating means includes plasma hydrogenation (that uses hydrogen excited by plasma).

Figure 19C:
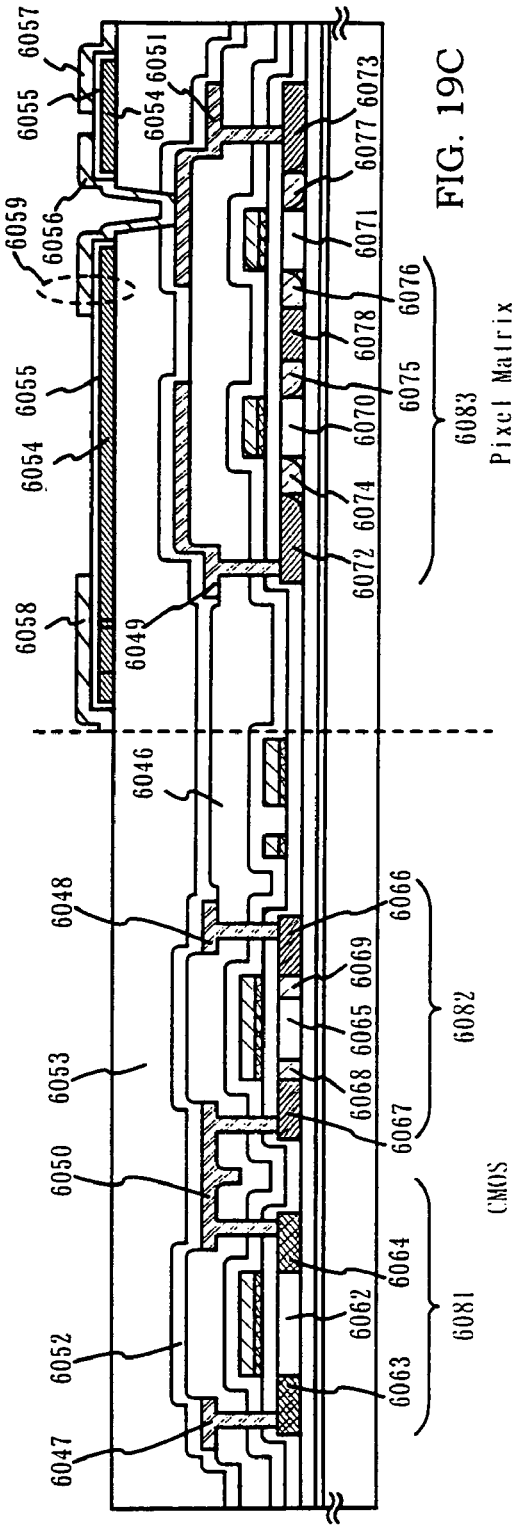

[Formation of Interlayer Insulating Film, Source/drain Electrode, Light-shielding Film, Pixel Electrode and Holding Capacitance: FIG. 19C]

Upon completion of the activation step, an interlayer insulating film 6046 with a thickness of 0.5 to 1.5 μm is formed on the protective insulating film 6045. A lamination film consisting of the protective insulating film 6045 and the interlayer insulating film 6046 serves as a first interlayer insulating film.

After that, contact holes reaching to the source regions and the drain regions of the respective TFTs are formed to form source electrodes 6047 to 6049 and drain electrodes 6050 and 6051. Though not shown, these electrodes in this embodiment mode are each made of a laminated film having a three-layer structure in which a Ti film with a thickness of 100 nm, a Ti-containing aluminum film with a thickness of 300 nm and another Ti film with a thickness of 150 nm are sequentially formed by sputtering.

Then a passivation film 6052 is formed using a silicon nitride film, a silicon oxide film or a silicon nitride oxide film in a thickness of 50 to 500 nm (typically, 200 to 300 nm). Subsequent hydrogenation treatment performed in this state brings a favorable result in regard to the improvement of the TFT characteristics. For instance, it is sufficient if heat treatment is conducted in an atmosphere containing 3 to 100% hydrogen at 300 to 450° C. for 1 to 12 hours. The same result can be obtained when the plasma hydrogenation method is used. An opening may be formed here in the passivation film 6052 at a position where a contact hole for connecting the pixel electrode and the drain electrode is to be formed.

Thereafter, a second interlayer insulating film 6053 made from an organic resin is formed to have a thickness of about 1 μm. As the organic resin, polyimide, acrylic, polyamide, polyimideamide, BCB (benzocyclobutene), etc. may be used. The advantages in the use of the organic resin film include simple film formation, reduced parasitic capacitance owing to low relative permittivity, excellent flatness, etc. Other organic resin films than the ones listed above and an organic-based SiO compound may also be used. Here, polyimide of the type being thermally polymerized after applied to the substrate is used and burst at 300° C. to form the film 6053.

Subsequently, a light-shielding film 6054 is formed on the second interlayer insulating film 6053 in a region to be the active matrix circuit. The light-shielding film 6054 is made from an element selected from aluminum (Al), titanium (Ti) and tantalum (Ta) or of a film containing one of those elements as its main ingredient to have a thickness of 100 to 300 nm. On the surface of the light-shielding film 6054, an oxide film 6055 with a thickness of 30 to 150 nm (preferably 50 to 75 nm) is formed by anodic oxidation or plasma oxidation. Here in this embodiment mode, an aluminum film or a film mainly containing aluminum is used as the light-shielding film 6054, and an aluminum oxide film (alumina film) is used as the oxide film 6055.

The insulating film is provided only on the surface of the light-shielding film here in this embodiment mode. The insulating film may be formed by a vapor phase method such as plasma CVD, thermal CVD or sputtering. In that case also, the film thickness thereof is appropriately 30 to 150 nm (preferably 50 to 75 nm). A silicon oxide film, a silicon nitride film, a silicon nitride oxide film, a DLC (Diamond like carbon) film or an organic resin film may be used for the insulating film. A lamination film with those films layered in combination may also be used.

Then a contact hole reaching the drain electrode 6051 is formed in the second interlayer insulating film 6053 to form a pixel electrode 6056. Incidentally, pixel electrodes 6057 and 6058 are for adjacent but individual pixels, respectively. For the pixel electrodes 6056 to 6058, a transparent conductive film may be used in the case of fabricating a transmission type display device and a metal film may be used in the case of a reflection type display device. In the embodiment mode here, in order to manufacture a transmission type display device, an indium tin oxide (ITO) film with a thickness of 100 nm is formed by sputtering.

At this point, a storage capacitor is formed using a region 6059 where the pixel electrode 6056 overlaps with the light-shielding film 6054 through the oxide film 6055.

In this way, an active matrix substrate having the CMOS circuit serving as a driver circuit and the active matrix circuit which are formed on the same substrate is completed. A P channel TFT 6081 and an N channel TFT 6082 are formed in the CMOS circuit serving as a driver circuit, and a pixel TFT 6083 is formed from an N channel TFT in the active matrix circuit.

The P channel TFT 6081 of the CMOS circuit has a channel formation region 6062, and a source region 6063 and a drain region 6064 respectively formed in the p⁺regions. The N channel TFT 6082 has a channel formation region 6065, a source region 6066, a drain region 6067 and LDD regions 6068 and 6069 which overlap with the gate electrode through the gate insulating film (hereinafter referred to as Lov region, where 'ov' stands for 'overlap'). The source region 6066 and the drain region 6067 are formed respectively in (n⁻+n⁺) regions and the Lov region 6068 and 6069 are formed in the n⁻ region.

The pixel TFT 6083 has channel formation regions 6069 and 6070, a source region 6071, a drain region 6072, LDD regions 6073 to 6076 which do not overlap with the gate electrode through the gate insulating film (hereinafter referred to as Loff regions, where 'off' stands for 'offset'), and an n⁺ region 6077 in contact with the Loff regions 6074 and 6075. The source region 6071 and the drain region 6072 are formed respectively in the n⁺ regions and the Loff regions 6073 to 6076 are formed in the n⁻⁻ regions.

According to the manufacturing method of the present embodiment mode, the structure of the TFTs for forming the active matrix circuit and for forming the driver circuit can be optimized in accordance with the circuit specification each circuit requires, thereby improving operational performance and reliability of the semiconductor device. Specifically, varying the arrangement of the LDD region in the N channel TFT and choosing either the Lov region or the Loff region in accordance with the circuit specification realize formation on the same substrate of the TFT structure that attaches importance to high speed operation or to countermeasures for hot carrier and the TFT structure that attaches importance to low OFF current operation.

For instance, in the case of the active matrix display device, the N channel TFT 6082 is suitable for a logic circuit where importance is attached to the high speed operation, such as a shift register circuit, a frequency divider circuit, a signal dividing circuit, a level shifter circuit and a buffer circuit. On the other hand, the N channel TFT 6083 is suitable for a circuit where importance is attached to the low OFF current operation, such as an active matrix circuit and a sampling circuit (sample hold circuit).

The length (width) of the Lov region is 0.5 to 3.0 µm, typically 1.0 to 1.5 µm, with respect to the channel length of 3 to 7 µm. The length (width) of the Loff regions 6073 to 6076 arranged in the pixel TFT 6083 is 0.5 to 3.5 µm, typically 2.0 to 2.5 µm.

A display device is manufactured using as the base the active matrix substrate fabricated through the above steps. For an example of the manufacturing process, see Embodiment mode 5.

Embodiment Mode 7

Figure 20:
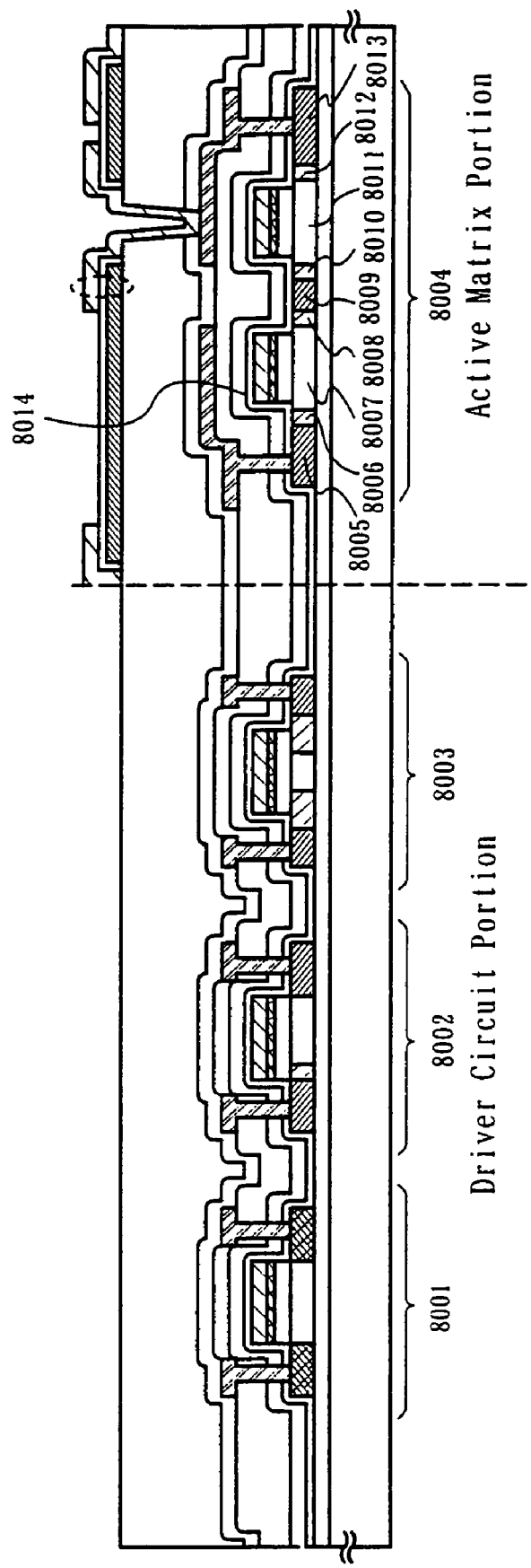
FIG. 20 is a diagram showing cross sectional structure of a display device according to the present invention.

FIG. 20 shows an example of another structure of the active matrix substrate for the liquid crystal display device of the present invention. Reference numeral 8001 denotes a P channel TFT, while 8002, 8003 and 8004 denote N channel TFTs. The TFTs 8001, 8002, 8003 constitute a circuit portion of a driver, and 8004 is a component of an active matrix circuit portion.

Reference numerals 8005 to 8013 denote semiconductor layers of the pixel TFT constituting the active matrix circuit. Denoted by 8005, 8009 and 8013 are n$^+$ regions; 8006, 8008, 8010 and 8012, n$^{--}$ regions; and 8007 and 8011, channel formation regions. A cap layer of an insulating film is designated by 8014, which is provided to form offset portions in the channel formation regions.

As concerns this embodiment mode, see a patent application by the present applicant, Japanese Patent Application No. 11-67809.

Embodiment Mode 8

Figure 21:
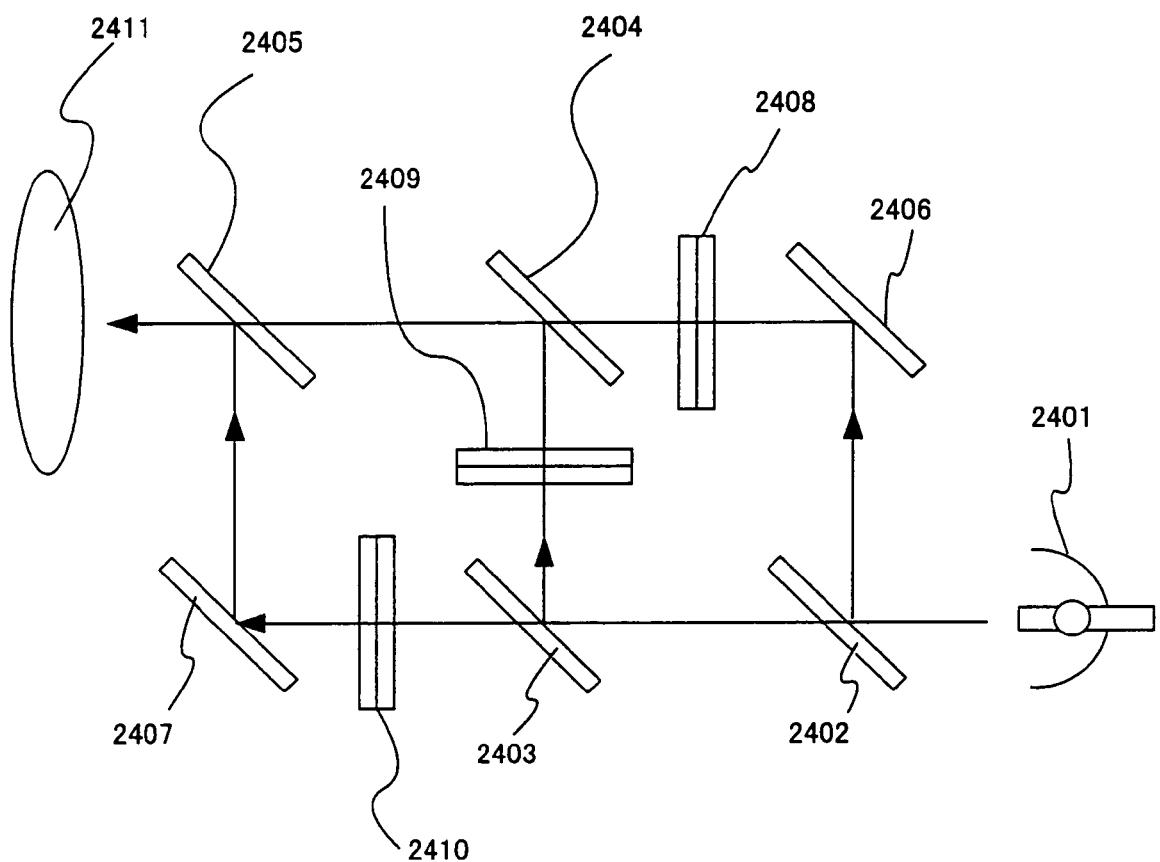
FIG. 21 is a structural diagram schematically showing a 3-plate type projector using a liquid crystal display device of the present invention.

The display device of the present invention described above may be used for a three panel type projector as shown in FIG. 21.

In FIG. 21, reference numeral 2401 denotes a white light source; 2402 to 2405, dichroic mirrors; 2406 and 2407, total reflection mirrors; 2408 to 2410, display devices of the present invention; and 2411, a projection lens.

Embodiment Mode 9

Figure 22:
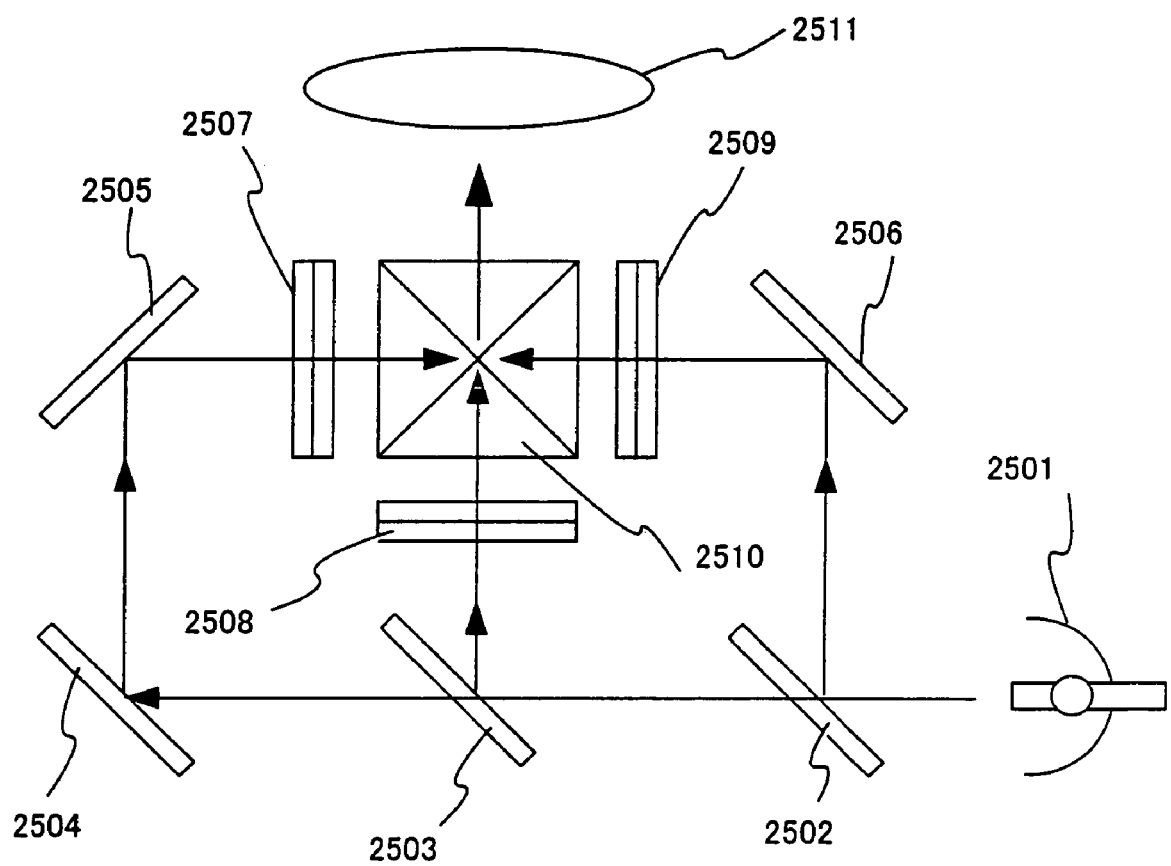
FIG. 22 is a structural diagram schematically showing a 3-plate type projector using a liquid crystal display device of the present invention.

The display device of the present invention described above may be used also for a three panel type projector as shown in FIG. 22.

In FIG. 22, reference numeral 2501 denotes a white light source; 2502 and 2503, dichroic mirrors; 2504 to 2506, total reflection mirrors; 2507 to 2509, display devices of the present invention; 2510, a dichroic prism; and 2511, a projection lens.

Embodiment Mode 10

Figure 23:
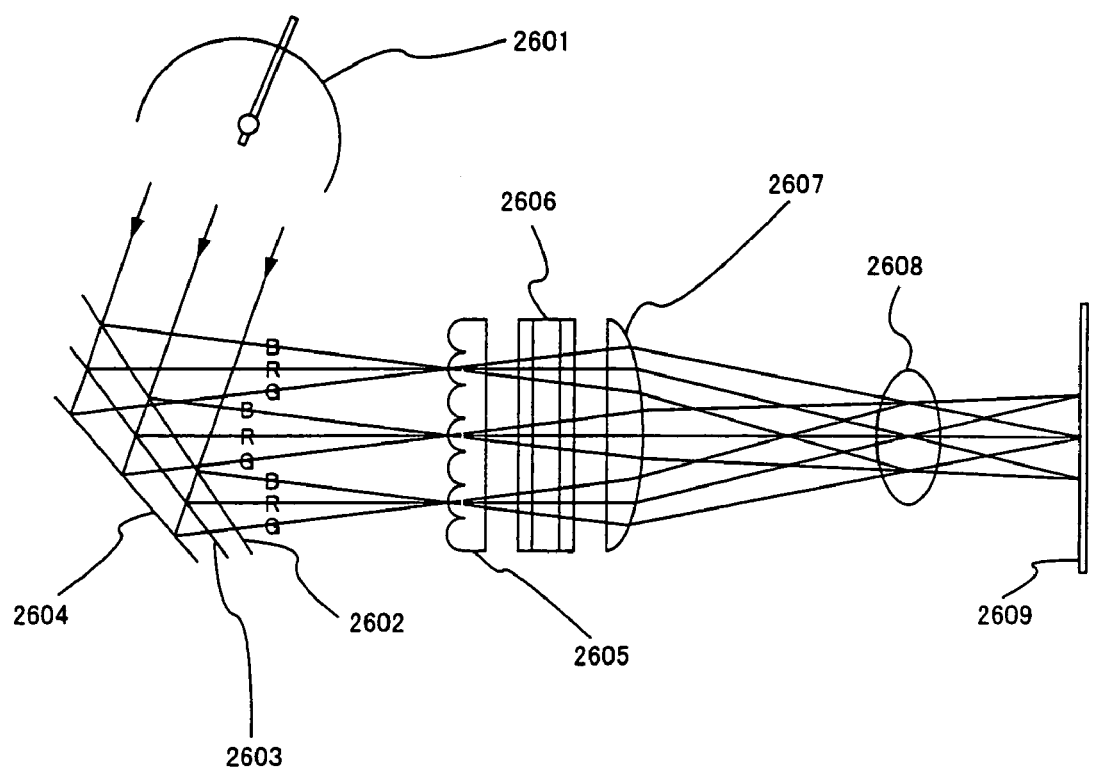
FIG. 23 is a structural diagram schematically showing a single plate type projector using a liquid crystal display device of the present invention.

The liquid crystal display device of the present invention described above may be used also for a single panel type projector as shown in FIG. 23.

In FIG. 23, reference numeral 2601 denotes a white light source comprising a lamp and a reflector, and 2602, 2603 and 2604 denote dichroic mirrors which selectively reflect light in wavelength regions of blue, red and green, respectively. Denoted by 2605 is a microlens array consisting of a plurality of microlenses. Reference numeral 2606 denotes a liquid crystal display panel of the present invention; 2607, a field lens; 2608, a projection lens; and 2609, a screen.

Embodiment Mode 11

The projectors in Embodiment modes 8 to 10 above are classified into rear projectors and front projectors depending on their manner of projection.

Figure 24A:
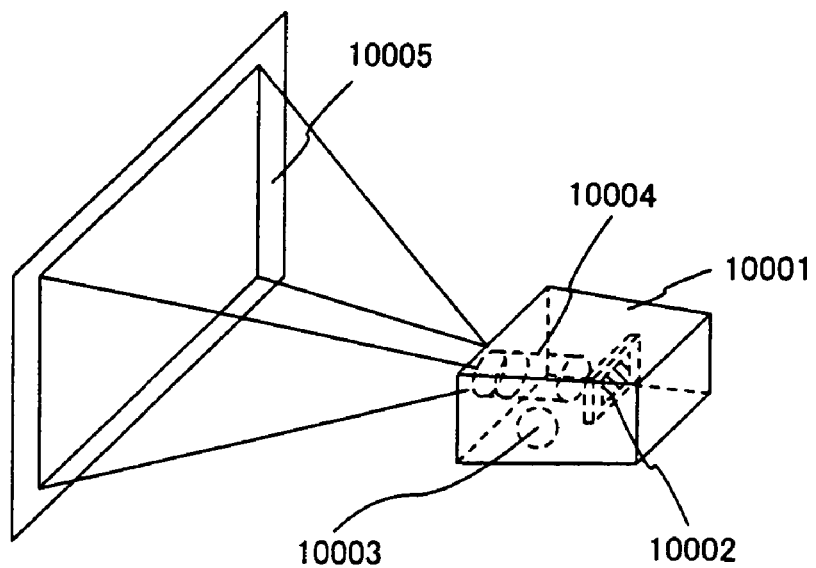
FIGS. 24A and 24B are structural diagrams schematically showing a front type projector and a rear type projector using a liquid crystal display device of the present invention.

FIG. 24A shows a front projector comprised of a main body 10001, a display device 10002 of the present invention, a light source 10003, an optical system 10004, and a screen 10005. Though shown in FIG. 24A is the front projector incorporating one display device, it may incorporate three display devices (corresponding to the light R, G and B, respectively) to realize a front projector of higher resolution and higher definition.

Figure 24B:
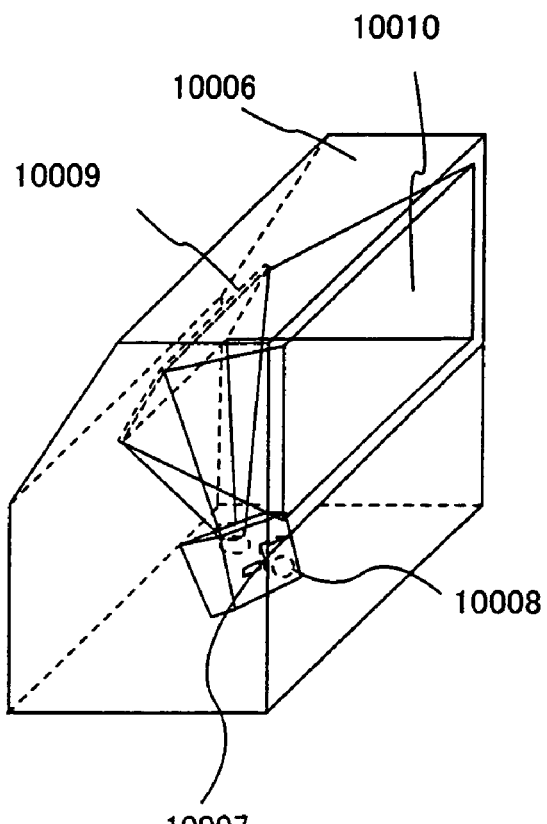

FIG. 24B shows a rear projector comprised of a main body 10006, a display device 10007, a light source 10008, a reflector 10009, and a screen 10010. Shown in FIG. 24B is a rear projector incorporating three active matrix semiconductor display devices (corresponding to the light R, G and B, respectively).

Embodiment Mode 12

This embodiment mode shows an example in which the display device of the present invention is applied to a goggle type display.

Figure 25:
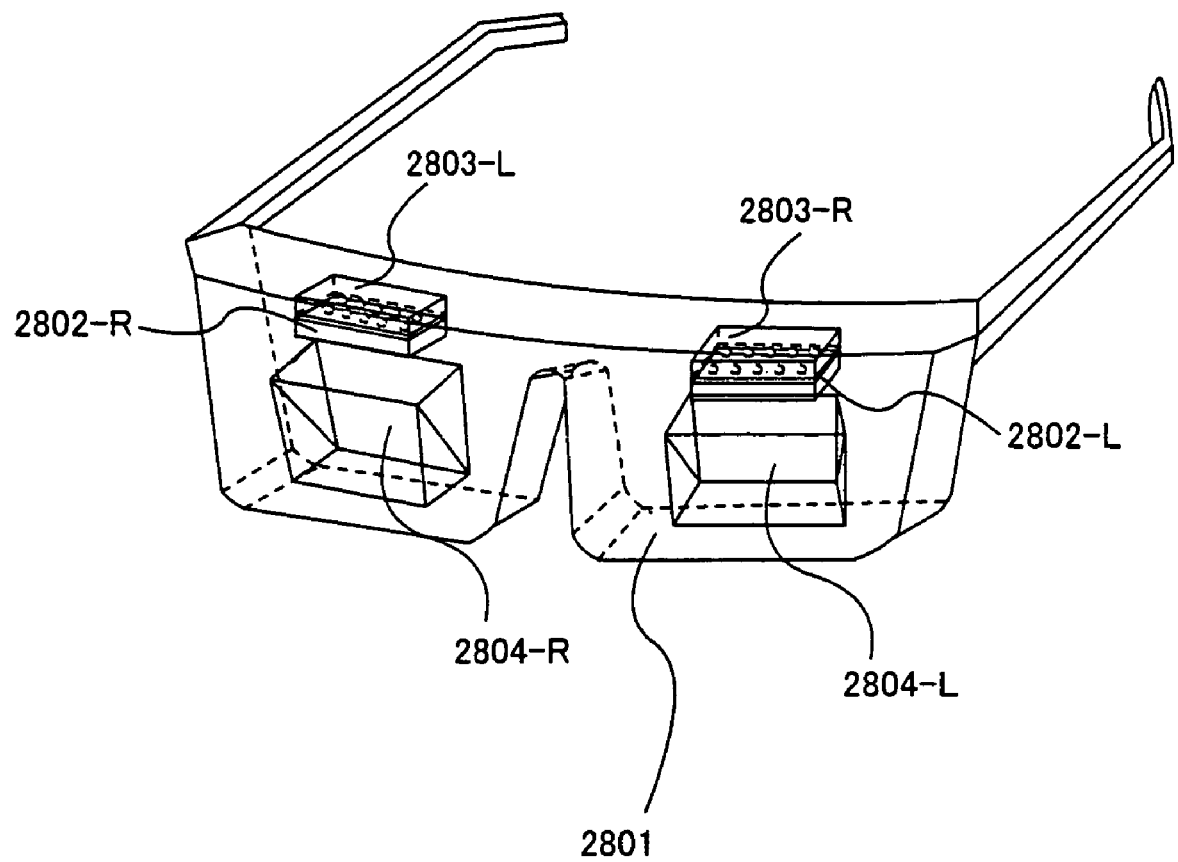
FIG. 25 is a structural diagram schematically showing goggle type display using a liquid crystal display device of the present invention.

Reference is made to FIG. 25. Denoted by 2801 is the main body of a goggle type display; 2802-R, 2802-L, display devices of the present invention; 2803-R, 2803-L, LED backlights; and 2804-R, 2804-L, optical elements.

Embodiment Mode 13

In this embodiment mode, LEDs are used for a backlight of a display device of the present invention to perform a field sequential operation.

Figure 26:
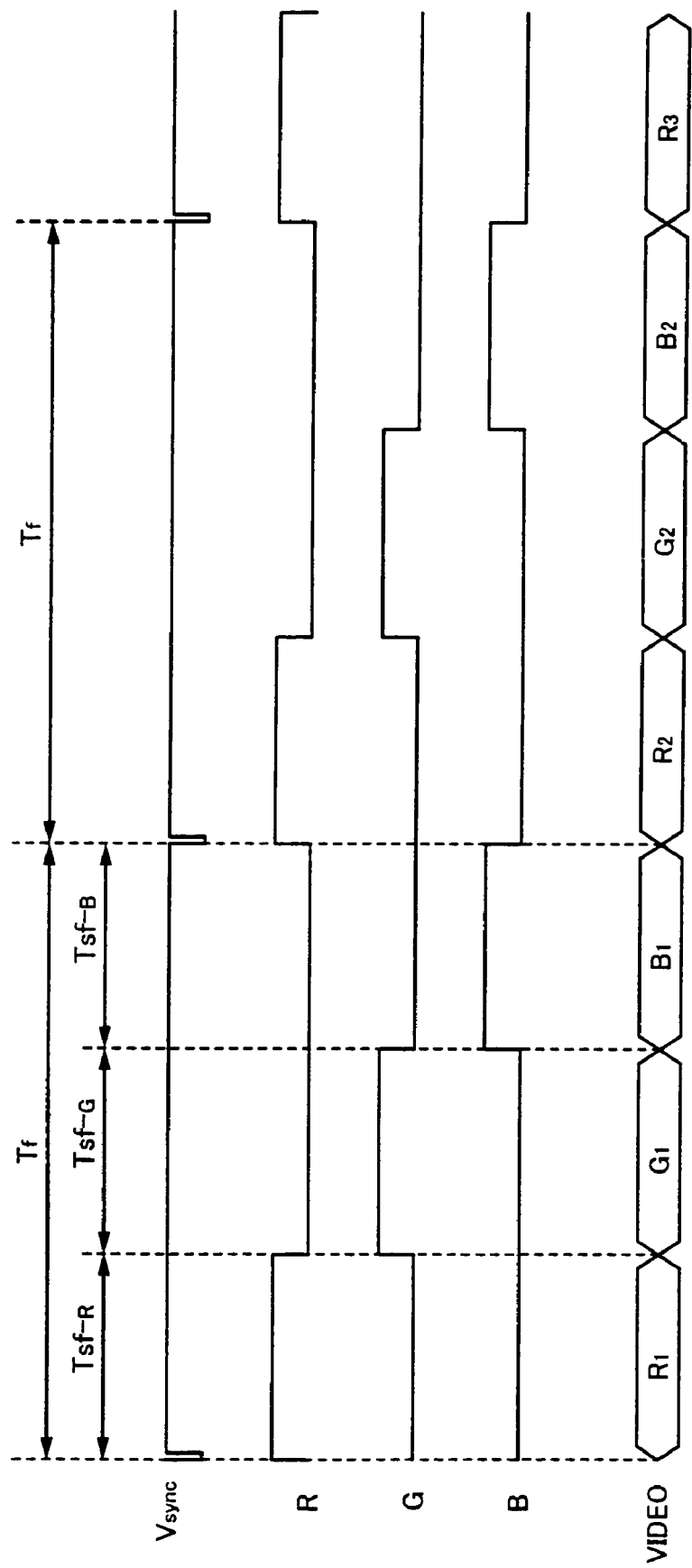
FIG. 26 is a timing chart of field sequential driving.

The timing chart of the field sequential driving method in FIG. 26 shows a start signal for writing a video signal (Vsync signal), lighting timing signals (R, G and B) for red (R), green (G) and blue (B) LEDs, and a video signal (VIDEO). Tf indicates a frame period. Tr, Tg, Tb designate lit-up periods for red (R), green (G) and blue (B) LEDs, respectively.

A video signal sent to the display device, for example, R1, is a signal obtained by compressing along the time-base the video data, that is inputted from the external and corresponds to red, to have a size one third the original data size. A video signal sent to the display panel, G1, is a signal obtained by compressing along the time-base the video data, that is inputted from the external and corresponds to green, to have a size one third the original data size. A video signal sent to the display panel, B1, is a signal obtained by compressing along the time-base the video data, that is inputted from the external and corresponds to blue, to have a size one third the original data size.

In the field sequential driving method, R, G and B LEDs are lit respectively and sequentially during the LED lit-up periods: TR period, TG period and TB period. A video signal (R1) corresponding to red is sent to the display panel during the lit-up period for the red LED (TR), to write one screen of red image into the display panel. A video data (G1) corresponding to green is sent to the display panel during the lit-up period for the green LED (TG), to write one screen of green image into the display panel. A video data (B1) corresponding to blue is sent to the display device during the lit-up period for the blue LED (TB), to write one screen of blue image into the display device. These three times operations of writing images complete one frame of image.

Embodiment Mode 14

Figure 27:
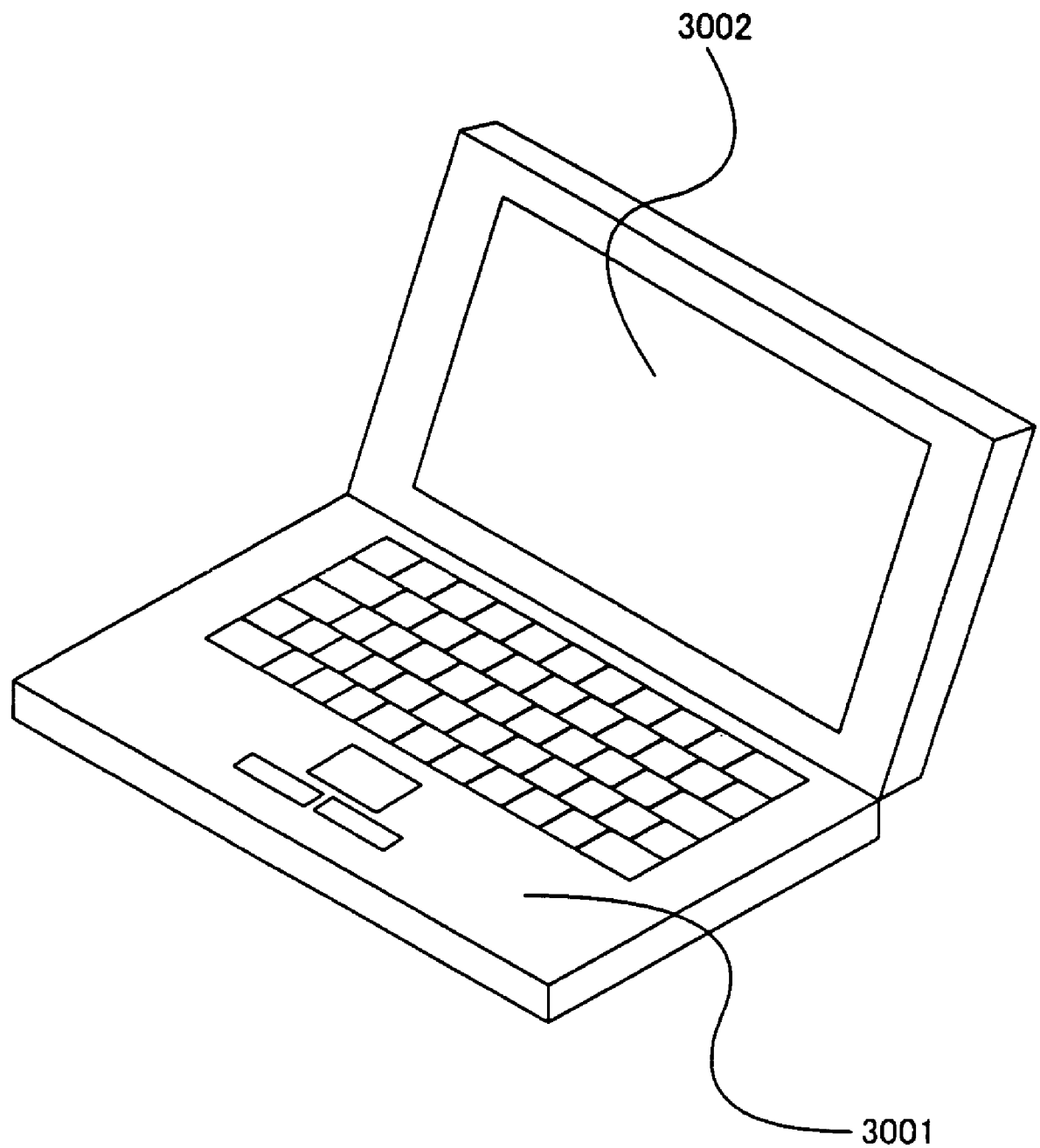
FIG. 27 is a structural diagram schematically showing a notebook type personal computer using a liquid crystal display device of the present invention.

This embodiment mode shows with reference to FIG. 27 an example in which a display device of the present invention is applied to a notebook computer.

Reference numeral 3001 denotes the main body of a notebook computer, and 3002 denotes a display device of the present invention. LEDs are used for a backlight. The backlight may instead employ a cathode ray tube as in the prior art.

Embodiment Mode 15

The liquid crystal display device of the present invention may be applied in various uses. In the present embodiment mode, semiconductor devices loading a display device of the present invention is explained.

Such semiconductor device include video camera, still camera, car navigation systems, personal computer, portable information terminal (mobile computer, mobile telephone etc.). Examples of those are shown in FIG. 28.

Figure 28A:
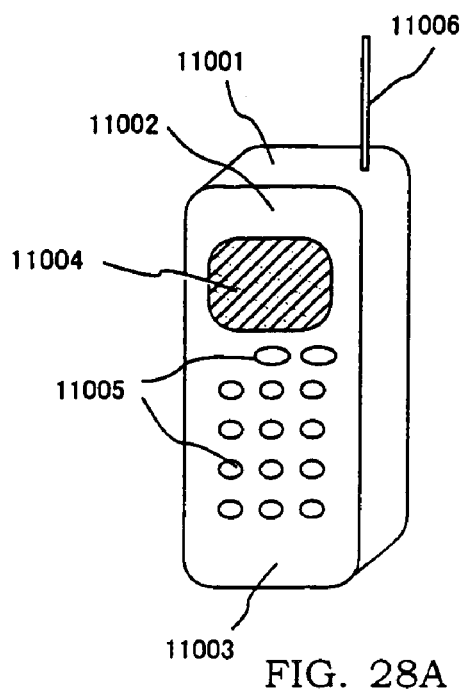
FIGS. 28A to 28D show examples of an electronic device using a liquid crystal display device of the present invention.

FIG. 28A is a mobile telephone, comprising: main body 11001; voice output section 11002; voice input section 11003; display device of the present invention 11004; operation switch 11005 and antenna 11006.

Figure 28B:
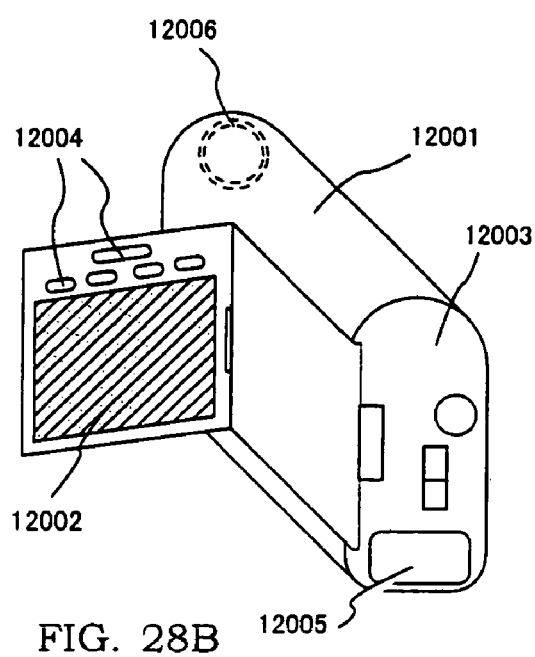

FIG. 28B shows a video camera comprising a main body 12001, a display device 12002 of the present invention, an audio input unit 12003, operation switches 12004, a battery 12005, and an image receiving unit 12006.

Figure 28C:
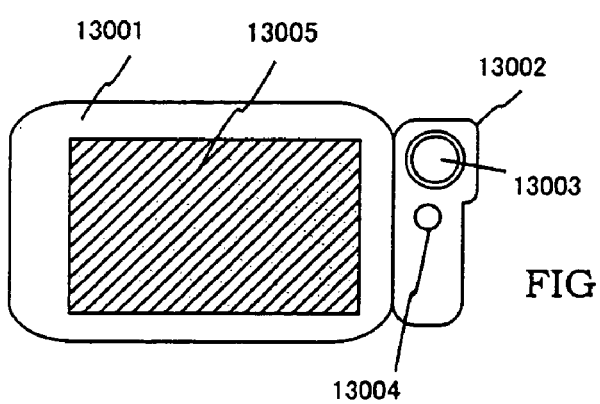

FIG. 28C shows a mobile computer comprising a main body 13001, a camera unit 13002, an image receiving unit 13003, an operation switch 13004, and a display device 13005 of the present invention.

Figure 28D:
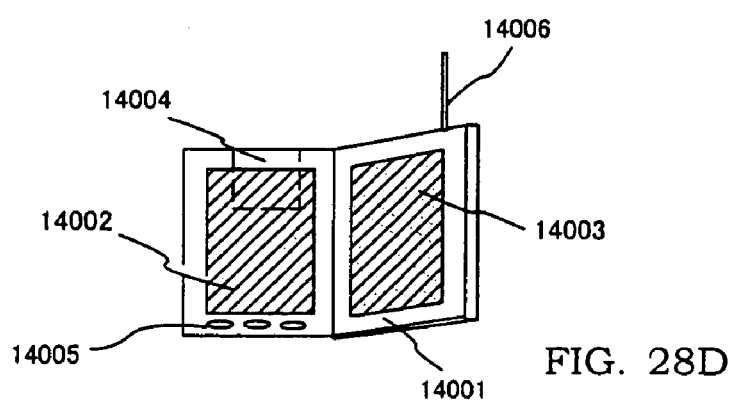

FIG. 28D shows a portable book (electronic book) comprising a main body 14001, display devices 14002, 14003 of the present invention, storing medium, operation switches 14005, and antenna 14006.

Figure 29A:
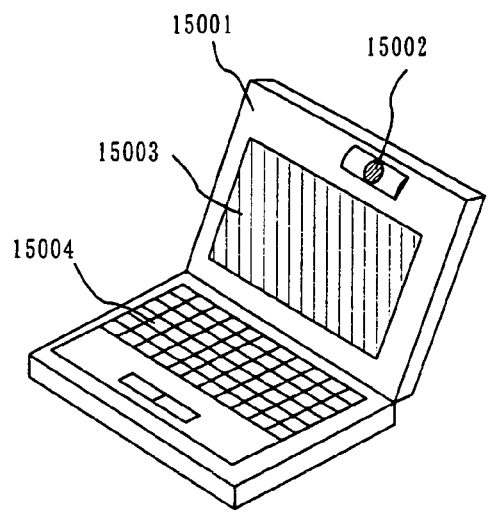
FIGS. 29A to 29D show examples of an electronic device using a liquid crystal display device of the present invention.

FIG. 29A is a personal computer, and comprises a main body 15001, image input section 15002, display section 15003 and key board 15004. The present invention may be applied to an image input section 15002, display section 15003 and other signal control circuits.

Figure 29B:
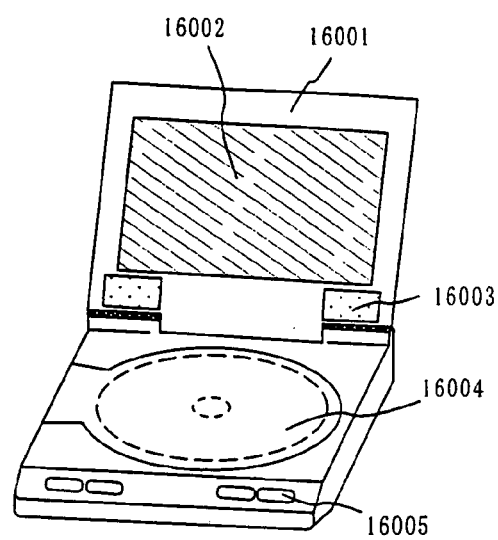

FIG. 29B is a player using a recording medium in which a program is recorded (hereinafter referred to as recording medium), and comprises a main body 16001, display section 16002, a speaker section 16003, a recording medium 16004 and operation switches 16005. By using DVD (digital versatile disc), CD, etc. for a recording medium, music appreciation, film appreciation, game, or use for Internet may be performed with this player. The present invention may be applied to the display section 16002 and other signal control circuits.

Figure 29C:
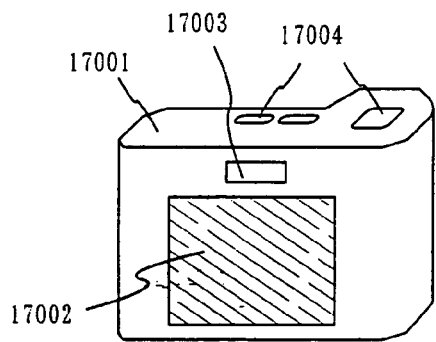

FIG. 29C is a digital camera, and comprises a main body 17001, a display section 17002, a view finder 17003, an operation switch 17004 and image receiving section (not shown in the figure). The present invention may be applied to the display section 17002 and other signal control circuits.

Figure 29D:
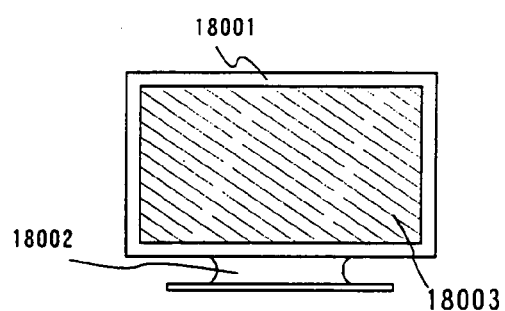
Figure 30:
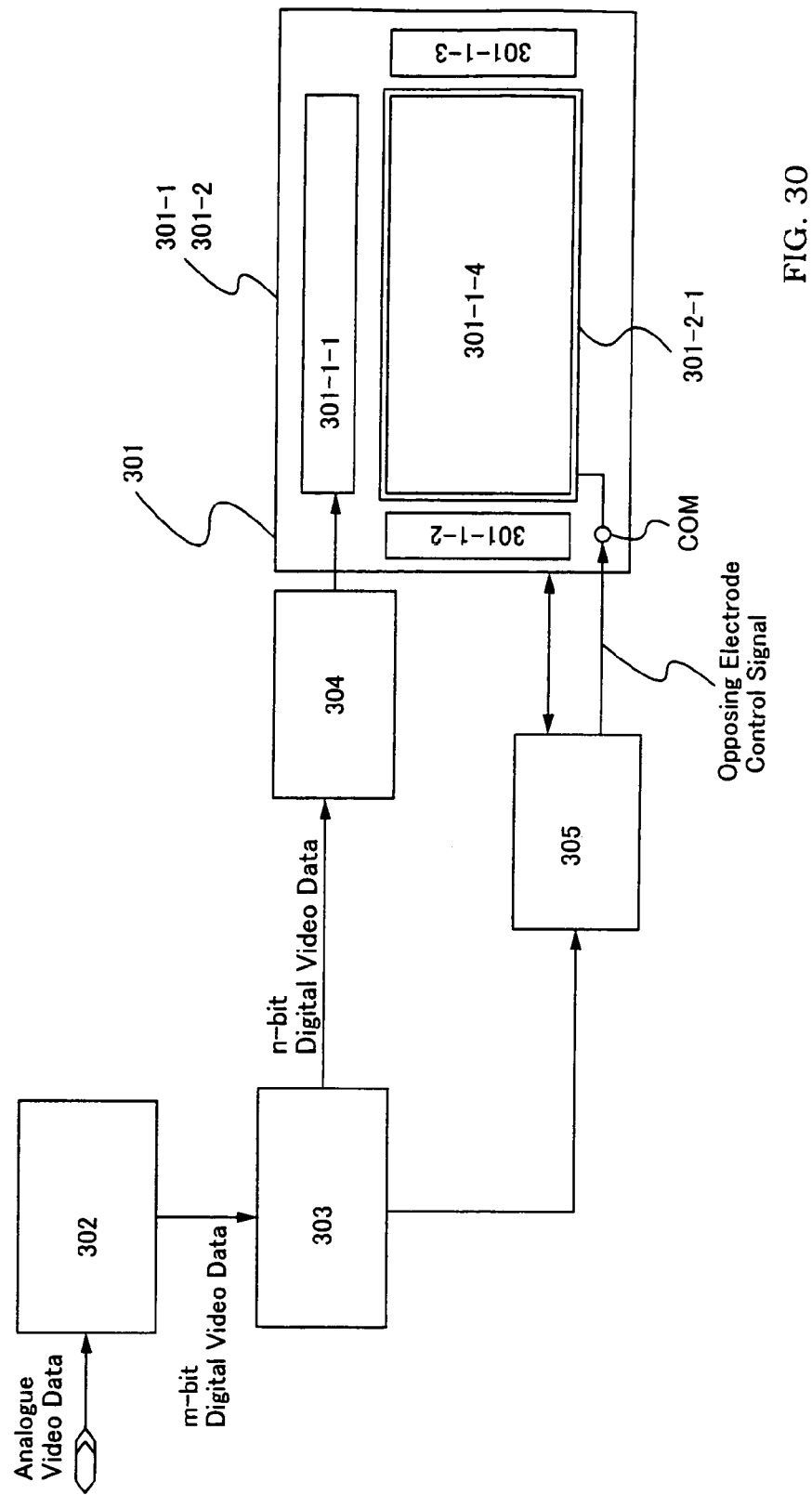
FIG. 30 is an outlined structural diagram of a liquid crystal display device of the present invention.

FIG. 29D is a display, and comprises a main body 18001, a supporting section 18002 and a display section 18003. The present invention may be applied to the display section 18003. The display of the present invention is specifically advantageous when the display is large-sized, and it is advantageous in a display of diagonal greater than 10 inches (more specifically a display of diagonal greater than 30 inches).

According to the present invention, an active matrix liquid crystal display device having large-sized display, high precision, high resolution and multi-gray scales is realized.

What is claimed is:

1. A liquid crystal display device comprising:
   a first thin film transistor and a second thin film transistor, both of them in a pixel; and
   third thin film transistors in a source driver and a gate driver;
   an optically compensated birefringence mode liquid crystal over the first thin film transistor and the second thin film transistor;
   wherein each of the first thin film transistor and the second thin film transistor comprises a first semiconductor layer, a first gate insulating film, and a first gate electrode;
   wherein the first semiconductor layer comprises a first channel formation region, a first impurity region and a second impurity region;
   wherein a concentration of impurity in the first impurity region is lower than a concentration of impurity in the second impurity region;
   wherein each of the third thin film transistors comprises a second semiconductor layer, a second gate insulating film and a second gate electrode;
   wherein the second semiconductor layer comprises a second channel formation region, a third impurity region and a fourth impurity region;
   wherein a concentration of impurity in the third impurity region is lower than a concentration of impurity in the fourth impurity region;
   wherein an overlap length of the third impurity region and the second gate electrode is larger than an overlap length of the first impurity region and the first gate electrode;
   wherein the liquid crystal display device has light emitting diodes used as a backlight;
   wherein the liquid crystal display device and the light emitting diodes are driven by a field sequential driving method, and
   wherein the first thin film transistor and the second thin film transistor are connected in series, between a pixel electrode and a source signal line.

2. A liquid crystal display device according to claim 1, wherein the first semiconductor layer and the second semiconductor layer comprise a crystalline poly-silicon.

3. A liquid crystal display device according to claim 1, wherein one of the light emitting diodes is red, green, or blue.

4. The liquid crystal display device according to claim 1, a diagonal size of the display is larger than 10 inches.

5. A liquid crystal display device comprising:
   a first thin film transistor in a pixel;

second thin film transistors in a source driver and a gate driver;
an optically compensated birefringence mode liquid crystal over the first thin film transistor in the pixel;
wherein the first thin film transistor comprises a first semiconductor layer, a first gate insulating film over the first semiconductor layer, and a first gate electrode over the first gate insulating film;
wherein the first semiconductor layer comprises a first channel formation region, a first impurity region and a second impurity region;
wherein a concentration of impurity in the first impurity region is lower than a concentration of impurity in the second impurity region;
wherein the second thin film transistor comprises a second semiconductor layer, a second gate insulating film over the second semiconductor layer, and a second gate electrode over the second gate insulating film;
wherein the second semiconductor layer comprises a second channel formation region, a third impurity region and a fourth impurity region;
wherein a concentration of impurity in the third impurity region is lower than a concentration of impurity in the fourth impurity region;
wherein the third impurity region overlaps a part of the second gate electrode;
wherein an overlap length of the third impurity region and the second gate electrode is larger than an overlap length of the first impurity region and the first gate electrode;
wherein the liquid crystal display device has light emitting diodes used as a backlight; and
wherein the liquid crystal display device and the light emitting diodes are driven by a field sequential driving method.

6. A liquid crystal display device according to claim 5, wherein the first semiconductor layer and the second semiconductor layer comprise a crystalline poly-silicon.

7. A liquid crystal display device according to claim 5, wherein one of the light emitting diodes is red, green, or blue.

8. The liquid crystal display device according to claim 5, a diagonal size of the display is larger than 10 inches.

9. A liquid crystal display device comprising:
a first thin film transistor in a pixel;
second thin film transistors in a source driver and a gate driver;
an optically compensated birefringence mode liquid crystal over the first thin film transistor; and
wherein the first thin film transistor comprises a first semiconductor layer, a first gate insulating film over the first semiconductor layer, and first gate electrode over the first gate insulating film;
wherein the first semiconductor layer comprises a first channel formation region, a first impurity region and a second impurity region;
wherein a concentration of impurity in the first impurity region is lower than a concentration of impurity in the second impurity region;
wherein the first impurity region does not overlap the first gate electrode;
wherein the second thin film transistor comprises a second semiconductor layer, a second gate insulating film over the second semiconductor layer, and a second gate electrode over the second gate insulating film;
wherein the second semiconductor layer comprises a second channel formation region, a third impurity region and a fourth impurity region;
wherein a concentration of impurity in the third impurity region is lower than a concentration of impurity in the fourth impurity region;
wherein the third impurity region overlaps a part of the second gate electrode;
wherein an overlap length of the third impurity region and the second gate electrode is larger than an overlap length of the first impurity region and the first gate electrode:
wherein the liquid crystal display device has light emitting diodes used as a backlight;
wherein the first thin film transistor, the source driver and the gate driver are formed over the same substrate; and
wherein the liquid crystal display device and the light emitting diodes are driven by a field sequential driving method.

10. A liquid crystal display device according to claim 9, wherein the first semiconductor layer and the second semiconductor layer comprise a crystalline poly-silicon.

11. A liquid crystal display device according to claim 9, wherein one of the light emitting diodes is red, green, or blue.

12. The liquid crystal display device according to claim 9, a diagonal size of the display is larger than 10 inches.

13. A liquid crystal display device comprising:
a first thin film transistor and a second thin film transistor, both of them in a pixel; and
third thin film transistors in a source driver and a gate driver;
an optically compensated birefringence mode liquid crystal over the first thin film transistor and the second thin film transistor in the pixel;
wherein each of the first thin film transistor and the second thin film transistor comprises a
first semiconductor layer, a first gate insulating film and a first gate electrode;
wherein the first semiconductor layer comprises a channel formation region, a first impurity region and a second impurity region;
wherein a concentration of impurity in the first impurity region is lower than a concentration of impurity in the second impurity region;
wherein each of the third thin film transistors comprises a second semiconductor layer, a second gate insulating film and a second gate electrode;
wherein the second semiconductor layer comprises a second channel formation region, a third impurity region and a fourth impurity region;
wherein a concentration of impurity in the third impurity region is lower than a concentration of impurity in the fourth impurity region;
wherein an overlap length of the third impurity region and the second gate electrode is larger than an overlap length of the first impurity region and the first gate electrode;
wherein the first impurity region does not overlap the first gate electrode;
wherein the liquid crystal display device has light emitting diodes used as a backlight; and
wherein the liquid crystal display device and the light emitting diodes are driven by a field sequential driving method, and
wherein the first thin film transistor and the second thin film transistor are connected in series, between a pixel electrode and a source signal line.

14. A liquid crystal display device according to claim 13, wherein the first semiconductor layer and the second semiconductor layer comprise a crystalline poly-silicon.

15. A liquid crystal display device according to claim 13, wherein one of the light emitting diodes is red, green, or blue.

16. The liquid crystal display device according to claim 13, a diagonal size of the display is larger than 10 inches.

17. A liquid crystal display device comprising:
a first thin film transistor in a pixel;
second thin film transistors in a source driver and a gate driver; and
an optically compensated birefringence mode liquid crystal over the first thin film transistor;
wherein the first thin film transistor comprises a first semiconductor layer, a first gate insulating film, and a first gate electrode;
wherein the first semiconductor layer comprises a first channel formation region, a first impurity region and a second impurity region;
wherein a concentration of impurity in the first impurity region is lower than a concentration of impurity in the second impurity region;
wherein the first impurity region does not overlap the first gate electrode;
wherein each of the second thin film transistors comprises a second semiconductor layer, a second gate insulating film, and a second gate electrode;
wherein the second semiconductor layer comprises a second channel formation region, a third impurity region and a fourth impurity region;
wherein a concentration of impurity in the third impurity region is lower than a concentration of impurity in the fourth impurity region;
wherein the third impurity region overlaps a part of the second gate electrode; and
wherein the first thin film transistor, the source driver and the gate driver are formed over the same substrate;
wherein an overlap length of the third impurity region and the second gate electrode is larger than an overlap length of the first impurity region and the first gate electrode;
wherein the liquid crystal display device has light emitting diodes used as a backlight; and
wherein the liquid crystal display device and the light emitting diodes are driven by a field sequential driving method.

18. A liquid crystal display device according to claim 17, wherein the first semiconductor layer and the second semiconductor layer comprise a crystalline poly-silicon.

19. A liquid crystal display device according to claim 17, wherein one of the light emitting diodes is red, green, or blue.

20. The liquid crystal display device according claim 17, a diagonal size of the display is larger than 10 inches.

* * * * *

UNITED STATES PATENT AND TRADEMARK OFFICE
CERTIFICATE OF CORRECTION

| | | |
|---|---|---|
| PATENT NO. | : 7,605,786 B2 | Page 1 of 1 |
| APPLICATION NO. | : 10/976457 | |
| DATED | : October 20, 2009 | |
| INVENTOR(S) | : Yamazaki et al. | |

It is certified that error appears in the above-identified patent and that said Letters Patent is hereby corrected as shown below:

On the title page,

[*] Notice: Subject to any disclaimer, the term of this patent is extended or adjusted under 35 USC 154(b) by 384 days Delete the phrase "by 384 days" and insert -- by 637 days --

Signed and Sealed this

Eighteenth Day of May, 2010

David J. Kappos
*Director of the United States Patent and Trademark Office*